US008795849B2

(12) United States Patent
Urano et al.

(10) Patent No.: US 8,795,849 B2
(45) Date of Patent: Aug. 5, 2014

(54) POLYMERS CONTAINING THERMALLY DISSOCIABLE AND SOLUBLE GROUPS AND THE USE OF SUCH POLYMERS AS ORGANIC ELECTROLUMINESCENT MATERIALS

(75) Inventors: Toshiyuki Urano, Kanagawa (JP); Masayoshi Yabe, Tokyo (JP); Koichiro Iida, Kanagawa (JP); Kumiko Takenouchi, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 359 days.

(21) Appl. No.: 13/057,891

(22) PCT Filed: Aug. 6, 2009

(86) PCT No.: PCT/JP2009/063967
§ 371 (c)(1),
(2), (4) Date: Apr. 29, 2011

(87) PCT Pub. No.: WO2010/016555
PCT Pub. Date: Feb. 11, 2010

(65) Prior Publication Data
US 2011/0192464 A1 Aug. 11, 2011

(30) Foreign Application Priority Data

Aug. 7, 2008 (JP) .............................. P. 2008-204342

(51) Int. Cl.
*H01L 51/54* (2006.01)
*H01L 51/46* (2006.01)
*C09K 11/06* (2006.01)
*C08G 73/02* (2006.01)
*C08L 79/02* (2006.01)
*C07C 211/54* (2006.01)

(52) U.S. Cl.
USPC ...... 428/690; 428/917; 257/40; 257/E51.027; 252/301.16; 528/397; 524/612; 568/719; 568/808; 570/183

(58) Field of Classification Search
None
See application file for complete search history.

(56) References Cited

U.S. PATENT DOCUMENTS

| 4,293,685 | A | 10/1981 | Jedlinski et al. |
| 4,564,492 | A | 1/1986 | Bott et al. |
| 2003/0136964 | A1 | 7/2003 | Afzali-Ardakani et al. |
| 2004/0265623 | A1* | 12/2004 | Stegamat et al. ............. 428/690 |
| 2006/0154384 | A1* | 7/2006 | Murphy et al. ................ 438/7 |
| 2007/0081921 | A1* | 4/2007 | Swager et al. ............ 422/82.05 |

FOREIGN PATENT DOCUMENTS

| CN | 1689173 A | 10/2005 |
| EP | 2 270 069 A1 | 1/2011 |
| GB | 2 165 548 | 4/1986 |
| GB | 2 424 512 A | 9/2006 |
| JP | 60 42409 | 3/1985 |
| JP | 2006 306837 | 11/2006 |
| WO | WO 2004/023573 A2 | 3/2004 |
| WO | WO 2004/023573 A3 | 3/2004 |

OTHER PUBLICATIONS

Combined Chinese Office Action and Search Report Issued Feb. 25, 2013 in Patent Application No. 200980129514.4 (with English translation and English translation of Categories of Cited Documents).
Extended Search Report issued May 20, 2011 in European Patent Application No. 09805038.8-2102 /2311894.
U.S. Appl. No. 13/571,442, filed Aug. 10, 2012, Iida, et al.
European Office Action issued Nov. 28, 2012 in Patent Application No. 09 805 038.8.
Jeewoo Lim et al., "Fluorous Biphase Synthesis of a Poly(p-phenyleneethynylene) and its Fluorescent Aqueous Fluorous-Phase Emulsion", Angewandte Chemie International Edition, vol. 49, No. 41, XP-55044691, Oct. 4, 2010, pp. 7486-7488.
Royappa, A. T., et al., "Langmuir-Blodgett Films of Conducting Diblock Copolymers", LANGMUIR, vol. 14, No. 21, pp. 6207-6214, (Dec. 9, 1998).
Graupner, W. et al., "Photoinduced Absorption in Polyacetylene-Polynorbornene Block Copolymers", Synthetic Metals, vol. 58, pp. 77-94, (1993).
Reufer, M. et al., "Amplified Spontaneous Emission in an Organic Semiconductor Multilayer Waveguide Structure Including a highly Conductive Transparent Electrode", Applied Physics Letters, vol. 86, pp. 221102-1-221102-3, (2005).
Jungermann, S. et al., "Novel Photo-Cross-Linkable Hole-Transporting Polymers: Synthesis, Characterization, and Application in Organic Light Emitting Diodes", Macromolecules, vol. 39, No. 26, pp. 8911-8919, (Nov. 24, 2006).
International Search Report issued Nov. 17, 2009 in PCT/JP09/063967 filed Aug. 6, 2009.
Office Action issued Feb. 1, 2012 in European Patent Application No. 09 805 038.8-2105.
Office Action issued Jul. 30, 2012 in Chinese Patent Application No. 200980129514.4 (with English translation).
Office Action issued Jul. 25, 2013 in Chinese Patent Application No. 200980129514.4 (with English translation).
Combined Office Action and Search Report issued Aug. 26, 2013, in Taiwanese Patent Application No. 098126683 (with English-language translation).
Office Action issued Oct. 8, 2013, in European Patent Application No. 09 805 038.8.
Office Action issued in corresponding Japanese patent application No. 2009-185187dated Feb. 4, 2014, with English translation.
Office Action issued in the corresponding Chinese patent application No. 200980129514.4 dated Feb. 7, 2014 (with English translation).

* cited by examiner

*Primary Examiner* — Andrew K Bohaty
(74) *Attorney, Agent, or Firm* — Oblon, Spivak, McClelland, Maier & Neustadt, L.L.P.

(57) ABSTRACT

A polymer, a luminescent material, and the likes are provided, wherein a film can be formed by a wet film-forming method, the film formed has a high stability, and is capable of being laminated with other layers by a wet film-forming method or another method, which are less decrease in charge transportation efficiency or luminescent efficiency, and attain an excellent driving stability. The polymer has a thermally dissociable and soluble group.

14 Claims, 2 Drawing Sheets

POLYMERS CONTAINING THERMALLY DISSOCIABLE AND SOLUBLE GROUPS AND THE USE OF SUCH POLYMERS AS ORGANIC ELECTROLUMINESCENT MATERIALS

CROSS REFERENCE TO RELATED APPLICATION

This application is a continuation application of PCT/JP2009/063967, filed on Aug. 6, 2009, and claims priority to Japanese Patent Application Ser. No. 2008-204342, filed on Aug. 7, 2008.

TECHNICAL FIELD

The present invention relates to materials for use in organic electroluminescence element or solar cell element.

BACKGROUND ART

Electroluminescent elements (organic electroluminescence elements) employing an organic thin film are being developed in recent years. Examples of methods for forming an organic thin film for use in an organic electroluminescence element include a vacuum deposition method and a wet film-forming method. The vacuum deposition method has an advantage that since superposition of layers by this method is easy, it is easy to improve charge injection from the anode and/or cathode or to confine excitons in the photosensitive layer. On the other hand, the wet film-forming method has advantages, for example, that no vacuum process is necessary and film formation in a larger area is easy, and that it is easy to incorporate a plurality of materials having various functions into one layer (coating fluid).

However, since superposition of layers by the wet film-forming method is difficult, elements produced using the wet film-forming method have lower driving stability than elements produced using the vacuum deposition method and have not reached a practical level at present except some of these. In particular, when organic thin films are superposed by the wet film-forming method, it is required to impart solubility in coating solvents to the material for organic electroluminescence elements by, for example, introducing a long-chain alkyl group thereinto. In the case where after the formation of an organic thin film, another organic thin film (upper layer) is formed thereon by the wet film-forming method, the material for organic electroluminescence elements which is contained in the lower layer is required to be insoluble in the coating solution for forming the upper layer. In a method which has hitherto been employed for such superposition of layers, a crosslinkable group or the like is introduced into the material for organic electroluminescence elements which is to be incorporated into the lower layer and, after formation of the lower layer, the crosslinkable group is crosslinked by a heat treatment, irradiation with energy, etc. to render the material insoluble in the coating solution for upper-layer formation. For example, non-patent document 1 and non-patent document 2 have proposed the following compounds having crosslinkable groups, and have proposed a method for superposing organic thin films in which an organic thin film becomes insoluble in organic solvents upon reaction of the crosslinkable groups.

[Chem. 1]

PRIOR-ART DOCUMENTS

Non-Patent Documents

Non-Patent Document 1: *Applied Physics Letters*, 2005, Vol. 86, p. 221102

Non-Patent Document 2: *Macromolecules*, 2006, Vol. 39, p. 8911

SUMMARY OF THE INVENTION

Problem to be Solved by the Invention

However, in that method, long-chain alkyl groups and crosslinkable groups remain in the organic thin film. There has been a problem that there are cases where such long-chain alkyl groups and crosslinkable groups are causative of a decrease in charge transport efficiency, a decrease in the luminescent efficiency of the organic electroluminescence element, or a decrease in the driving stability thereof.

There have been the same problem in organic insulating films for use in elements having a structure including superposed organic thin films, and also in materials for use in organic solar cells having a configuration including superposed organic thin films, colored resists for color filters, transparent resists for color filters, organic TFT materials, electrophotographic photoreceptors, etc.

Consequently, it has been desired to provide a polymer, a luminescent material, and the like which are used as materials for organic electroluminescence elements and from which a film can be formed by a wet film-forming method, the film formed having high stability, being capable of being coated with other layers by a wet film-forming method or another method, being less apt to decrease in charge transport efficiency or luminescent efficiency, and attaining excellent driving stability.

Means for Solving the Problem

As a result of investigations diligently made by the present inventors, it was found that a polymer and a luminescent-layer material which have a thermally dissociable and soluble group are soluble in coating solvents in wet film formation and can be rendered insoluble in other coating solutions and the like by heating the polymer or luminescent-layer material after the wet film formation. The invention has been thus achieved.

An essential point of the invention resides in a polymer, a composition for electronic devices, an organic electroluminescence element, an organic solar cell element, an organic EL display device, and an organic EL lighting which are characterized by having a thermally dissociable and soluble group.

Another essential point of the invention resides in a luminescent-layer material, a composition for organic electroluminescence elements, an organic electroluminescence element, an organic EL display device, and an organic EL lighting which are characterized by comprising a low-molecular compound having a thermally dissociable and soluble group.

The constitution of the invention is shown below.

[1] A polymer comprising a thermally dissociable and soluble group.

[2] The polymer according to [1] above, which comprises a repeating unit including an aromatic ring and a hydrocarbon ring fused to the aromatic ring, in which the thermally dissociable and soluble group is bonded to the hydrocarbon ring.

The aromatic ring may be an aromatic hydrocarbon ring or may be an aromatic heterocycle. However, it is preferred that the aromatic ring should be an aromatic hydrocarbon ring because this ring has excellent electrochemical stability and charge localization is less apt to occur therein.

[3] The polymer according to [1] or [2] above, wherein the aromatic ring is an aromatic hydrocarbon ring.

[4] The polymer according to any one of [1] to [3] above, wherein the thermally dissociable and soluble group is a group which is thermally dissociated through a reverse Diels-Alder reaction.

[5] The polymer according to any one of [1] to [4] above, wherein the thermally dissociable and soluble group is a group which is thermally dissociated at 100° C. or more and 300° C. or less.

[6] The polymer according to any one of [2] to [5] above, wherein the hydrocarbon ring is a ring containing an etheno group or an ethano group.

[7] The polymer according to any one of [1] to [6] above, which comprises a repeating unit including a structure represented by the following chemical formula (U3) or the following chemical formula (U4).

[Chem. 2]

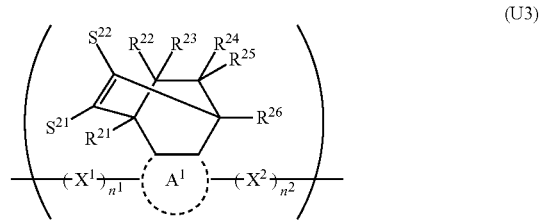

(U3)

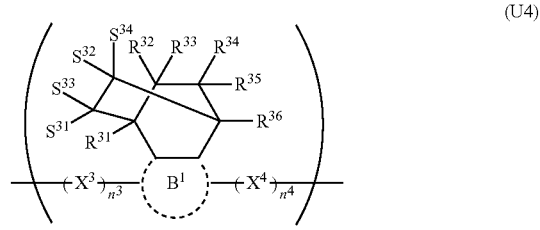

(U4)

(ring $A^1$ represents an aromatic ring. The aromatic ring may have one or more substituents. The substituents may be bonded to each other directly or through a divalent linking group to form a ring.

$S^{21}$, $S^{22}$, and $R^{21}$ to $R^{26}$ each independently represent a hydrogen atom, a hydroxyl group, an alkyl group which may have a substituent, an aromatic hydrocarbon ring group which may have a substituent, an aromatic heterocyclic group which may have a substituent, an aralkyl group which may have a substituent, an alkoxy group which may have a substituent, an aryloxy group which may have a substituent, an acyl group which may have a substituent, an alkenyl group which may have a substituent, an alkynyl group which may have a substituent, an acyloxy group which may have a substituent, an arylamino group which may have a substituent, a heteroarylamino group which may have a substituent, or an acylamino group which may have a substituent.

$X^1$ and $X^2$ each independently represent a divalent aromatic hydrocarbon ring group which has 6-50 carbon atoms and may have a substituent, or a divalent aromatic heterocyclic group which has 3-50 carbon atoms and may have a substituent;

ring $B^1$ represents an aromatic ring. The aromatic ring may have one or more substituents. The substituents may be bonded to each other directly or through a divalent linking group to form a ring.

$S^{31}$ to $S^{34}$, $R^{31}$ to $R^{36}$, and $X^3$ and $X^4$ each independently are the same as those shown above with regard to $S^{21}$ and $S^{22}$, $R^{21}$ to $R^{26}$, and $X^1$ and $X^2$.

Symbols $n^1$ to $n^4$ each independently represent an integer of 0-5.)

[8] The polymer according to [7] above, wherein in chemical formula (U3) and chemical formula (U4), the ring $A^1$ and ring $B^1$ each independently are selected from the group consisting of a benzene ring, a naphthalene ring, an anthracene ring, and a tetracene ring.

[9] The polymer according to any one of [1] to [8] above, which comprises a repeating unit represented by the following formula (X).

[Chem. 3]

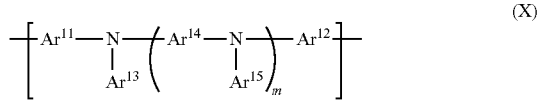

(X)

(In the formula, m represents an integer of 0-3, $Ar^{11}$ and $Ar^{12}$ each independently represent a direct bond, an aromatic hydrocarbon ring group which may have a substituent, or an aromatic heterocyclic group which may have a substituent, and $Ar^{13}$ to $Ar^{15}$ each independently represent an aromatic hydrocarbon ring group which may have a substituent or an aromatic heterocyclic group which may have a substituent. However, $Ar^{11}$ and $Ar^{12}$ are not direct bonds simultaneously. Furthermore, $Ar^{11}$, $Ar^{12}$, and $Ar^{14}$ each represent a divalent group, and $Ar^{13}$ and $Ar^{15}$ each represent a monovalent group.)

[10] A composition for electronic device, which comprises the polymer according to any one of [1] to [9] above and a solvent.

[11] An organic electroluminescence element comprising an anode, a cathode, and an organic layer disposed between the anode and the cathode, wherein, as the organic layer, the organic electroluminescence element comprises a layer formed from the composition for electronic devices according to [10] above by a wet film-forming method.

[12] A solar cell element comprising an anode, a cathode, and an organic layer disposed between the anode and the cathode, wherein, as the organic layer, the solar cell element comprises a layer formed from the composition for electronic devices according to [10] above by a wet film-forming method.

[13] A luminescent-layer material which comprises a low-molecular compound having a thermally dissociable and soluble group.

[14] The luminescent-layer material according to [13] above, which comprises a partial structure represented by the following chemical formula (U1).

[Chem. 4]

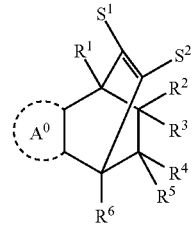

(U1)

(ring $A^0$ represents an aromatic ring. The aromatic ring may have one or more substituents. The substituents may be bonded to each other directly or through a divalent linking group to form a ring. Although the aromatic ring may be an aromatic hydrocarbon ring or may be an aromatic heterocycle, it is preferred that the aromatic ring should be an aromatic hydrocarbon ring because this ring has excellent electrochemical stability and charge localization is less apt to occur therein.

$S^1$, $S^2$, $R^1$, and $R^6$ each independently represent a hydrogen atom, a hydroxyl group, an alkyl group which may have a substituent, an aromatic hydrocarbon ring group which may have a substituent, an aromatic heterocyclic group which may have a substituent, an aralkyl group which may have a substituent, an alkoxy group which may have a substituent, an aryloxy group which may have a substituent, an acyl group which may have a substituent, an alkenyl group which may have a substituent, an alkynyl group which may have a substituent, an acyloxy group which may have a substituent, an arylamino group which may have a substituent, a heteroarylamino group which may have a substituent, or an acylamino group which may have a substituent.

$R^2$ to $R^5$ each independently represent a hydrogen atom or an alkyl group which may have a substituent.

However, all of $R^2$ to $R^5$ are not a hydrogen atom simultaneously.)

[15] The luminescent-layer material according to [13] above, which comprises a partial structure represented by the following chemical formula (U2).

[Chem. 5]

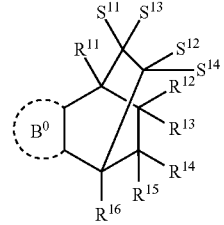

(U2)

(ring $B^0$ represents an aromatic ring. The aromatic ring may have one or more substituents. The substituents may be bonded to each other directly or through a divalent linking group to form a ring. Although the aromatic ring may be an aromatic hydrocarbon ring or may be an aromatic heterocycle, it is preferred that the aromatic ring should be an aromatic hydrocarbon ring because this ring has excellent electrochemical stability and charge localization is less apt to occur therein.

$S^{11}$ to $S^{14}$ and $R^{11}$ to $R^{16}$ each independently represent a hydrogen atom, a hydroxyl group, an alkyl group which may have a substituent, an aromatic hydrocarbon ring group which may have a substituent, an aromatic heterocyclic group which may have a substituent, an aralkyl group which may have a substituent, an alkoxy group which may have a substituent, an aryloxy group which may have a substituent, an acyl group which may have a substituent, an alkenyl group which may have a substituent, an alkynyl group which may have a substituent, an acyloxy group which may have a substituent, an arylamino group which may have a substituent, a heteroarylamino group which may have a substituent, or an acylamino group which may have a substituent.)

[16] The luminescent-layer material according to [14] or [15] above, wherein the ring $A^0$ or ring $B^0$, which is an aromatic ring, is an aromatic hydrocarbon ring.

[17] A composition for organic electroluminescence element, which comprises the luminescent-layer material according to any one of [13] to [16] above and a solvent.

[18] An organic electroluminescence element comprising an anode, a cathode, and an organic layer disposed between the anode and the cathode, wherein, as the organic layer, the organic electroluminescence element comprises a layer formed from the composition for organic electroluminescence element according to [17] above by a wet film-forming method.

[19] An organic EL display device comprising the organic electroluminescence element according to [11] or [18] above.

[20] An organic EL lighting comprising the organic electroluminescence element according to [11] or [18] above.

[21] A material for organic electroluminescence elements which is obtained by heating a compound having an aromatic hydrocarbon ring or an aromatic heterocycle in the molecule, wherein the compound comprises a partial structure comprising: a hydrocarbon ring fused to the aromatic hydrocarbon ring or the aromatic heterocycle; and a thermally dissociable and soluble group bonded to the hydrocarbon ring.

[22] A polymer comprising at least one repeating unit selected from the following repeating-unit group X.

[Repeating-Unit Group X]

[Chem. 6]

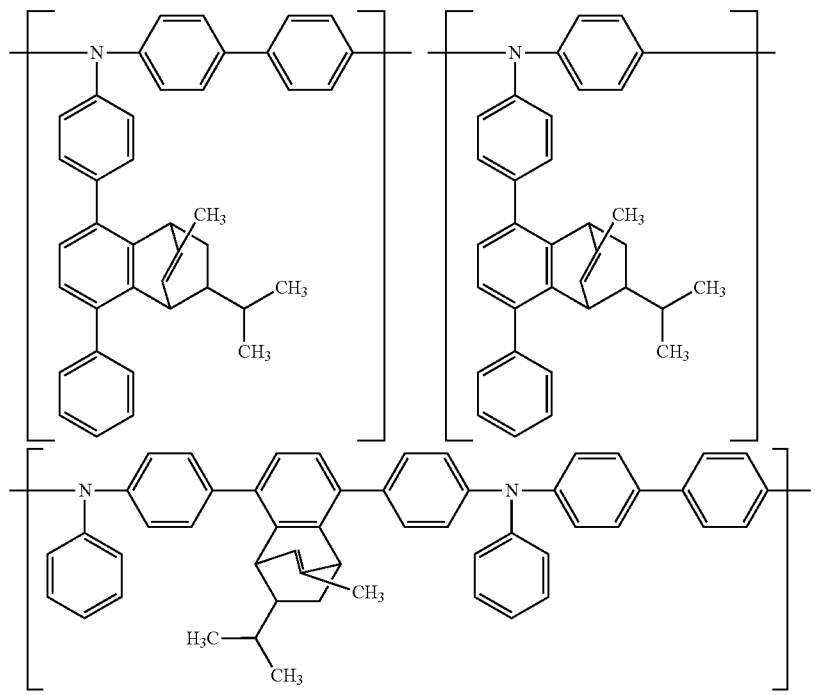

Effects of the Invention

Since the polymer and luminescent-layer material of the invention have a partial structure in which a thermally dissociable and soluble group has been bonded, the polymer and the luminescent-layer material can be soluble in the coating solvent to be used for wet film formation. Furthermore, since the thermally dissociable and soluble group dissociates upon heating after film formation, solubility in other coating solvents and the like can be considerably reduced. Consequently, after an organic layer is formed from the polymer or luminescent-layer material, another organic layer can be formed thereon by, for example, a wet film-forming method.

Moreover, the polymer and luminescent-layer material of the invention need not contain in the molecule a long-chain alkyl group for rendering the polymer or material soluble in coating solvents or a crosslinkable group for rendering the polymer or material insoluble in other solvents. Consequently, an organic electroluminescence element formed using the polymer or luminescent-layer material as a material for the organic electroluminescence element has high luminescent efficiency and shows excellent driving stability including a low driving voltage.

MODES FOR CARRYING OUT THE INVENTION

Figure 1:
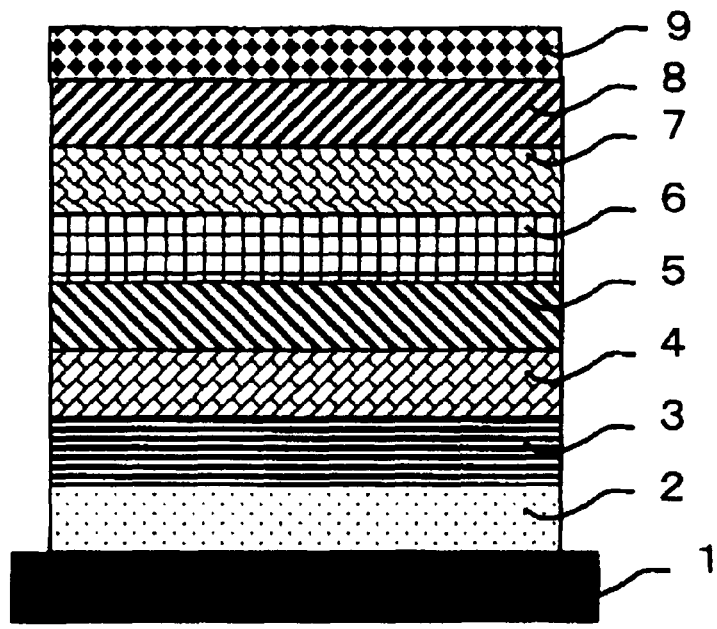
FIG. 1 is a diagrammatic sectional view illustrating one embodiment of the organic electroluminescence element of the invention.

The products, processes, and the like shown below as examples are embodiments (representative embodiments) of the invention, and the invention should not be construed as being limited to the embodiments unless the invention departs from the spirit thereof.

In this invention, the term polymer means a compound which includes a plurality of divalent repeating units in the structure and has a molecular weight distribution. Meanwhile, a compound which has a single molecular weight is regarded as a low-molecular compound.

Furthermore, the composition which contains the polymer of the invention is referred to as "composition A", and the composition which contains the luminescent-layer material of the invention is referred to as "composition B for organic electroluminescence elements". The term "composition of the invention for organic electroluminescence elements" is a general term for both the composition A and the composition B for organic electroluminescence elements.

A. Polymer

The polymer of the invention is characterized by having a thermally dissociable and soluble group, and can be used, for example, as a material for organic electroluminescence elements, etc. Specifically, the polymer is applicable as a hole injection material, hole transport material, luminescent material, host material, electron injection material, electron transport material, and the like for organic electroluminescence elements, and is preferably used for layers to be formed by a wet film-forming method.

The weight-average molecular weight of the polymer is generally 3,000,000 or lower, preferably 1,000,000 or lower, more preferably 500,000 or lower, and is generally 1,000 or higher, preferably 2,500 or higher, more preferably 5,000 or higher.

The number-average molecular weight thereof is generally 2,500,000 or lower, preferably 750,000 or lower, more preferably 400,000 or lower, and is generally 500 or higher, preferably 1,500 or higher, more preferably 3,000 or higher.

Usually, the weight-average molecular weight is determined by SEC (size exclusion chromatography) analysis. In SEC analysis, components having higher molecular weights are eluted in shorter time periods, while components having lower molecular weights necessitate longer elution times. Elution times for a sample are converted to molecular weights using a calibration curve calculated from elution times for polystyrene having known molecular weights (reference samples), and a weight-average molecular weight and a number-average molecular weight are thus calculated.

In case where the molecular weight of the polymer exceeds the upper limit, there is a possibility that impurities having increased molecular weights might make it difficult to purify high-molecular compounds. In case where the molecular weight of the polymer is lower than the lower limit, there is a possibility that this polymer might have reduced film-forming properties, resulting in decreases in glass transition temperature, melting point, and vaporization temperature. There is hence a possibility that heat resistance might be significantly impaired.

(Thermally Dissociable and Soluble Group)

The term thermally dissociable and soluble group means a group which is soluble in solvents and which dissociates at 70° C. or higher from the group (e.g., hydrocarbon ring) to which the thermally dissociable and soluble group has been bonded. Dissociation of the thermally dissociable and soluble group reduces the solubility of the polymer in solvents.

It should, however, be noted that the term thermally dissociable and soluble group excludes groups such as ones which dissociate through a reaction in which other atoms combine after the dissociation, for example, groups which dissociate through hydrolysis. In the case of a group which decomposes through hydrolysis, the polymer after dissociation has an active proton in the molecule. There are cases where when such active protons are present in an element, the protons affect the element characteristics.

At 20-25° C., the polymer of the invention dissolves in toluene in a concentration of generally 0.1% by weight or higher. The solubility of the compound in toluene is preferably 0.5% or higher, more preferably 1% by weight or higher.

It is preferred that the thermally dissociable and soluble group should have been bonded to a hydrocarbon ring and the hydrocarbon ring should have been fused to an aromatic hydrocarbon ring having no polarity. It is more preferred that the thermally dissociable and soluble group should be a group which thermally dissociates through a reverse Diels-Alder reaction.

The temperature at which the thermally dissociable and soluble group thermally dissociates is preferably 100° C. or higher, more preferably 120° C. or higher, and is preferably 300° C. or lower, more preferably 240° C. or lower.

When the dissociation temperature is within that range, the polymer is easy to synthesize and troubles such as decomposition of the compound are less apt to occur during film formation.

In particular, a group having a stereostructure which inhibits stacking of molecules is preferred because this group attains excellent solubility. Some examples of reactions in which a thermally dissociable and soluble group is eliminated from a compound are shown below.

[Chem. 7]

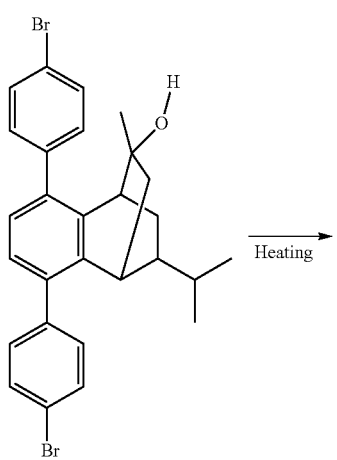

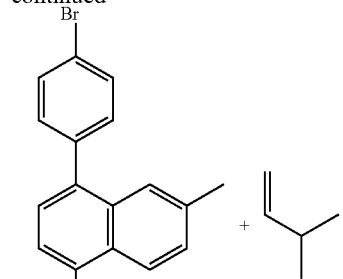

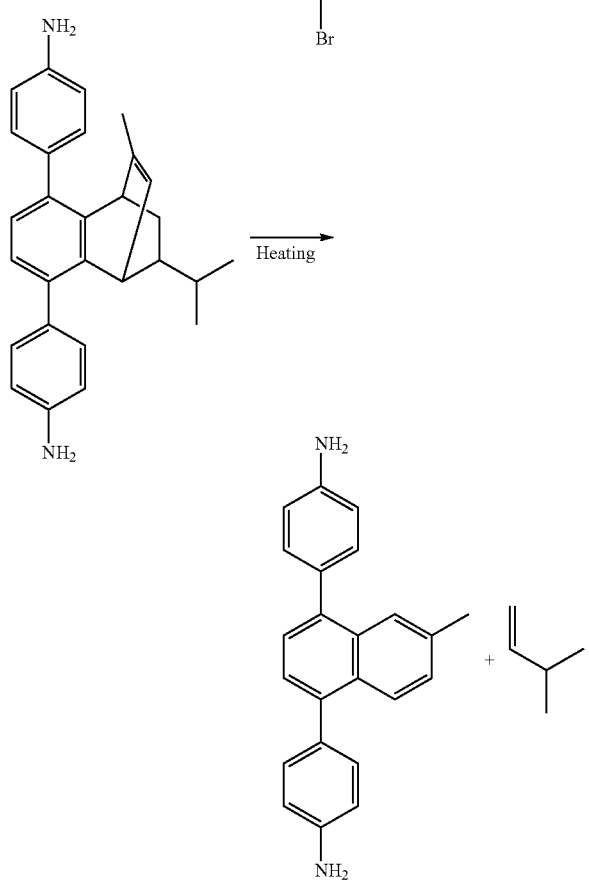

In the reaction schemes shown above, the thermally dissociable and soluble group is the portion circled in the structure shown below.

[Chem. 8]

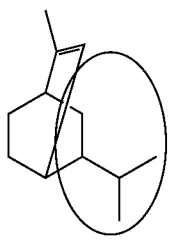

Examples of such elimination of a thermally dissociable and soluble group include elimination of a sulfinylacetamide (see *JACS*, V124, No. 30, 2002, 8813), olefin elimination, alcohol elimination, dealkylation (see H. Kwart and K. King, Department of Chemistry, University of Delaware, Nework, Del. 19771, pp. 415-447 (1967); O. Diels and K. Alder, *Ber.*, 62, 554 (1929); and M. C. Kloetzel, *Org. Reactions,* 4, 6 (1948)), 1,3-dioxole elimination (see N. D. Field, *J. Am. Chem. Soc.,* 83, 3504 (1961)), diene elimination (see R. Huisgen, M. Seidel, G. Wallbillich, and H. Knupfer, *Tetrahedron,* 17, 3 (1962)), isoxazole elimination (see R. Huisgen and M. Christi, *Angew. Chem. Intern. Ed. Engl.,* 5, 456 (1967)), and triazole elimination (see R. Kreher and J. Seubert, *Z. Naturforach.,* 20B, 75 (1965)).

It is especially preferred in the invention that the hydrocarbon ring to which the thermally dissociable and soluble group has been bonded should be a ring containing an etheno group or an ethano group, from the standpoint that the thermally dissociable and soluble group is stabler and this polymer is easy to synthesize.

Before a heat treatment, such a thermally dissociable and soluble group can prevent stacking of molecules and impart satisfactory solubility in organic coating solvents to the polymer, because of the bulky molecular structure of the group. Furthermore, since the thermally dissociable and soluble group is eliminated from the polymer by a heat treatment, the compound obtained through the heating can be highly inhibited from dissolving in solvents, and resistance to coating with organic solvents can be imparted to the organic layer containing the compound. Consequently, after an organic layer is formed using the polymer of the invention, it is easy to further form an organic thin film thereon by a wet film-forming method.

Furthermore, the polymer of the invention need not have, within the molecule, a long-chain alkyl group for enhancing solubility in coating solvents or a crosslinkable group or the like for imparting resistance to other organic solvents, unlike the polymers which have been used in conventional multi-layer formation by coating. The polymer of the invention can be one having none of these. Consequently, unlike the polymers which have been used as conventional materials for organic electroluminescence elements, the polymer of the invention, through film formation (through heating), can give an organic film in which neither heat-crosslinkable groups nor long-chain alkyl groups remain. The organic electroluminescence element does not decrease in luminescent efficiency, life, etc. and has satisfactory stability.

[Proportion of Thermally Dissociable and Soluble Group]

A thermally dissociable and soluble group may be contained in a portion other than the repeating units of the polymer. The number of thermally dissociable and soluble groups contained per polymer chain of the polymer is preferably 5 or more on average, more preferably 10 or more on average, even more preferably 50 or more on average. When the number thereof is smaller than the lower limit, there are cases where the polymer before heating has insufficient solubility in coating solvents. There also is a possibility that the effect of imparting reduced solubility in organic solvents to the compound obtained through heating might be low.

[Arrangement, Proportions, etc. of Repeating Units]

The polymer is not particularly limited in the structure thereof including repeating units, so long as the polymer has a thermally dissociable and soluble group in the structure thereof. It is, however, preferred that the polymer should have a repeating unit including an aromatic ring and a hydrocarbon ring fused to the aromatic ring and the thermally dissociable and soluble group should have been bonded to the hydrocarbon ring.

In particular, it is preferred that the polymer should be a polymer including a repeating unit having a partial structure in which a thermally dissociable and soluble group has been bonded to a hydrocarbon ring containing an etheno group or an ethano group, because this polymer has excellent film-forming properties.

The hydrocarbon ring containing an etheno group or ethano group preferably is a six-membered ring.

With respect to the arrangement of repeating units in such a polymer, it is especially preferred that the polymer should have a repeating unit represented by the following formula (X).

[Chem. 9]

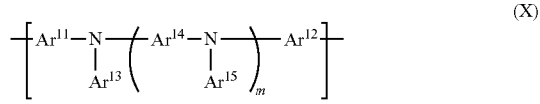

(X)

(In the formula, $Ar^{11}$ and $Ar^{12}$ each independently represent a direct bond, an aromatic hydrocarbon ring group which may have a substituent, or an aromatic heterocyclic group which may have a substituent, and $Ar^{13}$ to $Ar^{15}$ each independently represent an aromatic hydrocarbon ring group which may have a substituent or an aromatic heterocyclic group which may have a substituent. However, $Ar^{11}$ and $Ar^{12}$ are not direct bonds simultaneously. $Ar^{11}$, $Ar^{12}$, and $Ar^{14}$ each represent a divalent group, and $Ar^{13}$ and $Ar^{15}$ each represent a monovalent group.

Symbol m represents an integer of 0-3.

It is preferred that m should be 0, from the standpoint that the solubility in organic solvents and the film-forming properties of the polymer are enhanced. On the other hand, from the standpoint that the polymer has improved hole-transporting performance, it is preferred that m should be 1-3.)

Examples of the aromatic hydrocarbon ring group which may have a substituent include mono- or divalent groups derived from a five- or six-membered monocycle or a di- to pentacyclic fused ring, such as a benzene ring, naphthalene ring, anthracene ring, phenanthrene ring, perylene ring, tetracene ring, pyrene ring, benzpyrene ring, chrysene ring, triphenylene ring, fluorene ring, or fluoranthene ring.

Examples of the aromatic heterocyclic group which may have a substituent include mono- or divalent groups derived from a five- or six-membered monocycle or a di- to tetracyclic fused ring, such as a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, perimidine ring, or quinazoline ring.

From the standpoint of the electrochemical stability of the compound to be obtained, it is preferred that $Ar^{11}$ to $Ar^{15}$ each should independently be a mono- or divalent group derived from a ring selected from the group consisting of a benzene ring, naphthalene ring, anthracene ring, phenanthrene ring, pyrene ring, and fluorene ring. It is also preferred that $Ar^{11}$ to $Ar^{15}$ each should be a mono- or divalent group composed of rings of one or more kinds selected from that group, the rings being linked together through one or more direct bonds. More preferred are a biphenylene group and a terphenylene group.

Examples of the substituents of $Ar^{11}$ to $Ar^{15}$ include: linear or branched alkyl groups which may have a substituent (preferably, linear or branched alkyl groups having 1-8 carbon atoms, examples of which include methyl, ethyl, n-propyl, 2-propyl, n-butyl, isobutyl, and tert-butyl); alkenyl groups which may have a substituent (preferably, alkenyl groups having 2-9 carbon atoms, examples of which include vinyl, allyl, and 1-butenyl); alkynyl groups which may have a substituent (preferably, alkynyl groups having 2-9 carbon atoms, examples of which include ethynyl and propargyl); aralkyl groups which may have a substituent (preferably, aralkyl groups having 7-15 carbon atoms, examples of which include benzyl); alkoxy groups which may have a substituent (preferably, optionally substituted alkoxy groups having 1-8 carbon atoms, examples of which include methoxy, ethoxy, and butoxy); aryloxy groups which may have a substituent (preferably, ones having an aromatic hydrocarbon ring group having 6-12 carbon atoms, examples of which include phenyloxy, 1-naphthyloxy, and 2-naphthyloxy); heteroaryloxy groups which may have a substituent (preferably, ones having a five- or six-membered aromatic heterocyclic group, examples of which include pyridyloxy and thienyloxy); acyl groups which may have a substituent (preferably, optionally substituted acyl groups having 2-10 carbon atoms, examples of which include formyl, acetyl, and benzoyl); alkoxycarbonyl groups which may have a substituent (preferably, optionally substituted alkoxycarbonyl groups having 2-10 carbon atoms, examples of which include methoxycarbonyl and ethoxycarbonyl); aryloxycarbonyl groups which may have a substituent (preferably, optionally substituted aryloxycarbonyl groups having 7-13 carbon atoms, examples of which include phenoxycarbonyl); alkylcarbonyloxy groups which may have a substituent (preferably, optionally substituted alkylcarbonyloxy groups having 2-10 carbon atoms, examples of which include acetoxy); halogen atoms (in particular, a fluorine atom or chlorine atom); carboxy; cyano; hydroxy; mercapto; alkylthio groups which may have a substituent (preferably, alkylthio groups having 1-8 carbon atoms, examples of which include methylthio and ethylthio); arylthio groups which may have a substituent (preferably, arylthio groups having 6-12 carbon atoms, examples of which include phenylthio and 1-naphthylthio); sulfonyl groups which may have a substituent (examples thereof include mesyl and tosyl); silyl groups which may have a substituent (examples thereof include trimethylsilyl and triphenylsilyl); boryl groups which may have a substituent (examples thereof include dimethylboryl); phosphino groups which may have a substituent (examples thereof include diphenylphosphino); aromatic hydrocarbon ring groups which may have a substituent (examples thereof include monovalent groups derived from a five- or six-membered monocycle or a di- to pentacyclic fused ring, such as a benzene ring, naphthalene ring, anthracene ring, phenanthrene ring, perylene ring, tetracene ring, pyrene ring, benzpyrene ring, chrysene ring, triphenylene ring, or fluoranthene ring); aromatic heterocyclic groups which may have a substituent (examples thereof include monovalent groups derived from a five- or six-membered monocycle or a di- to tetracyclic fused ring, such as a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, benzimidazole ring, perimidine ring, or quinazoline ring); amino groups which may have one or more substituents (preferably, alkylamino groups having one or more optionally substituted alkyl groups having 1-8 carbon atoms, examples of which include methylamino, dimethylamino, diethylamino, and dibenzylamino); and arylamino groups having one or more aromatic hydrocarbon ring groups which have 6-12 carbon atoms and may have a substituent (examples thereof include phenylamino, diphenylamino, and ditolylamino). In the case where those substituents further have substituents, examples of these substituents include the substituents shown above as examples.

The number of those substituents is not limited, and $Ar^{11}$ to $Ar^{15}$ each may be one which has been substituted with one substituent or with two or more substituents of one kind or of two or more kinds in any desired combination.

In the polymer, a repeating unit having a partial structure in which a thermally dissociable and soluble group has been bonded and repeating units other than repeating units represented by chemical formula (X) may be contained in the molecule besides the repeating units represented by chemical formula (X). Furthermore, a repeating unit having a partial structure in which two or more different thermally dissociable and soluble groups have been bonded independently or two or more kinds of repeating units represented by chemical formula (X) may be contained in the polymer chain.

In the polymer chain, the proportion of repeating units represented by chemical formula (X) to repeating units having a partial structure in which a thermally dissociable and soluble group has been bonded is preferably 0.1-5 times from the standpoint of attaining excellent hole-transporting performance and excellent reduction resistance.

It is preferred that the polymer of the invention should include repeating units including a structure represented by the following chemical formula (U3) or (U4).

In this case, the content of repeating units including formula (U3) or (U4) in the polymer chain is preferably 10% by mole or higher, more preferably 30% by mole or higher.

[Chem. 10]

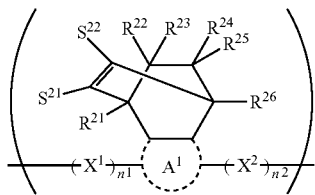

(U3)

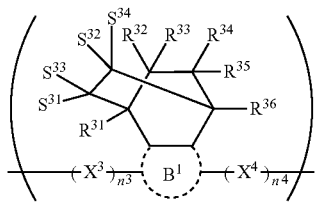

(U4)

(In formula (U3), ring $A^1$ represents an aromatic ring. The aromatic ring may have one or more substituents. The substituents may be bonded to each other directly or through a divalent linking group to form a ring.

$S^{21}$, $S^{22}$, and $R^{21}$ to $R^{26}$ each independently represent a hydrogen atom, a hydroxyl group, an alkyl group which may have a substituent, an aromatic hydrocarbon ring group which may have a substituent, an aromatic heterocyclic group which may have a substituent, an aralkyl group which may have a substituent, an alkoxy group which may have a substituent, an aryloxy group which may have a substituent, an acyl group which may have a substituent, an alkenyl group which may have a substituent, an alkynyl group which may have a substituent, an acyloxy group which may have a substituent, an arylamino group which may have a substituent, a heteroarylamino group which may have a substituent, or an acylamino group which may have a substituent.

$X^1$ and $X^2$ each independently represent a divalent aromatic hydrocarbon ring group which has 6-50 carbon atoms and may have a substituent or a divalent aromatic heterocyclic group which has 3-50 carbon atoms and may have a substituent.

In formula (U4), ring $B^1$ represents an aromatic ring. The aromatic ring may have one or more substituents. The substituents may be bonded to each other directly or through a divalent linking group to form a ring.

$S^{31}$ to $S^{34}$ and $R^{31}$ to $R^{36}$ each independently are the same as those shown above with regard to $S^{21}$, $S^{22}$, and $R^{21}$ to $R^{26}$. $X^3$ and $X^4$ each independently are the same as those shown above with regard to $X^1$ and $X^2$.

Symbols $n^1$ to $n^4$ each independently represent an integer of 0-5.)

Ring $A^1$ and ring $B^1$ in chemical formulae (U3) and (U4) each represent an aromatic ring to which a thermally dissociable and soluble group has been bonded. Although the aromatic ring may be an aromatic hydrocarbon ring or may be an aromatic heterocyclic ring, it is preferred that the aromatic ring should be an aromatic hydrocarbon ring because this ring has excellent electrochemical stability and charge localization is less apt to occur therein. The aromatic ring may have one or more substituents. The substituents may be bonded to each other directly or through a divalent linking group to form a ring.

In the case where rings $A^1$ and $B^1$ are aromatic hydrocarbon rings, the number of nuclear carbon atoms of each aromatic hydrocarbon ring is generally 6 or more. The number thereof is generally 50 or less, preferably 30 or less, more preferably 20 or less. In the case where rings $A^1$ and $B^1$ are aromatic heterocycle, the number of nuclear carbon atoms of each aromatic heterocycle is generally 3 or more, preferably 4 or more, more preferably 5 or more. The number thereof is generally 50 or less, preferably 30 or less, more preferably 20 or less.

Examples of the aromatic hydrocarbon rings include a benzene ring, naphthalene ring, anthracene ring, phenanthrene ring, perylene ring, tetracene ring, pyrene ring, benzpyrene ring, chrysene ring, benzochrysene ring, triphenylene ring, fluoranthene ring, and fluorene ring.

It is preferred that ring $A^1$ and ring $B^1$ each should independently be selected from the group consisting of a benzene ring, a naphthalene ring, an anthracene ring, and a tetracene ring among those rings.

Examples of the aromatic heterocycles include a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, quinoline ring, isoquinoline ring, quinoxaline ring, perimidine ring, quinazoline ring, and quinazolinone ring.

Ring $A^1$ and ring $B^1$ in chemical formulae (U3) and (U4) each may have a structure composed of 1-10 cyclic structural units of the same kind or two or more different kinds, the cyclic structural units being linked together either directly or through one or more oxygen atoms, nitrogen atoms, sulfur atoms, or divalent linking groups of one or more kinds selected from chain groups which have 1-20 nuclear carbon atoms and may contain a heteroatom and aliphatic groups having 1-20 carbon atoms. The cyclic structural units to be linked together can be aromatic hydrocarbon rings or aromatic heterocycles which are the same as any of the aromatic hydrocarbon rings and aromatic heterocycles shown above or are different from these. The aromatic hydrocarbon rings and aromatic heterocycles may have substituents.

Examples of the substituents of ring $A^1$ or ring $B^1$ include: linear or branched alkyl groups having 1-10 carbon atoms, such as methyl, ethyl, n-propyl, 2-propyl, n-butyl, isobutyl, and tert-butyl; alkenyl groups having 1-8 carbon atoms, such as vinyl, allyl, and 1-butenyl; alkynyl groups having 1-8 carbon atoms, such as ethynyl and propargyl; aralkyl groups having 2-8 carbon atoms, such as benzyl; arylamino groups such as phenylamino, diphenylamino, and ditolylamino; heteroarylamino groups such as pyridylamino, thienylamino, and dithienylamino; acylamino groups such as acetylamino and benzoylamino; alkoxy groups having 1-8 carbon atoms, such as methoxy, ethoxy, and butoxy; acyloxyl groups having 1-15 carbon atoms, such as acryloyloxyl, methylcarbonylaoxyl, ethylcarbonylaoxyl, hydroxycarbonylmethylcarbonyloxyl, hydroxycarbonylethylcarbonyloxyl, and hydroxyphenylcarbonyloxyl; and aryloxyl groups having 10-20 carbon atoms, such as phenyloxy, 1-naphthyloxy, and 2-naphthyloxy. These substituents may be bonded to each other either directly or through a divalent linking group, such as, for example, —O—, —S—, >CO$_3$, >SO$_2$, —(C$_x$H$_{2x}$)—, —O—(C$_y$H$_{2y}$)—, a substituted or unsubstituted alkylidene group having 2-20 carbon atoms, or an alkylene group which has 2-20 carbon atoms and may have a substituent, to form a cyclic structure. Symbols x and y each represent an integer of 1-20.

Ring $A^1$ or ring $B^1$ may have one substituent selected from those substituents, or may have two or more substituents of only one kind or of two or more kinds in any desired combination selected from those substituents.

$S^{21}$, $S^{22}$, $R^{21}$ to $R^{26}$, $S^{31}$ to $S^{34}$, and $R^{31}$ to $R^{36}$ in chemical formula (U3) and chemical formula (U4) each independently represent: a hydrogen atom; a hydroxy group; a linear or branched alkyl group which has generally 1-50, preferably up to 10 carbon atoms and which may have a substituent, such as methyl, ethyl, n-propyl, 2-propyl, n-butyl, isobutyl, or tert-butyl; an aromatic hydrocarbon ring group which has generally 5-50 nuclear carbon atoms and may have a substituent; an aromatic heterocyclic group which has 5-40 nuclear carbon atoms and may have a substituent; an aralkyl group in which the number of nuclear carbon atoms is generally 6 or more, preferably 7 or more, and is generally 50 or less, preferably 8 or less, and which may have a substituent, such as benzyl; an alkoxy group which has generally 1-50, preferably up to 8 carbon atoms and which may have a substituent, such as methoxy, ethoxy, or butoxy; an aryloxy group in which the number of nuclear carbon atoms is generally 5 or more, preferably 6 or more, and is generally 50 or less, preferably 15 or less, and which may have a substituent, such as phenyloxy, 1-naphthyloxy, or 2-naphthyloxy; an acyl group which has generally 2-50 nuclear carbon atoms and may have a substituent; an alkenyl group which has generally 1-8 carbon atoms and may have a substituent, such as vinyl, allyl, or 1-butenyl; an alkynyl group which has generally 1-8 carbon atoms and may have a substituent, such as ethynyl or propargyl; an acyloxy group in which the number of nuclear carbon atoms is generally 2 or more and is generally 50 or less, preferably 15 or less, and which may have a substituent, such as acryloyloxyl, methylcarbonyloxyl, ethylcarbonyloxyl, hydroxycarbonylmethylcarbonyloxyl, hydroxycarbonylethylcarbonyloxyl, or hydroxyphenylcarbonyloxyl; an arylamino group which has generally 6-50 nuclear carbon atoms and may have a substituent, such as phenylamino, diphenylamino, or ditolylamino; a heteroarylamino group which has generally 5-50 nuclear carbon atoms and may have a substituent, such as pyridylamino, thienylamino, or dithienylamino; or an acylamino group which has generally 2-50 carbon atoms and may have a substituent, such as acetylamino or benzoylamino.

$X^1$, $X^2$, $X^3$, and $X^4$ each independently represent a nuclear-substituted divalent aromatic hydrocarbon ring group which has 6-50 carbon atoms and may have a substituent or a nuclear-substituted divalent aromatic heterocyclic group which has 3-50 carbon atoms and may have a substituent.

Examples of the aromatic hydrocarbon ring groups or aromatic heterocyclic groups represented by $X^1$, $X^2$, $X^3$, and $X^4$ are the same as those shown above with regard to ring $A^1$ and ring $B^1$.

Symbols $n^1$ to $n^4$ each independently represent an integer of 0-5.

It is preferred that the polymer having the repeating unit described above should be a compound which includes repeating units including a structure represented by the following chemical formula (U7) or (U8), because a further improvement in electrochemical durability is attained in this case.

[Chem. 11]

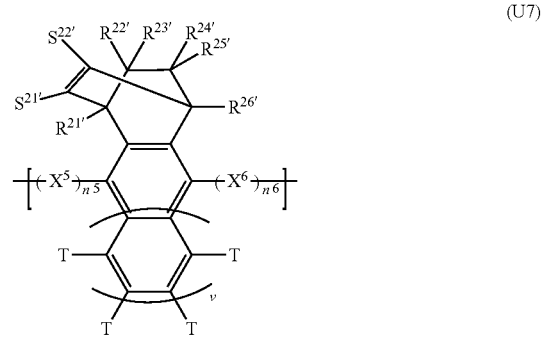

(U7)

(U8)

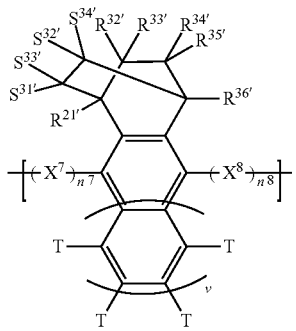

In chemical formulae (U7) and (U8), v represents an integer of 0-4. Symbol v indicates the number of benzene rings. When v is 0, the aromatic hydrocarbon ring to which a thermally dissociable and soluble group has been bonded is a benzene ring. When v is 1, that aromatic hydrocarbon ring is a naphthalene ring. When v is 2, that aromatic hydrocarbon ring is an anthracene ring, phenanthrene ring, or the like.

$S^{21'}$, $S^{22'}$, $R^{21'}$ to $R^{26'}$, $S^{31'}$ to $S^{34'}$, and $R^{31'}$ to $R^{36'}$ in chemical formulae (U7) and (U8) each independently are the same as the examples of $S^{21}$, $S^{22}$, $S^{31}$ to $S^{34}$, $R^{21}$ to $R^{26}$, and $R^{31}$ to $R^{36}$ shown above with regard to chemical formulae (U3) and (U4). The multiple Ts are independent of each other. T is the same as the substituents of ring $A^1$ and ring $B^2$ in chemical formulae (U3) and (U4). The multiple Ts are independent of each other, and may be the same or different. The multiple Ts may be bonded to each other either directly or through a divalent linking group, such as, for example, —O—, —S—, >CO, >$SO_2$, —$(C_xH_{2x})$—, —O—$(C_yH_{2y})$—, an alkylidene group which has 2-20 carbon atoms and may have a substituent, or an alkylene group which has 2-20 carbon atoms and may have a substituent, to form a cyclic structure. Symbols x and y each represent an integer of 0-20.

$X^5$ to $X^8$ each independently represent a divalent linking group. For example, $X^5$ to $X^8$ can be the same as the examples of $X^1$ to $X^4$ shown above with regard to chemical formulae (U3) and (U4). Symbols $n^5$ to $n^8$ each independently represent an integer of 0-5.

[Methods for Synthesizing the Polymer and Examples of Compounds]

Methods for synthesizing the polymer described above are not particularly limited, and are suitably selected according to the structure of the polymer, etc. Examples thereof are shown below, but synthesis methods should not be construed as being limited to the following examples.

For example, a polymer usable as the material for organic electroluminescence elements of the invention can be obtained by subjecting one or more halides represented by chemical formula (IIIa) alone to successive polymerization through a reaction in which Ar—Ar bonds are formed, as shown by the following scheme.

The reaction is usually conducted in the presence of a transition metal catalyst, e.g., copper, palladium, or a nickel complex.

[Chem. 12]

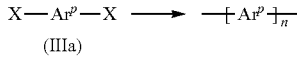

(IIIa)

(In the scheme, X represents a halogen atom or a sulfonic ester group, e.g., a $CF_3SO_2O$— group, and $Ar^p$ represents a divalent aromatic hydrocarbon ring or aromatic heterocycle which may have a substituent having a thermally dissociable and soluble group. Symbol n represents an integer of 1 or larger.)

Alternatively, a polymer usable as the material for organic electroluminescence elements of the invention is obtained by subjecting a halide represented by chemical formula (IIIa) and a secondary amine compound represented by chemical formula (IIIb) to successive polymerization through a reaction in which N—Ar bonds are formed (for example, Buchwald-Hartwing coupling, Ullmann coupling, etc.), for example, as shown by the following scheme. The reaction in which N—Ar bonds are formed is usually conducted in the presence of a base, e.g., potassium carbonate, tert-butoxysodium, or triethylamine. According to need, the reaction may be conducted in the presence of a transition metal catalyst, e.g., copper or a palladium complex.

[Chem. 13]

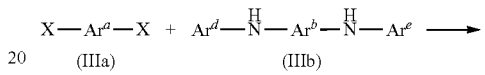

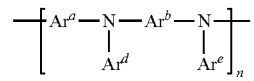

(In the scheme, X represents a halogen atom or a sulfonic ester group, e.g., a $CF_3SO_2O$— group, and $Ar^d$ and $Ar^e$ each independently represent an aromatic hydrocarbon ring group which may have a substituent or an aromatic heterocyclic group which may have a substituent. $Ar^a$ and $Ar^b$ each independently represent a divalent aromatic hydrocarbon ring group which may have a substituent or a divalent aromatic heterocyclic group which may have a substituent. At least one of $Ar^a$, $Ar^b$, $Ar^d$, and Are is a group including a divalent aromatic hydrocarbon ring group or aromatic heterocyclic group to which a thermally dissociable and soluble group has been bonded.

Symbol n represents an integer of 1 or larger.)

Examples of the divalent aromatic hydrocarbon ring groups which may have a substituent or the divalent aromatic heterocyclic groups which may have a substituent, these groups being represented by $Ar^a$ and $Ar^b$, include the divalent groups shown as examples of the optionally substituted aromatic hydrocarbon ring groups or optionally substituted aromatic heterocyclic groups which will be explained later as $Ar^{a1}$ and $Ar^{a2}$ with regard to chemical formula (II), which will be given later. With respect to the substituents thereof also, examples thereof include the substituents shown as substituents of $Ar^{a1}$ and $Ar^{a2}$ with regard to chemical formula (II).

Furthermore, a polymer usable as the material for organic electroluminescence elements of the invention is obtained also by subjecting, for example, a halide represented by chemical formula (IIIa) and a boron compound represented by chemical formula (IIIc) to successive polymerization through a reaction in which Ar—Ar bonds are formed (for example, Suzuki coupling, etc.). The reaction in which Ar—Ar bonds are formed is usually conducted in the presence of a base, e.g., potassium carbonate, tert-butoxysodium, or triethylamine. According to need, the reaction may be conducted in the presence of a transition metal catalyst, e.g., copper or a palladium complex.

[Chem. 14]

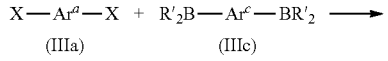

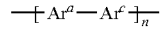

(In the scheme, X represents a halogen atom or a sulfonic ester group, e.g., a $CF_3SO_2O$— group, and R's each represent a hydroxy group or R's represent alkoxy groups which may have been bonded to each other to form a ring. $Ar^a$ and $Ar^c$ each independently represent a divalent aromatic hydrocarbon ring group which may have a substituent or a divalent aromatic heterocyclic group which may have a substituent. At least $Ar^a$ or $Ar^c$ is a divalent aromatic hydrocarbon ring group or aromatic heterocyclic group which may have a substituent to which a thermally dissociable and soluble group has been bonded. Symbol n represents an integer of 1 or larger.)

Specific examples of formulae (U3), (U4), (U7), and (U8) are shown in the following unit group A. However, these formulae should not be construed as being limited to the examples.

<Unit Group A>

[Chem. 15]

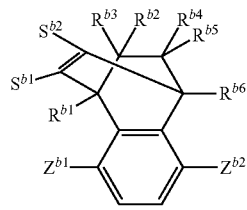

B1

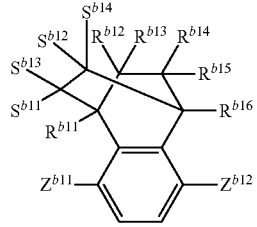

B2

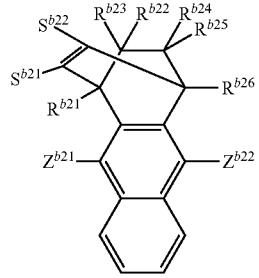

B3

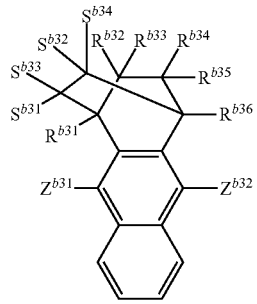

B4

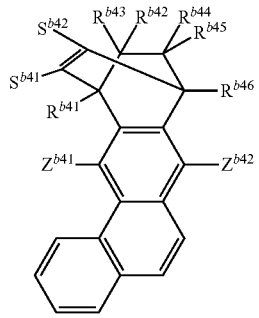

B5

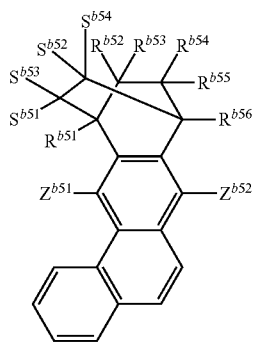

B6

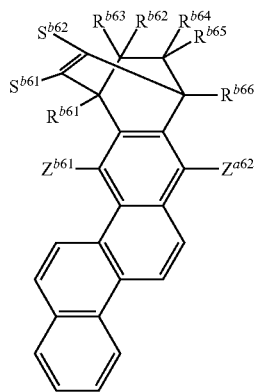

B7

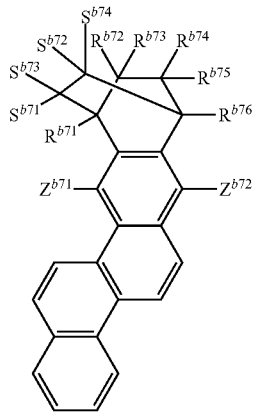

B8

-continued

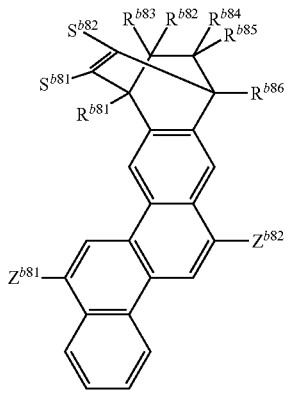

B9

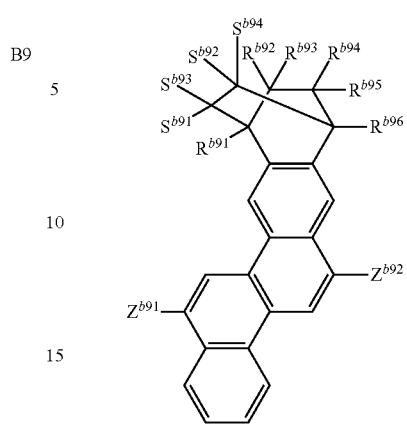

B10

Combinations of groups in each of chemical formulae (B1) to (B10) are shown in the following Table 1 or 2.

TABLE 1

| Chemical Formula | B1~B10 | B1~B10 | B1~B10 |
|---|---|---|---|
| $Z^{b1}, Z^{b11}, Z^{b21}, Z^{b31}, Z^{b41}, Z^{b51}, Z^{b61}, Z^{b71}, Z^{b81},$ or $Z^{b91}$ | 9,9-dimethylfluorene-2,7-diyl | 2,6-naphthalenediyl | 1,4-phenylene |
| $Z^{b2}, Z^{b12}, Z^{b22}, Z^{b32}, Z^{b42}, Z^{b52}, Z^{b62}, Z^{b72}, Z^{b82},$ or $Z^{b92}$ | 9,9-dimethylfluorene-2,7-diyl | 2,6-naphthalenediyl | 2,7-naphthalenediyl |
| $S^{b1}, S^{b11}, S^{b21}, S^{b31}, S^{b41}, S^{b51}, S^{b61}, S^{b71}, S^{b81},$ or $S^{b91}$ | —$CH_3$ | -Propyl-iso | —H |
| $S^{b2}, S^{b12}, S^{b22}, S^{b32}, S^{b42}, S^{b52}, S^{b62}, S^{b72}, S^{b82},$ or $S^{b92}$ | —H | —H | —H |
| $R^{b1}, R^{b11}, R^{b21}, R^{b31}, R^{b41}, R^{b51}, R^{b61}, R^{b71}, R^{b81},$ or $R^{b91}$ | —H | —H | —H |
| $R^{b2}, R^{b12}, R^{b22}, R^{b32}, R^{b42}, R^{b52}, R^{b62}, R^{b72}, R^{b82},$ or $R^{b92}$ | —H | —H | —H |
| $R^{b3}, R^{b13}, R^{b23}, R^{b33}, R^{b43}, R^{b53}, R^{b63}, R^{b73}, R^{b83},$ or $R^{b93}$ | —H | —H | —H |
| $R^{b4}, R^{b14}, R^{b24}, R^{b34}, R^{b44}, R^{b54}, R^{b64}, R^{b74}, R^{b84},$ or $R^{b94}$ | -Propyl-iso | —$CH_3$ | —H |
| $R^{b5}, R^{b15}, R^{b25}, R^{b35}, R^{b45}, R^{b55}, R^{b65}, R^{b75}, R^{b85},$ or $R^{b95}$ | —H | —H | —H |
| $R^{b6}, R^{b16}, R^{b26}, R^{b36}, R^{b46}, R^{b56}, R^{b66}, R^{b76}, R^{b86},$ or $R^{b96}$ | —H | —H | —H |

TABLE 2

| Chemical Formula | B1~B10 | B1~B10 | B1~B10 |
|---|---|---|---|
| $Z^{b1}, Z^{b11}, Z^{b21}, Z^{b31}, Z^{b41}, Z^{b51}, Z^{b61}, Z^{b71}, Z^{b81},$ or $Z^{b91}$ | 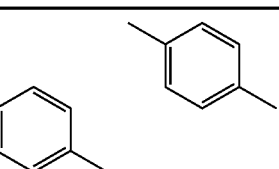 | 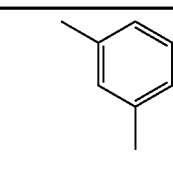 | 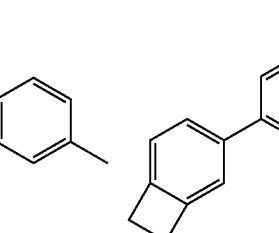 |
| $Z^{b2}, Z^{b12}, Z^{b22}, Z^{b32}, Z^{b42}, Z^{b52}, Z^{b62}, Z^{b72}, Z^{b82},$ or $Z^{b92}$ | 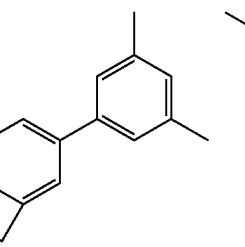 | 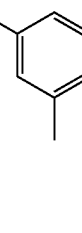 | 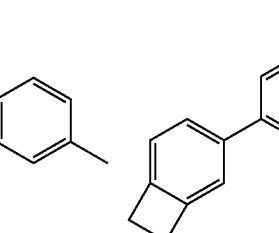 |
| $S^{b1}, S^{b11}, S^{b21}, S^{b31}, S^{b41}, S^{b51}, S^{b61}, S^{b71}, S^{b81},$ or $S^{b91}$ | —CH$_3$ | —CH$_3$ | —CH$_3$ |
| $S^{b2}, S^{b12}, S^{b22}, S^{b32}, S^{b42}, S^{b52}, S^{b62}, S^{b72}, S^{b82},$ or $S^{b92}$ | —H | —H | —H |
| $R^{b1}, R^{b11}, R^{b21}, R^{b31}, R^{b41}, R^{b51}, R^{b61}, R^{b71}, R^{b81},$ or $R^{b91}$ | —H | —H | —H |
| $R^{b2}, R^{b12}, R^{b22}, R^{b32}, R^{b42}, R^{b52}, R^{b62}, R^{b72}, R^{b82},$ or $R^{b92}$ | —H | —H | —H |
| $R^{b3}, R^{b13}, R^{b23}, R^{b33}, R^{b43}, R^{b53}, R^{b63}, R^{b73}, R^{b83},$ or $R^{b93}$ | —H | —H | —H |
| $R^{b4}, R^{b14}, R^{b24}, R^{b34}, R^{b44}, R^{b54}, R^{b64}, R^{b74}, R^{b84},$ or $R^{b94}$ | -Propyl-iso | -Propyl-iso | -Propyl-iso |
| $R^{b5}, R^{b15}, R^{b25}, R^{b35}, R^{b45}, R^{b55}, R^{b65}, R^{b75}, R^{b85},$ or $R^{b95}$ | —H | —H | —H |
| $R^{b6}, R^{b16}, R^{b26}, R^{b36}, R^{b46}, R^{b56}, R^{b66}, R^{b76}, R^{b86},$ or $R^{b96}$ | —H | —H | —H |

Structures which may be contained in the polymer of the invention together with one or more structures selected from unit group A are shown in the following structure group B and structural-formula group E. With respect to structural-formula group E, divalent groups derived from structural-formula group E are contained in the polymer.

<Structure Group B>

[Chem. 16]

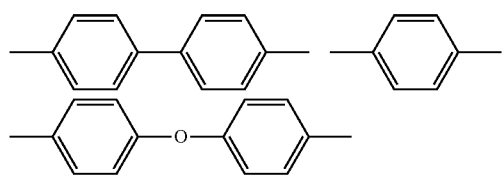

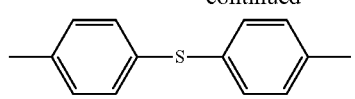

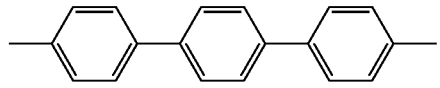

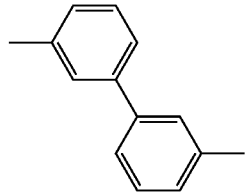

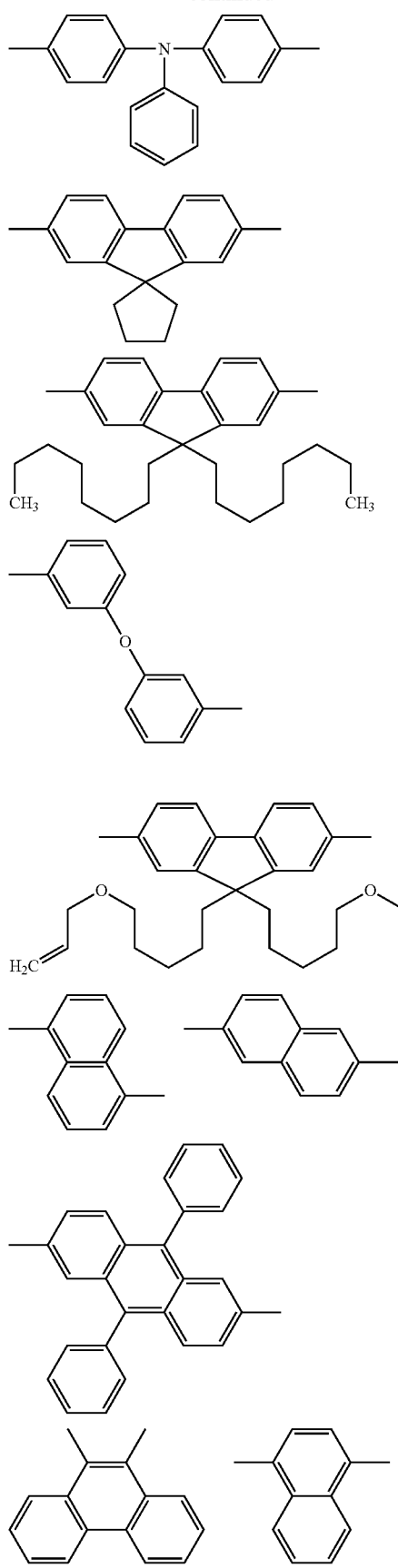
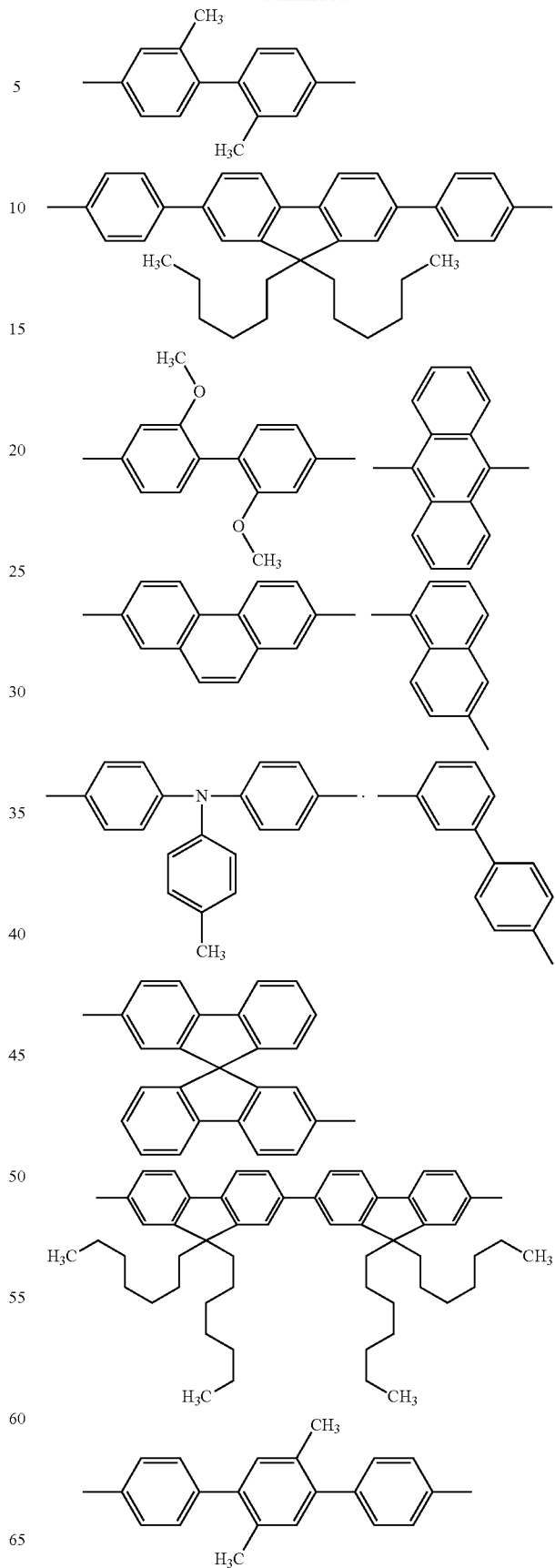

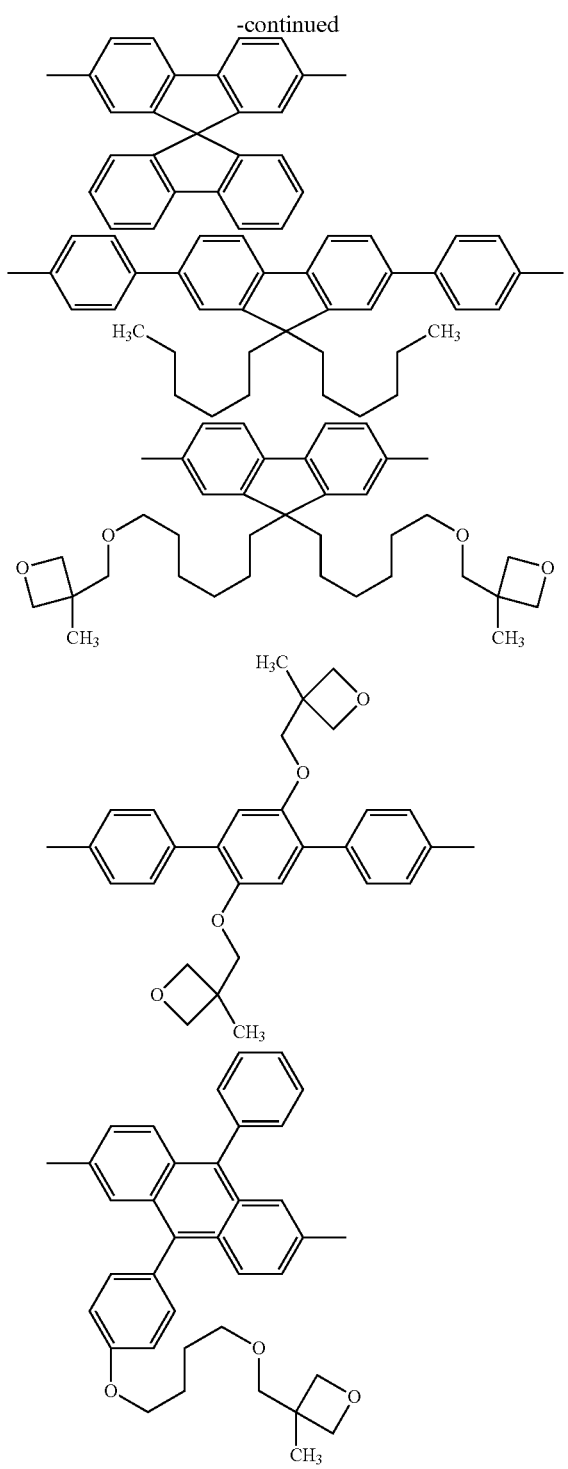
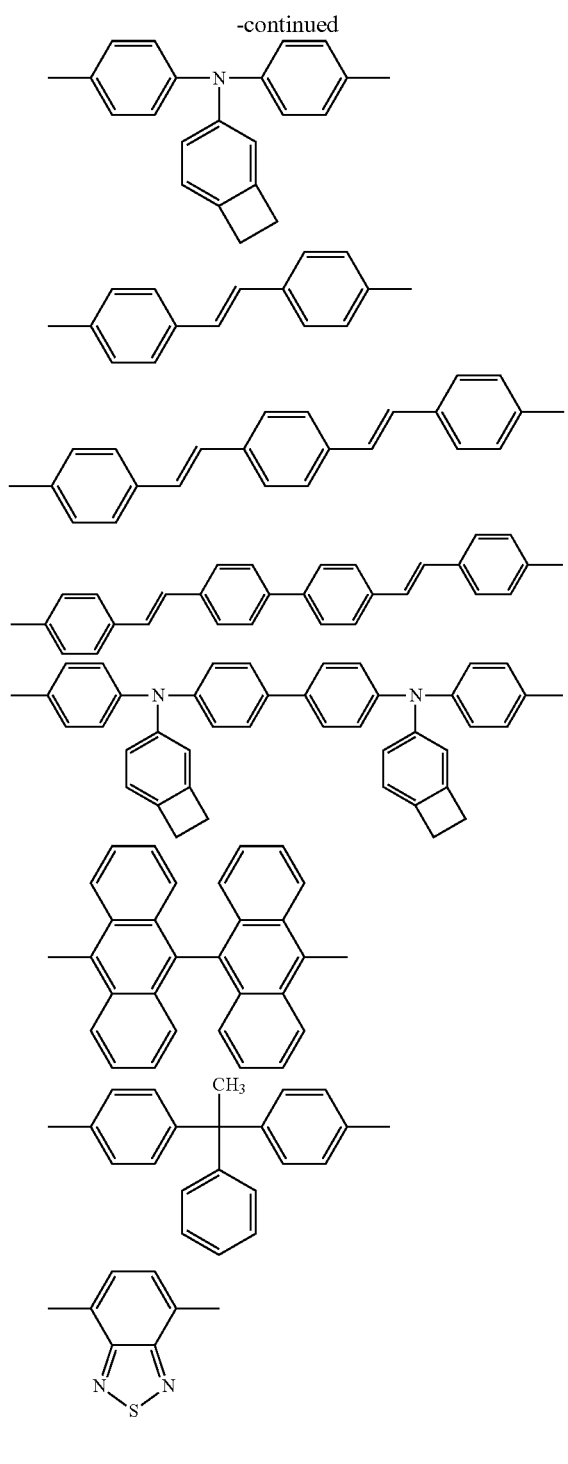
<Structural-Formula Group E>
[Chem. 17]
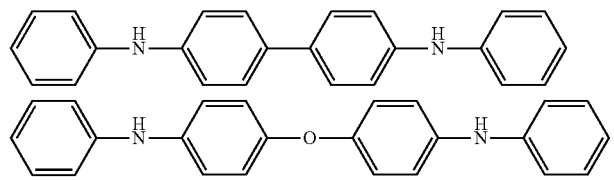

31 32
-continued
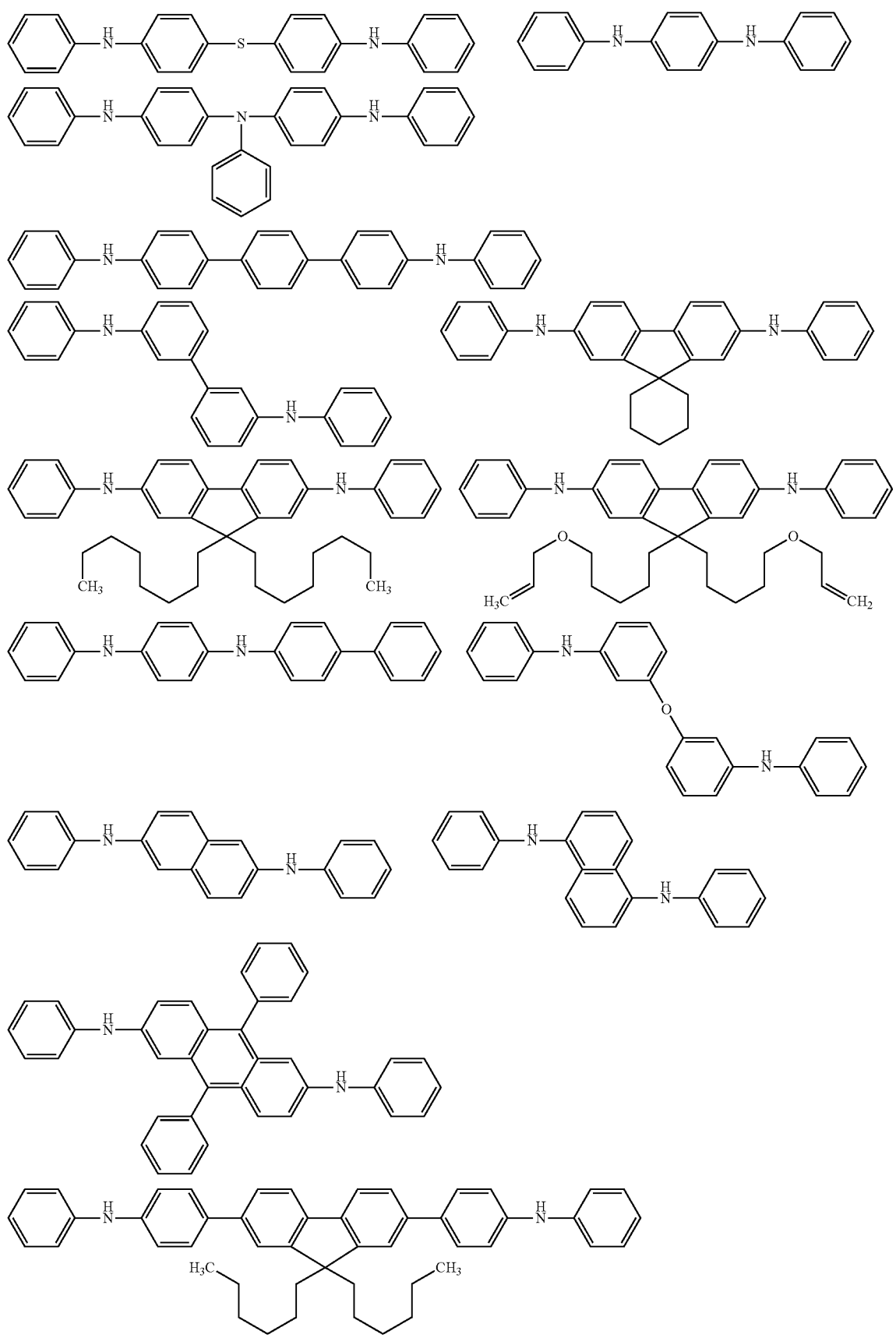

-continued
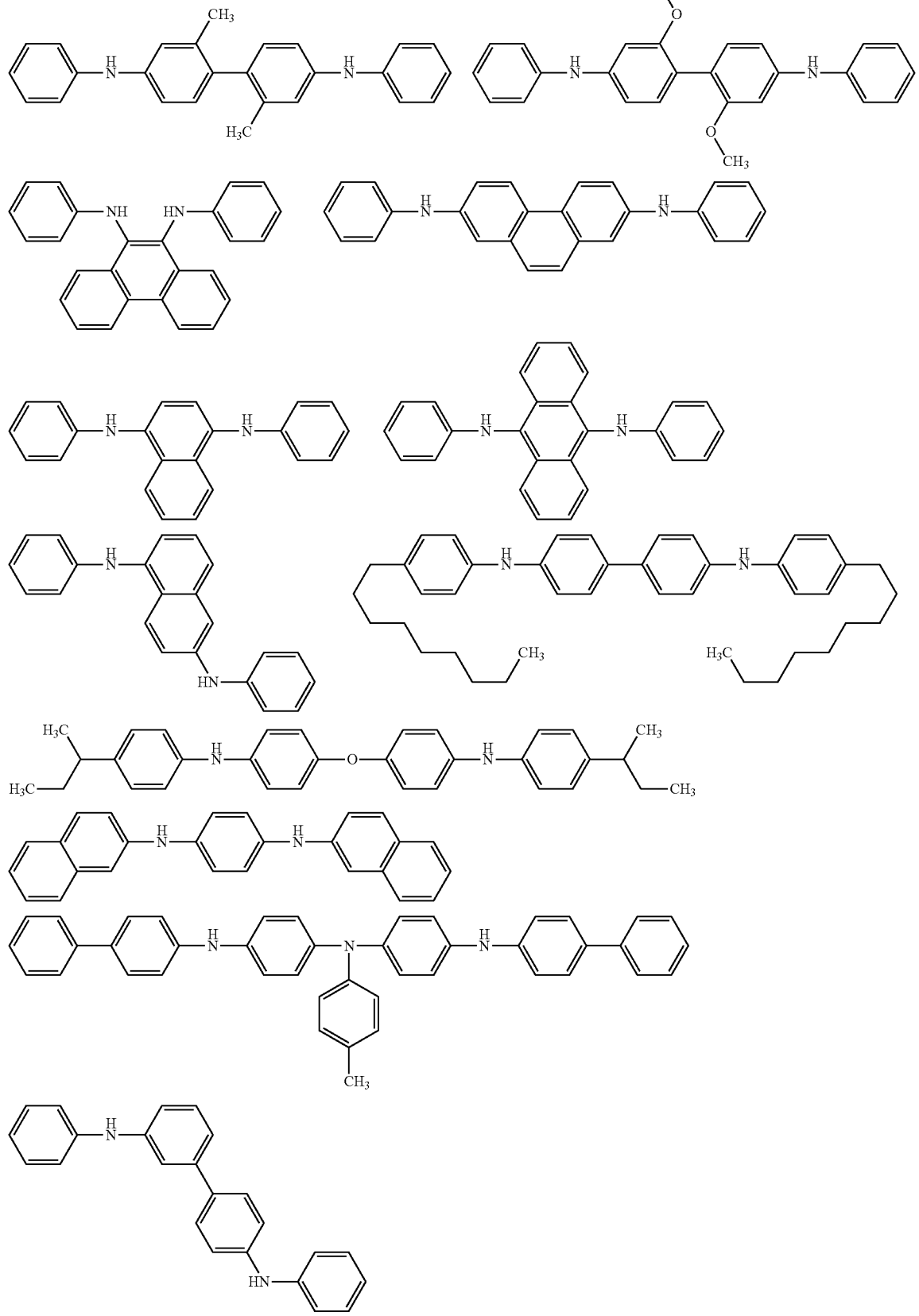

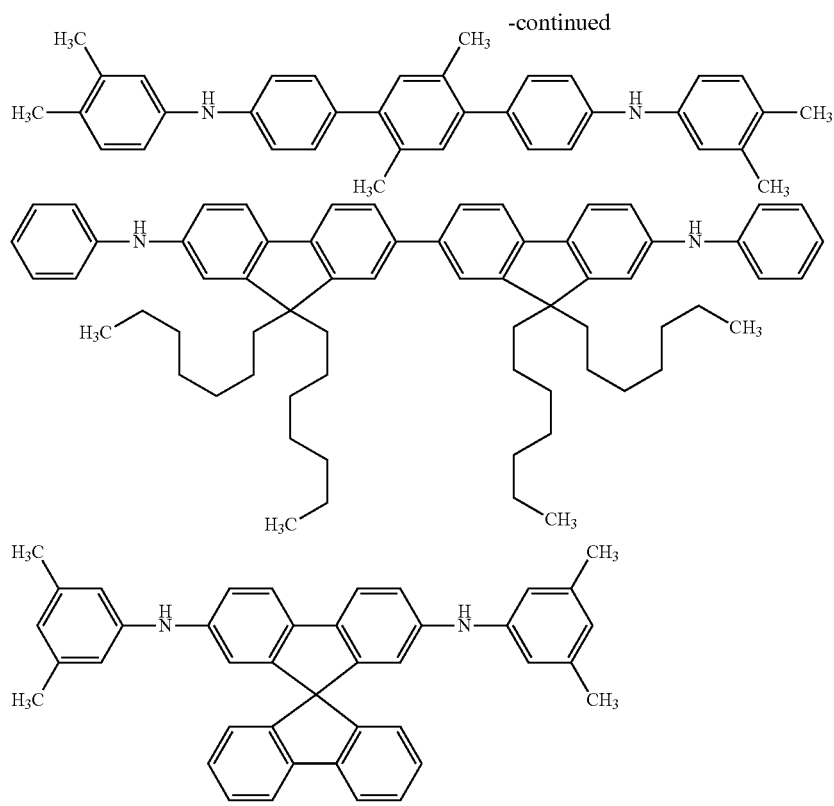
<Structural-Formula Group E>
[Chem. 18]
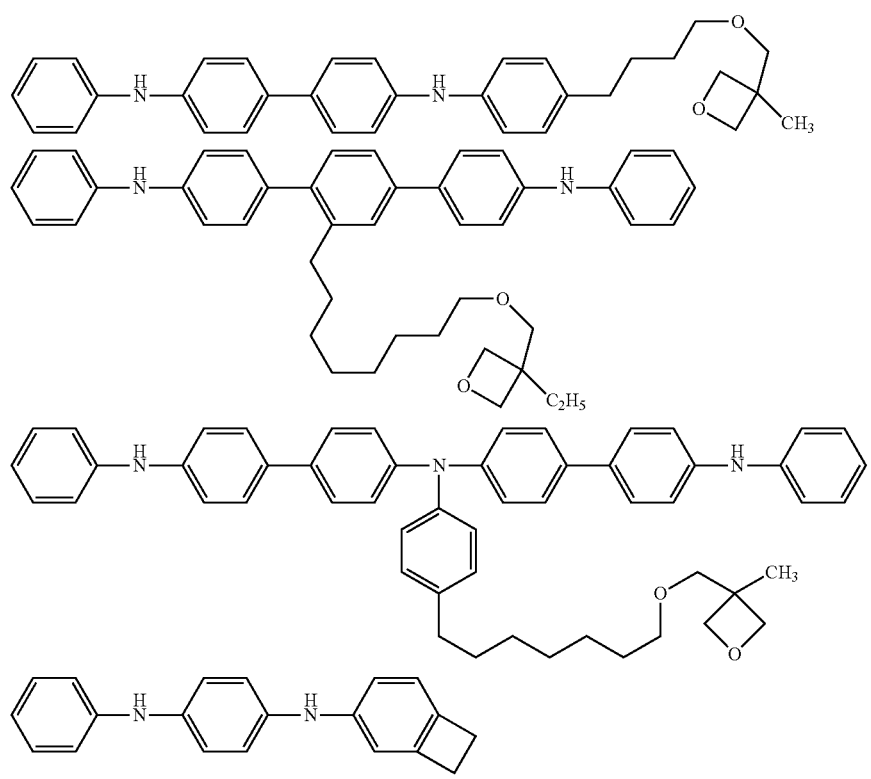

-continued

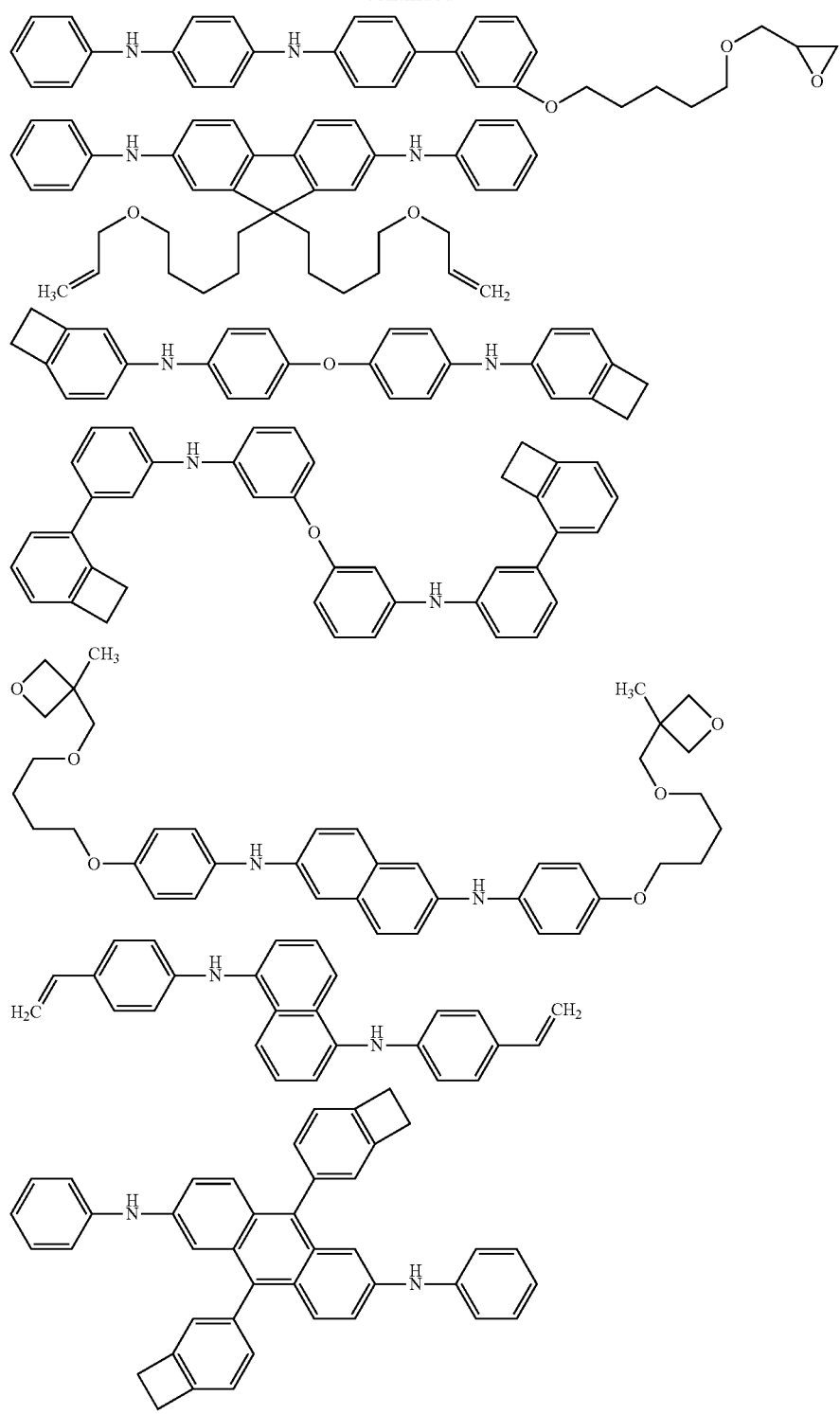

Besides being produced by the polymerization methods described above, the polymer of the invention can be synthesized by known methods. For example, the polymer can be synthesized by the polymerization method described in JP-A-2001-223084, the polymerization method described in JP-A-2003-213002, or the polymerization method described in JP-A-2004-2740, or by the radical polymerization of compounds having an unsaturated double bond or successive polymerization based on a reaction in which ester bonds or amide bonds are formed.

As methods for purifying the polymer after synthesis thereof, known techniques can be used. Examples thereof include the methods described in "*Bunri Seisei Gijutsu Handobukku*" (1993, The Chemical Society of Japan, ed.), "*Kagaku Henkan Hō Niyoru Biryōseibun Oyobi Nan-Seisei*

*Busshitsu No Kōdo-Bunri*" (1988, published by Industrial Publishing & Consulting, Inc.), or "Jikken Kagaku Kōza (4th edition) 1", section "*Bunri To Seisei*" (1990, The Chemical Society of Japan, ed.). Specific examples thereof include extraction (including suspension washing, washing with boiling, ultrasonic cleaning, and acid/base cleaning), adsorption, occlusion, fusion, crystallization (including recrystallization or reprecipitation from solvent), distillation (atmospheric distillation, vacuum distillation), vaporization, sublimation (atmospheric sublimation, vacuum sublimation), ion exchange, dialysis, filtration, ultrafiltration, reverse osmosis, pressure osmosis, zone melting, electrophoresis, centrifugal separation, floatation, sedimentation, magnetic separation, and various chromatographic techniques (Sorting by shape; column, paper, thin film, capillary: sorting by mobile phase; gas, liquid, micelles, supercritical fluid. Separation mechanism; adsorption, distribution, ion exchange, molecular sieve, chelate, gel filtration, exclusion, affinity).

As methods for ascertaining products or determining the purity thereof, the following techniques can, for example, be applied according to need: a gas chromatograph (GC), high-performance liquid chromatograph (HPLC), high-speed amino acid analyzer (organic compounds), capillary electrophoresis (CE), size exclusion chromatograph (SEC), gel permeation chromatograph (GPC), cross fraction chromatograph (CFC), mass spectrometry (MS, LC/MS, GC/MS, MS/MS), nuclear magnetic resonance apparatus (NMR (1HNMR, 13CNMR)), Fourier transform infrared spectrophotometer (FT-IR), spectrophotometer for ultraviolet, visible, and near infrared regions (UV, VIS, NIR), electron spin resonance apparatus (ESR), transmission electron microscope (TEM-EDX), electron probe microanalyzer (EPMA), metallic-element analysis (ion chromatograph, inductively coupled plasma emission spectrometry (ICP-AES), atomic absorption spectrophotometry (AAS), fluorescent X-ray spectrometer (XRF)), non-metallic-element analysis, trace analysis (ICP-MS, GF-AAS, GD-MS), and the like.

[Reasons for being Polymer]

In the case of compounds having one or more thermally dissociable and soluble groups, polymers can be easily regulated with respect to the number of thermally dissociable and soluble groups contained per molecule. It is therefore easy to obtain a difference in solubility in organic solvents between the state which has not undergone dissociation and the state which has undergone the dissociation.

Furthermore, polymers are less apt to crystallize than low-molecular compounds and, hence, have excellent film-forming properties. Consequently, when such a polymer is used to produce an element, current concentration does not occur therein and short-circuiting or the like is hence less apt to occur. Namely, an element having a prolonged life is obtained.

It is especially preferred that the polymer of the invention should be a polymer which contains at least one repeating unit selected from the following repeating-unit group X.

[Repeating-Unit Group X]

[Chem. 19]

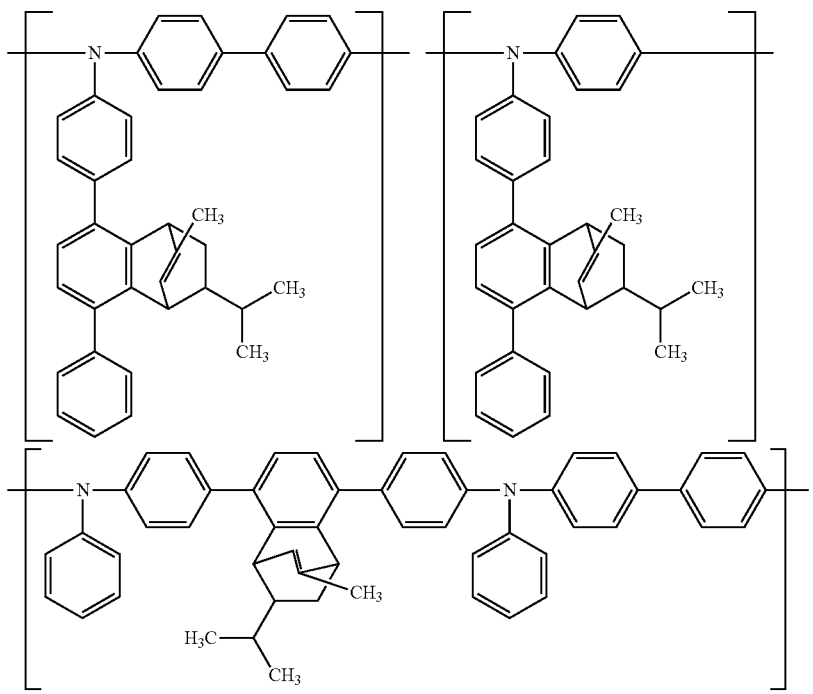

Repeating units of only one kind selected from those shown above may be contained in the polymer, or two or more kinds of repeating units selected therefrom may be contained in any desired combination and proportion. Furthermore, repeating units other than those shown above may be contained.

In the invention, the content of repeating units selected from the repeating-unit group X in the polymer chain is preferably 20% by mole or higher, more preferably 40% by mole or higher. Examples of the repeating units other than the repeating units shown above include the repeating units explained above in the section "A. Polymer".

[Applications]

Besides materials for organic electroluminescence elements, examples of applications of the polymer include colored resists for color filters, transparent resists for color filters, e.g., ribs, overcoats, and photospacers, organic materials for electronic devices, such as organic insulating films, organic TFT materials, and organic solar cells, materials for electrophotographic photoreceptors, and the whole organic devices including these. By using the polymer of the invention, these devices can be made to have excellent electrical stability, insulating properties, etc.

Furthermore, the polymer can be used also as, for example, a resist material or the like. In the case where the polymer is to be applied to a resist material, it is preferred that a substituent having a carboxylic acid, a negative-acting photosensitive group, e.g., an acrylate group or a vinyl ether group, or a positive-acting photosensitive group, e.g., a carbonic ester group, naphthoquinonediazide group, acetal group, or o-nitrobenzene group, should be introduced into the thermally dissociable and soluble group in order to impart solubility in alkaline developing solutions or photosensitivity.

[Composition for Electronic Devices]

The composition for electronic devices of the invention includes the polymer of the invention and a solvent, and is suitable for electronic devices. It is especially preferred that the composition should be used for producing organic electroluminescence elements or organic solar cell elements, among electronic devices.

Namely, it is preferred that the composition for electronic devices of the invention should be a composition for organic electroluminescence elements (hereinafter referred to as composition A for organic electroluminescence elements) or a composition for organic solar cell elements (hereinafter referred to as composition A for organic solar cell elements).

The composition A for organic electroluminescence elements of the invention is suitable for use as a coating fluid when the organic layer of an organic electroluminescence element having an organic layer disposed between an anode and a cathode is formed by a wet film-forming method.

Incidentally, the composition A for organic electroluminescence elements of the invention may be one which contains only one polymer of the invention, or may be one which contains two or more polymers of the invention in any desired combination and proportion.

It is especially preferred that the composition A for organic electroluminescence elements of the invention should be used for forming the hole injection layer or hole transport layer of the organic electroluminescence element.

Incidentally, when the organic electroluminescence element includes one layer between the anode and the luminescent layer, this one layer is referred to as "hole transport layer". When there are two or more layers therebetween, the layer which is in contact with the anode is referred to as "hole injection layer" and the other layer(s) are inclusively referred to as "hole transport layer". There are also cases where the layers disposed between the anode and the luminescent layer are inclusively referred to as "hole injection/transport layers".

The solvent to be contained in the composition A for organic electroluminescence elements preferably is a solvent in which the polymer of the invention dissolves. Usually, the solvent is a solvent in which the polymer of the invention can dissolve in an amount of 0.1% by weight or more, preferably 0.5% by weight or more, more preferably 1% by weight or more.

The composition A for organic electroluminescence elements of the invention contains the polymer of the invention in an amount which is generally 0.01% by weight or more, preferably 0.05% by weight or more, more preferably 0.1% by weight or more, and is generally 50% by weight or less, preferably 20% by weight or less, more preferably 10% by weight or less.

The kind of the solvent to be contained in the composition A for organic electroluminescence elements of the invention is not particularly limited. Preferred examples thereof in which the polymer of the invention dissolves include the following organic solvents: aromatic compounds such as toluene, xylene, mesitylene, and cyclohexylbenzene; halogen-containing solvents such as 1,2-dichloroethane, chlorobenzene, and o-dichlorobenzene; ether solvents including aliphatic ethers such as ethylene glycol dimethyl ether, ethylene glycol diethyl ether, and propylene glycol 1-monomethyl ether acetate (PGMEA) and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole; aliphatic esters such as ethyl acetate, n-butyl acetate, ethyl lactate, and n-butyl lactate; and ester solvents such as phenyl acetate, phenyl propionate, methyl benzoate, ethyl benzoate, isopropyl benzoate, propyl benzoate, and n-butyl benzoate. These may be used alone, or any desired combination of two or more thereof may be used in any desired proportions.

One or more solvents are contained in the composition A for organic electroluminescence elements of the invention in a concentration of generally 40% by weight or higher, preferably 60% by weight or higher, more preferably 80% by weight or higher.

It is widely known that moisture may cause a decrease in the performance of the organic electroluminescence element and, in particular, may accelerate the decrease in luminance which occurs with continuous operation. It is therefore preferred to minimize moisture remaining in the organic layer. Preferred of those solvents are ones which have a water solubility therein at 25° C. of 1% by weight or less. More preferred are solvents which have a water solubility therein at 25° C. of 0.1% by weight or less. It is preferred that these solvents should be contained in the composition A for organic electroluminescence elements in an amount of generally 10% by weight or more, more preferably 30% by weight or more, even more preferably 50% by weight or more.

In general, organic electroluminescence elements employ a large number of materials which may deteriorate considerably by the action of moisture, e.g., the cathode. Consequently, the presence of moisture in the composition A for organic electroluminescence elements is undesirable also from the standpoint of deterioration of the element. Examples of methods for reducing the water content of the composition A for organic electroluminescence elements include sealing with nitrogen gas, use of a drying agent, solvent dehydration conducted beforehand, and use of a solvent in which water is poorly soluble. Use of a solvent in which water is poorly soluble is preferred of these methods because the phenomenon in which during a coating step, the coating film of the solution absorbs moisture from the air to blush can be prevented in this case.

Examples of solvents that can be contained in the composition A for organic electroluminescence elements of the invention include solvents having a surface tension at 20° C. of preferably less than 40 dyn/cm, more preferably 36 dyn/cm or less, even more preferably 33 dyn/cm or less.

In the case where a layer containing the polymer of the invention is to be formed by a wet film-forming method, affinity for the underlying layer is important. Since evenness of film quality considerably affects the evenness and stability of luminescence of the organic electroluminescence element, the coating fluid to be applied by a wet film-forming method is required to have a low surface tension so as to have higher leveling properties and be capable of forming an even coating film. By using such a solvent, an even layer containing the polymer of the invention can be formed.

Specific examples of such solvents having a low surface tension include the aforementioned aromatic solvents including toluene, xylene, mesitylene, and cyclohexylbenzene, ester solvents including ethyl benzoate, and ether solvents including anisole, and further include trifluoromethoxyanisole, pentafluoromethoxybenzene, 3-(trifluoromethyl)anisole, and ethyl pentafluorobenzoate.

Other examples of solvents that can be contained in the composition A for organic electroluminescence elements of the invention include solvents having a vapor pressure at 25° C. which is generally 10 mmHg or lower, preferably 5 mmHg or lower, and is generally 0.1 mmHg or higher. Use of such a solvent can render the composition suitable for use in a process for producing an organic electroluminescence element by a wet film-forming method and render the composition suitable for the properties of the polymer of the invention. Specific examples of such solvents include the aforementioned aromatic solvents including toluene, xylene, and mesitylene, ether solvents, and ester solvents. The concentration of these solvents in the composition is generally 10% by weight or higher, preferably 30% by weight or higher, more preferably 50% by weight or higher.

Examples of solvents that can be contained in the composition A for organic electroluminescence elements of the invention further include a mixed solvent composed of a solvent having a vapor pressure at 25° C. which is generally 2 mmHg or higher, preferably 3 mmHg or higher, more preferably 4 mmHg or higher, and is generally 10 mmHg or lower and a solvent having a vapor pressure at 25° C. of generally lower than 2 mmHg, preferably 1 mmHg or lower, more preferably 0.5 mmHg or lower.

By using such a mixed solvent, a homogeneous layer containing the polymer of the invention and further containing an electron-accepting compound can be formed by a wet film-forming method. The concentration of such a mixed solvent in the composition A for organic electroluminescence elements is generally 10% by weight or higher, preferably 30% by weight or higher, more preferably 50% by weight or higher.

The composition A for organic electroluminescence elements of the invention may contain additives according to need, such as an electron-accepting compound and an additive for accelerating crosslinking reaction, which lowers the solubility of an organic layer to be formed using the composition A for organic electroluminescence elements and enables another layer to be formed on the organic layer by coating. The additive for accelerating crosslinking reaction may be added to a layer which adjoins the layer containing the polymer of the invention.

In the case where those additives are used in the composition A for organic electroluminescence elements, it is preferred to use a solvent in which the polymer of the invention and the additives can dissolve each in a concentration of generally 0.1% by weight or higher, preferably 0.5% by weight or higher, more preferably 1% by weight or higher.

Examples of the additive to be used in the composition A for organic electroluminescence elements of the invention in order to accelerate the crosslinking reaction of the polymer of the invention include polymerization initiators or polymerization accelerators, such as alkylphenone compounds, acylphosphine oxide compounds, metallocene compounds, oxime ester compounds, azo compounds, and onium salts, and photosensitizers such as fused-ring hydrocarbons, porphyrin compounds, and diaryl ketone compounds. One of these compounds may be used alone, or two or more thereof may be used in combination.

As the electron-accepting compound to be contained in the composition A for organic electroluminescence elements of the invention, use can be made of one or more of the electron-accepting compounds which will be explained later in the section "Hole Injection Layer" under "Organic electroluminescence element".

Solvents other than those described above are also usable. For example, amides such as N,N-dimethylformamide and N,N-dimethylacetamide, dimethyl sulfoxide, and the like can be used.

The composition A for organic electroluminescence elements of the invention may further contain various additives including applicability improvers, such as a leveling agent and a defoamer. Furthermore, in the case where the composition A for organic electroluminescence elements is for use in, for example, forming a luminescent layer, the composition A may contain, for example, the luminescent material and other materials which will be explained later in the section "Organic electroluminescence element".

Incidentally, the composition A for organic solar cell elements includes at least the polymer of the invention and a solvent.

As the solvent, the same solvents as for the composition for organic electroluminescence elements may be used.

This composition A may contain other ingredients unless the effects of the invention are lessened thereby.

(Formation of Organic Layer Using Composition a for Organic Electroluminescence Elements)

An organic electroluminescence element is usually formed by superposing a large number of organic layers each including a polymer. Evenness of film quality is therefore highly important.

When an organic layer is to be formed from the composition A for organic electroluminescence elements of the invention, a wet film-forming method is usually used for forming the film.

The term wet film-forming method as used in the invention means a method in which a film is formed by a wet process, such as, for example, spin coating, dip coating, die coating, bar coating, blade coating, roll coating, spray coating, capillary coating, ink-jet printing, screen printing, gravure printing, or flexographic printing. Preferred of these film formation techniques are spin coating, spray coating, and ink-jet printing. This is because these techniques fit the liquid nature of the composition for organic electroluminescence elements.

In the invention, when the composition for organic electroluminescence elements is used to form an organic layer and another organic layer is to be formed thereon by a wet film-forming method or the like, then the layer formed from the composition for organic electroluminescence elements is usually subjected, after the formation thereof, to a heat treatment in order to render the layer insoluble in other solvents.

Techniques for the heating are not particularly limited. Examples thereof include drying by heating and vacuum drying. With respect to conditions for the drying by heating, the layer formed from the composition for organic electroluminescence elements is heated at a temperature which is generally 100° C. or higher, preferably 120° C. or higher, more preferably 150° C. or higher, and is generally 400° C. or lower, preferably 350° C. or lower, more preferably 300° C. or lower. The heating period is generally 1 minute or longer but preferably 24 hours or shorter. Although methods for heating are not particularly limited, use may be made, for example, of a method in which the multilayer structure having the layer formed is put on a hot plate or heated in an oven. For example, use can be made of conditions under which the multilayer structure is heated on a hot plate at 120° C. or higher for 1 minute or longer.

Irradiation with electromagnetic energy, e.g., light, may be conducted in combination with heating. Examples of methods for the irradiation with electromagnetic energy include a method in which an ultraviolet, visible, or infrared light source, e.g., an ultrahigh-pressure mercury lamp, high-pressure mercury lamp, halogen lamp, or infrared lamp, is used to directly illuminate the layer and a method in which a mask aligner or conveyor type illuminator that has any of those light sources built therein is used to illuminate the layer. With respect to irradiation with electromagnetic energy other than light, examples of methods therefor include a method in which an apparatus for irradiating with microwaves generated by a magnetron, i.e., the so-called electronic oven, is used for the irradiation.

With respect to irradiation period, it is preferred to set conditions necessary for lowering the solubility of the film. However, the film may be irradiated for a period of generally 0.1 sec or longer but preferably 10 hours or shorter.

Heating and irradiation with electromagnetic energy, e.g., light, may be conducted alone or in combination. In the case where heating and the irradiation are conducted in combination, the sequence of performing these is not particularly limited.

It is preferred that heating and irradiation with electromagnetic energy including light should be conducted in an atmosphere containing no moisture, e.g., a nitrogen gas atmosphere, in order to reduce the amount of moisture contained in and/or adsorbed on the surface of the layer which has undergone the heating and irradiation. For the same purpose, in the case where heating and/or irradiation with electromagnetic energy, e.g., light, are conducted in combination, it is especially preferred that at least the step immediately before the formation of an organic luminescent layer should be conducted in an atmosphere containing no moisture, e.g., a nitrogen gas atmosphere.

Incidentally, formation of an organic layer from the composition A for organic solar cell elements may be conducted in the same manner as described above.

B. Luminescent-Layer Material

The luminescent-layer material of the invention is characterized by including a low-molecular compound having a thermally dissociable and soluble group.

Use of a low-molecular compound (compound having a single molecular weight) as a luminescent-layer material has advantages that it is easy to heighten purity and that an organic layer reduced in performance unevenness can be formed. Hereinafter, the luminescent-layer material of the invention is sometimes referred to as low-molecular compound.

In the case where the luminescent-layer material of the invention is a low-molecular compound (compound having a single molecular weight), the molecular weight of the compound is generally 300 or higher, preferably 500 or higher, more preferably 1,000 or higher, and is generally 20,000 or lower, preferably 10,000 or lower, more preferably 5,000 or lower. When the molecular weight thereof is higher than the upper limit, there are cases where a complicated synthesis path is necessary, making it difficult to attain high purity. There are also cases where impurities having increased molecular weights make it difficult to purify the compound. When the molecular weight thereof is lower than the lower limit, there are cases where the compound has reduced film-forming properties. There are also cases where since such a low molecular weight results in decreases in glass transition temperature, melting point, and vaporization temperature, the compound has considerably impaired heat resistance.

[Proportion of Thermally Dissociable and Soluble Group]

The ratio of the molecular weight of the low-molecular compound to the number of thermally dissociable and soluble groups is generally 200 or more, preferably 300 or more, more preferably 500 or more, and is generally 4,000 or less, preferably 3,500 or less, more preferably 3,000 or less. In case where the ratio thereof is less than the lower limit, there is a possibility that the thermally dissociable and soluble groups might reduce the electrical durability of the compound which has undergone thermal dissociation or that this low-molecular compound might have excessive crystallinity and hence give a cracked film. Conversely, in case where the ratio thereof is far higher than the upper limit, the effect of reducing solubility which is produced by thermal dissociation of the thermally dissociable and soluble groups is apt to be low, resulting in a possibility that electrical durability, charge-transporting properties, or heat resistance might decrease.

[Structure of the Low-Molecular Compound]

Examples of the low-molecular compound having a thermally dissociable and soluble group of the invention include compounds represented by the following chemical formula (U1) or (U2).

[Chem. 20]

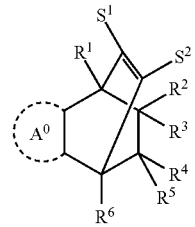

(U1)

(In formula (U1), ring $A^0$ represents an aromatic ring. The aromatic ring may have one or more substituents. The substituents may be bonded to each other directly or through a divalent linking group to form a ring.

$S^1, S^2, R^1,$ and $R^6$ each independently represent a hydrogen atom, a hydroxyl group, an alkyl group which may have a substituent, an aromatic hydrocarbon ring group which may have a substituent, an aromatic heterocyclic group which may have a substituent, an aralkyl group which may have a substituent, an alkoxy group which may have a substituent, an aryloxy group which may have a substituent, an acyl group which may have a substituent, an alkenyl group which may have a substituent, an alkynyl group which may have a substituent, an acyloxy group which may have a substituent, an arylamino group which may have a substituent, a heteroarylamino group which may have a substituent, or an acylamino group which may have a substituent.

$R^2$ to $R^5$ each independently represent a hydrogen atom or an alkyl group which may have a substituent.

However, all of $R^2$ to $R^5$ are not hydrogen atoms simultaneously.)

[Chem. 21]

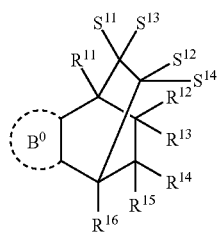

(U2)

(In formula (U2), ring $B^0$ represents an aromatic ring. The aromatic ring may have one or more substituents. The substituents may be bonded to each other directly or through a divalent linking group to form a ring.

$S^{11}$ to $S^{14}$ and $R^{11}$ to $R^{16}$ each independently represent a hydrogen atom, a hydroxyl group, an alkyl group which may have a substituent, an aromatic hydrocarbon ring group which may have a substituent, an aromatic heterocyclic group which may have a substituent, an aralkyl group which may have a substituent, an alkoxy group which may have a substituent, an aryloxy group which may have a substituent, an acyl group which may have a substituent, an alkenyl group which may have a substituent, an alkynyl group which may have a substituent, an acyloxy group which may have a substituent, an arylamino group which may have a substituent, a heteroarylamino group which may have a substituent, or an acylamino group which may have a substituent.)

In chemical formula (U1), ring $A^0$ represents an aromatic ring. In chemical formula (U2), ring $B^0$ represents an aromatic ring. The aromatic rings represented by ring $A^0$ and ring $B^0$ each may have one or more substituents. The aromatic rings may be aromatic hydrocarbon rings or may be aromatic heterocycles.

The number of nuclear carbon atoms of each aromatic hydrocarbon ring is generally 6 or more. The number thereof is generally 40 or less, preferably 30 or less, more preferably 20 or less.

Examples of the aromatic hydrocarbon rings include a benzene ring, naphthalene ring, anthracene ring, phenanthrene ring, perylene ring, tetracene ring, pyrene ring, benzpyrene ring, chrysene ring, benzochrysene ring, triphenylene ring, fluoranthene ring, and fluorene ring.

It is preferred that ring $A^0$ and ring $B^0$ each should independently be selected from the group consisting of a benzene ring, a naphthalene ring, an anthracene ring, and a tetracene ring among those rings.

The number of nuclear carbon atoms of each aromatic heterocycle is generally 3 or more. The number thereof is generally 50 or less, preferably 30 or less, more preferably 20 or less.

Examples of the aromatic heterocycles include a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, quinoline ring, isoquinoline ring, quinoxaline ring, perimidine ring, quinazoline ring, and quinazolinone ring.

Ring $A^0$ and ring $B^0$ in chemical formulae (U1) and (U2) each may have a structure composed of 1-10 cyclic structural units of the same kind or two or more different kinds, the cyclic structural units being linked together either directly or through one or more oxygen atoms, nitrogen atoms, sulfur atoms, or divalent linking groups of one or more kinds selected from chain groups which have 1-20 nuclear carbon atoms and may contain a heteroatom and aliphatic groups having 1-20 carbon atoms. The cyclic structural units to be linked together can be aromatic hydrocarbon rings or aromatic heterocycles which are the same as any of the aromatic hydrocarbon rings and aromatic heterocycles shown above or are different from these. The aromatic hydrocarbon rings and aromatic heterocycles may have one or more substituents.

Examples of the substituents of ring $A^0$ or ring $B^0$ include: linear or branched alkyl groups having 1-10 carbon atoms, such as methyl, ethyl, n-propyl, 2-propyl, n-butyl, isobutyl, and tert-butyl; alkenyl groups having 1-8 carbon atoms, such as vinyl, allyl, and 1-butenyl; alkynyl groups having 1-8 carbon atoms, such as ethynyl and propargyl; aralkyl groups having 2-8 carbon atoms, such as benzyl; arylamino groups such as phenylamino, diphenylamino, and ditolylamino; heteroarylamino groups such as pyridylamino, thienylamino, and dithienylamino; acylamino groups such as acetylamino and benzoylamino; alkoxy groups having 1-8 carbon atoms, such as methoxy, ethoxy, and butoxy; acyloxyl groups having 1-15 carbon atoms, such as acryloyloxyl, methylcarbonylaoxyl, ethylcarbonylaoxyl, hydroxycarbonylmethylcarbonyloxyl, hydroxycarbonylethylcarbonyloxyl, and hydroxyphenylcarbonyloxyl; and aryloxyl groups having 10-20 carbon atoms, such as phenyloxy, 1-naphthyloxy, and 2-naphthyloxy. These substituents may be bonded to each other either directly or through a divalent linking group, such as, for example, —O—, —S—, >CO, >SO$_2$, —(C$_x$H$_{2x}$)—, —O—(C$_y$H$_{2y}$)—, a substituted or unsubstituted alkylidene group having 2-20 carbon atoms, or an alkylene group which has 2-20 carbon atoms and may have a substituent, to form a cyclic structure. Symbols x and y each represent an integer of 1-20.

Ring $A^0$ or ring $B^0$ may have one substituent selected from those substituents, or may have two or more substituents of only one kind or of two or more kinds in any desired combination selected from those substituents.

$S^1$, $S^2$, $S^{11}$ to $S^{14}$, $R^1$, $R^6$, and $R^{11}$ to $R^{16}$ in chemical formula (U1) and chemical formula (U2) each independently represent: a hydrogen atom; a hydroxy group; a linear or branched alkyl group which has generally 1-50, preferably up to 10 carbon atoms and which may have a substituent, such as methyl, ethyl, n-propyl, 2-propyl, n-butyl, isobutyl, or tert-butyl; an aromatic hydrocarbon ring group which has generally 5-50 nuclear carbon atoms and may have a substituent; an aromatic heterocyclic group which has 5-40 nuclear carbon atoms and may have a substituent; an aralkyl group in which the number of nuclear carbon atoms is generally 6 or more, preferably 7 or more, and is generally 50 or less, preferably 8 or less, and which may have a substituent, such as benzyl; an alkoxy group which has generally 1-50, preferably up to 8 carbon atoms and which may have a substituent, such as methoxy, ethoxy, or butoxy; an aryloxy group in which the number of nuclear carbon atoms is generally 5 or more, preferably 6 or more, and is generally 50 or less, preferably 15 or less, and which may have a substituent, such as phenyloxy, 1-naphthyloxy, or 2-naphthyloxy; an acyl group which has generally 2-50 nuclear carbon atoms and may have a substituent; an alkenyl group which has generally 1-8 carbon atoms and may have a substituent, such as vinyl, allyl, or 1-butenyl; an alkynyl group which has generally 1-8 carbon atoms and may have a substituent, such as ethynyl or propargyl; an acyloxy group in which the number of nuclear carbon atoms is generally 2 or more and is generally 50 or less, preferably 15 or less, and which may have a substituent, such as acryloyloxyl, methylcarbonyloxyl, ethylcarbonyloxyl, hydroxycarbonylmethylcarbonyloxyl, hydroxycarbonylethylcarbonyloxyl, or hydroxyphenylcarbonyloxyl; an arylamino group which has generally 6-50 nuclear carbon atoms and may have a substituent, such as phenylamino, diphenylamino, or ditolylamino; a heteroarylamino group which has generally 5-50 nuclear carbon atoms and may have a substituent, such as pyridylamino, thienylamino, or dithienylamino; or an acylamino group which has generally 2-50 carbon atoms and may have a substituent, such as acetylamino or benzoylamino.

$R^2$ to $R^5$ in chemical formula (U1) each independently represent a hydrogen atom or an alkyl group which may have a substituent and in which the number of nuclear carbon atoms is generally 1 or more, preferably 2 or more, and is generally 20 or less, preferably 10 or less. However, all of $R^2$ to $R^5$ are not hydrogen atoms simultaneously.

The reason why all of $R^2$ to $R^5$ in formula (U1) are not hydrogen atoms simultaneously is as follows.

In the case of low-molecular compounds, the number of thermally dissociable and soluble groups possessed per molecule is smaller than in polymers. Namely, it is difficult to obtain a difference in solubility in solvents between the state which has not undergone dissociation and the state which has undergone the dissociation. However, introduction of an alkyl group as at least one of $R^2$ to $R^5$ makes it easy to obtain a difference in solubility in solvents between the state which has not undergone dissociation and the state which has undergone the dissociation, as compared with the case in which $R^2$ to $R^5$ are hydrogen atoms simultaneously.

In formula (U2), all of $R^{12}$ to $R^{15}$ may be hydrogen atoms simultaneously, and all of $R^{12}$ to $R^{15}$ need not be hydrogen atoms simultaneously. The reasons why $R^{12}$ to $R^{15}$ in formula (U2) may be hydrogen atoms simultaneously are as follows.

In formula (U2), the other bridging part (of the bicyclo ring) is an alkylene group ($-CS^{11}S^{13}-CS^{12}S^{14}-$). This bridging part is more effective in improving solubility than the alkenyl group ($-CS^1=CS^2-$) of (U1). Consequently, all of $R^{12}$ to $R^{15}$ may be hydrogen atoms.

Another reason is that thermal dissociation in formula (U2) occurs in two stages and, hence, on/off control regarding solubility is easy to attain as compared with the case of formula (U1).

More preferred of those compounds are compounds represented by the following chemical formula (U5) or following chemical formula (U6) because use of these compounds attains a further improvement in electrochemical durability.

[Chem. 22]

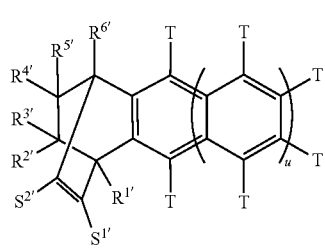

(U5)

-continued

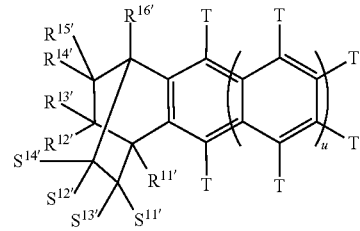

(U6)

In chemical formulae (U5) and (U6), u represents an integer of 0-4. Symbol u indicates the number of benzene rings. When u is 0, the aromatic hydrocarbon ring to which a thermally dissociable and soluble group has been bonded is a benzene ring. When u is 1, that aromatic hydrocarbon ring is a naphthalene ring. When u is 2, that aromatic hydrocarbon ring is an anthracene ring, phenanthrene ring, or the like.

$S^{1'}$, $S^{2'}$, and $R^{1'}$ to $R^{6'}$ are respectively the same as $S^1$, $S^2$, and $R^1$ to $R^6$ of chemical formula (U1). $S^{11'}$ to $S^{14'}$ and $R^{16'}$ to $R^{16'}$ are respectively the same as $S^{11}$ to $S^{14}$ and $R^{11}$ to $R^{16}$ of chemical formula (U2). T is the same as the substituents of ring $A^0$ and ring $B^0$ in chemical formulae (U1) and (U2). The multiple Ts are independent of each other, and may be the same or different. The multiple Ts may be bonded to each other either directly or through a divalent linking group, such as, for example, $-O-$, $-S-$, $>CO$, $>SO_2$, $-(C_xH_{2x})-$, $-O-(C_yH_{2y})-$, an alkylidene group which has 2-20 carbon atoms and may have a substituent, or an alkylene group which has 2-20 carbon atoms and may have a substituent, to form a cyclic structure. Symbols x and y each represent an integer of 0-20.

It is preferred that the luminescent-layer material of the invention should be a compound which contains, in a repeating unit, a structure represented by chemical formula (U3) or (U4), which was explained above in the section "A. Polymer".

Furthermore, it is preferred that the compound which contains, in a repeating unit, a structure represented by chemical formula (U3) or (U4) should be a compound which contains, in a repeating unit, a structure represented by chemical formula (U7) or chemical formula (U8), which was described above in the section "A. Polymer".

It is also preferred that the low-molecular compound (compound having a single molecular weight) should contain in the molecule a divalent group represented by the following formula (II), from the standpoints of trapping holes and heightening luminescent efficiency.

[Chem. 23]

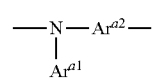

(II)

In chemical formula (II), $Ar^{a1}$ and $Ar^{a2}$ may be the same or different. $Ar^{a1}$ and $Ar^{a2}$ each independently represent an aromatic hydrocarbon ring group which may have a substituent or an aromatic heterocyclic group which may have a substituent. $Ar^{a1}$ and $Ar^{a2}$ respectively represent a monovalent group and a divalent group. However, when $Ar^{a2}$ is located at an end, one of the connected parts is replaced by a hydrogen atom.

Examples of the optionally substituted aromatic hydrocarbon ring groups and the optionally substituted aromatic heterocyclic groups, which are represented by $Ar^{a1}$ and $Ar^{a2}$, are the same as those of $Ar^{11}$ to $Ar^{15}$ contained in formula (X), which were explained above in the section "A. Polymer".

Furthermore, examples of the substituents which may be possessed by the aromatic hydrocarbon ring groups and aromatic heterocyclic groups represented by $Ar^{a1}$ and $Ar^{a2}$ are the same as those of $Ar^{11}$ to $Ar^{15}$ contained in formula (X), which were explained above in the section "A. Polymer".

[Examples of the Luminescent-Layer Material (Low-Molecular Compound)]

Preferred examples of the luminescent-layer material (low-molecular compound) are shown below. However, the invention should not be construed as being limited to the following examples.

[Chem. 24]

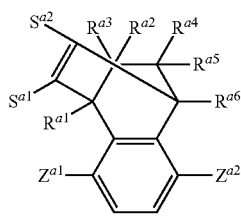

A1

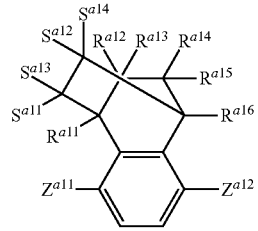

A2

Combinations of $S^{a1}$, $S^{a2}$, $R^{a1}$ to $R^{a6}$, $S^{a11}$ to $S^{a14}$, $R^{a11}$ to $R^{a16}$, $Z^{a1}$, $Z^{a2}$, $Z^{a11}$, and $Z^{a12}$ in chemical formulae (A1) and (A2) are shown in the following Table 3 to Table 8. In the following tables, Ph represents phenyl.

TABLE 3

| Chemical Formula | A1 | A1 | A1 | A1 | A1 |
|---|---|---|---|---|---|
| $Z^{a1}$ | 4-MeC6H4-N(Ph)2 | 4-MeC6H4-N(Ph)2 | 4-MeC6H4-N(Ph)2 | 4-MeC6H4-N(Ph)2 | (complex triarylamine) |
| $Z^{a2}$ | 4-MeC6H4-N(Ph)2 | 4-MeC6H4-N(Ph)2 | 4-MeC6H4-N(Ph)2 | 4-MeC6H4-N(Ph)2 | (complex triarylamine) |
| $S^{a1}$ | —H | —CH$_3$ | -Propyl-iso | —H | —CH$_3$ |
| $S^{a2}$ | —H | —H | —H | —H | —H |
| $R^{a1}$ | —H | —H | —H | —H | —H |
| $R^{a2}$ | —H | —H | —H | —H | —H |
| $R^{a3}$ | —H | —H | —H | —H | —H |
| $R^{a4}$ | —H | -Propyl-iso | —CH$_3$ | —CH$_3$ | -Propyl-iso |
| $R^{a5}$ | —H | —H | —CH$_3$ | —CH$_3$ | —H |
| $R^{a6}$ | —H | —H | —H | —H | —H |

TABLE 4
| Chemical Formula | A1 | A1 |
|---|---|---|
| $Z^{a1}$ | 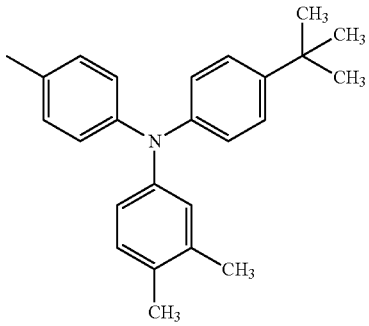 | 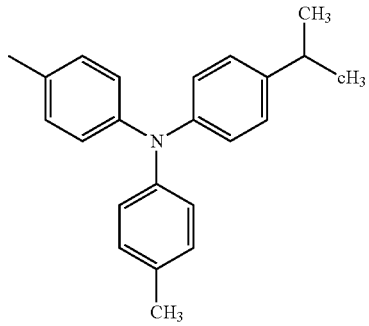 |
| $Z^{a2}$ | 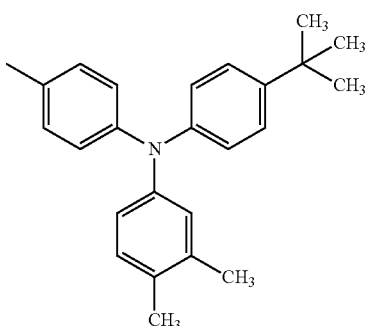 | 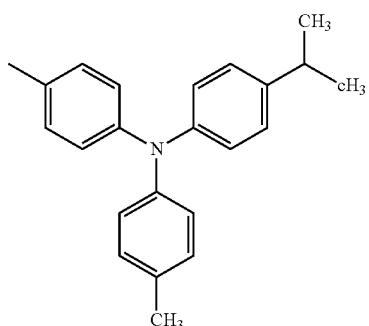 |
| $S^{a1}$ | —$CH_3$ | —$CH_3$ |
| $S^{a2}$ | —H | —H |
| $R^{a1}$ | —H | —H |
| $R^{a2}$ | —H | —H |
| $R^{a3}$ | —H | —H |
| $R^{a4}$ | -Propyl-iso | -Propyl-iso |
| $R^{a5}$ | —H | —H |
| $R^{a6}$ | —H | —H |
| Chemical Formula | A1 | A1 |
|---|---|---|
| $Z^{a1}$ | 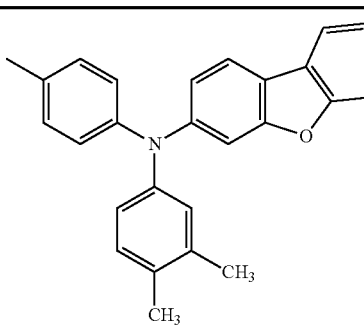 | 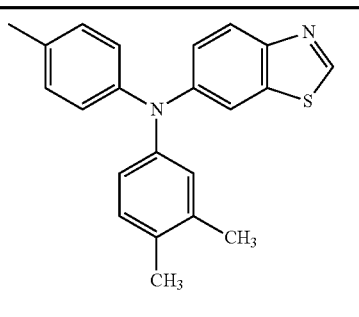 |
| $Z^{a2}$ | 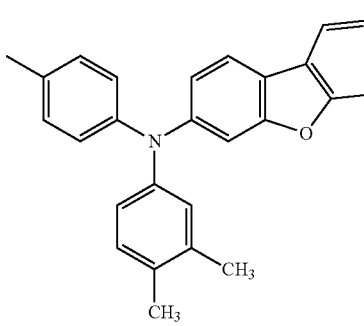 | 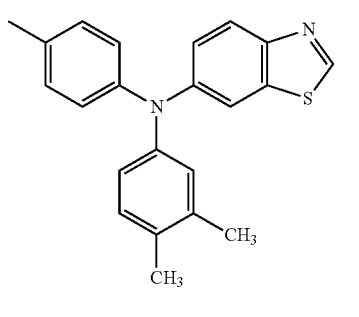 |

TABLE 4-continued

| | | |
|---|---|---|
| $S^{a1}$ | —CH₃ | —CH₃ |
| $S^{a2}$ | —H | —H |
| $R^{a1}$ | —H | —H |
| $R^{a2}$ | —H | —H |
| $R^{a3}$ | —H | —H |
| $R^{a4}$ | -Propyl-iso | -Propyl-iso |
| $R^{a5}$ | —H | —H |
| $R^{a6}$ | —H | —H |

TABLE 5

| Chemical Formula | A2 | A2 | A2 | A2 |
|---|---|---|---|---|
| $Z^{a11}$ | 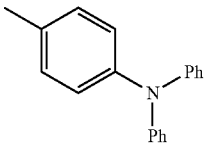 | 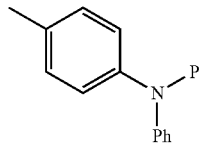 | 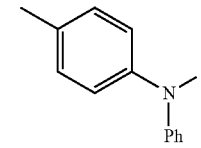 | 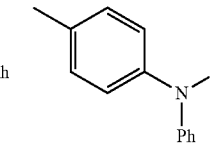 |
| $Z^{a12}$ | 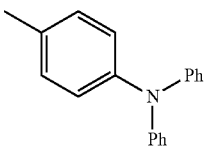 | 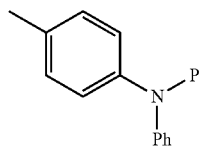 | 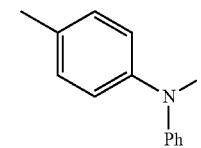 | 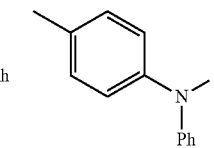 |
| $S^{a11}$ | —CH₃ | —CH₃ | —CH₃ | —CH₃ |
| $S^{a12}$ | —H | —OH | —OCOCH=CH₂ | —OCOC₂H₄COOH |
| $R^{a11}$ | —H | —H | —H | —H |
| $R^{a12}$ | —H | —H | —H | —H |
| $R^{a13}$ | —H | —H | —H | —H |
| $R^{a14}$ | -Propyl-iso | -Propyl-iso | -Propyl-iso | -Propyl-iso |
| $R^{a15}$ | —H | —H | —H | —H |
| $R^{a16}$ | —H | —H | —H | —H |

TABLE 6

| Chemical Formula | A1 | A1 | A2 | A1 |
|---|---|---|---|---|
| $Z^{a1}$, $Z^{a11}$, | 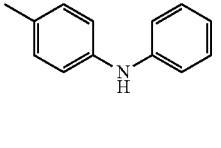 | 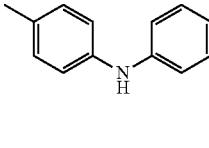 | 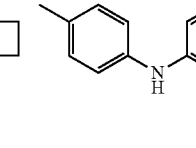 | 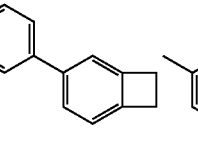 |
| $Z^{a2}$, $Z^{a12}$ | 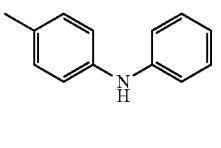 | 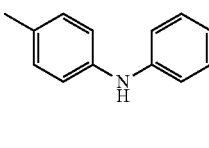 | 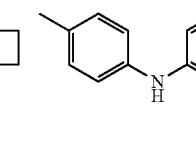 | 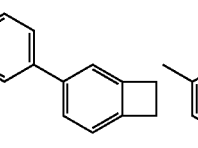 |
| $S^{a1}$, $S^{a11}$ | —CH₃ | —CH₃ | —CH₃ | -Propyl-iso |
| $S^{a2}$, $S^{a12}$ | —OH | —H | —H | —H |
| $R^{a1}$, $R^{a11}$ | —H | —H | —H | —H |
| $R^{a2}$, $R^{a12}$ | —H | —H | —H | —H |

TABLE 6-continued

| Chemical Formula | A1 | A1 | A2 | A1 |
|---|---|---|---|---|
| $R^{a3}$, $R^{a13}$ | —H | —H | —H | —H |
| $R^{a4}$, $R^{a14}$ | -Propyl-iso | -Propyl-iso | -Propyl-iso | —CH$_3$ |
| $R^{a5}$, $R^{a15}$ | —H | —H | —H | —CH$_3$ |
| $R^{a6}$, $R^{a16}$ | —H | —H | —H | —H |

TABLE 7

| Chemical Formula | A1 | A2 | A2 | A2 |
|---|---|---|---|---|
| $Z^{a1}$, $Z^{a11}$, | [structure] | [structure] | [structure] | [structure] |
| $Z^{a2}$, $Z^{a12}$ | [structure] | [structure] | [structure] | [structure] |
| $S^{a1}$, $S^{a11}$ | —H | —CH$_3$ | —CH$_3$ | —CH$_3$ |
| $S^{a2}$, $S^{a12}$ | —H | —OH | —OCOCH=CH$_2$ | [structure] |
| $R^{a1}$, $R^{a11}$ | —H | —H | —H | —H |
| $R^{a2}$, $R^{a12}$ | —H | —H | —H | —H |
| $R^{a3}$, $R^{a13}$ | —H | —H | —H | —H |
| $R^{a4}$, $R^{a14}$ | —CH$_3$ | -Propyl-iso | -Propyl-iso | -Propyl-iso |
| $R^{a5}$, $R^{a15}$ | —CH$_3$ | —H | —H | —H |
| $R^{a6}$, $R^{a16}$ | —H | —H | —H | —H |

TABLE 8
| Chemical Formula | A2 | A2 | A1 |
|---|---|---|---|
| $Z^{a1}, Z^{a11}$ | 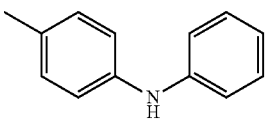 | 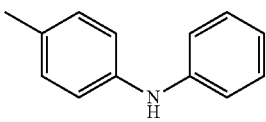 | 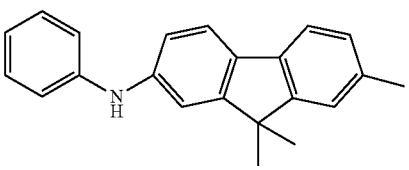 |
| $Z^{a2}, Z^{a12}$ | 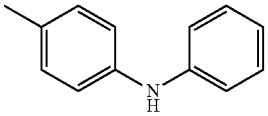 | 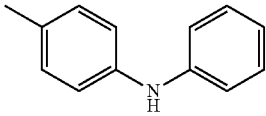 | 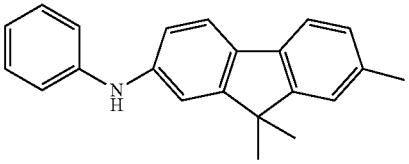 |
| $S^{a1}, S^{a11}$ | —CH$_3$ | —CH$_3$ | —CH$_3$ |
| $S^{a2}, S^{a12}$ | 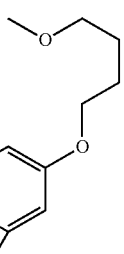 | —OCOC$_2$H$_4$COOH | —H |
| $R^{a1}, R^{a11}$ | —H | —H | —H |
| $R^{a2}, R^{a12}$ | —H | —H | —H |
| $R^{a3}, R^{a13}$ | —H | —H | —H |
| $R^{a4}, R^{a14}$ | -Propyl-iso | -Propyl-iso | -Propyl-iso |
| $R^{a5}, R^{a15}$ | —H | —H | —H |
| $R^{a6}, R^{a16}$ | —H | —H | —H |
| Chemical Formula | A1 | A1 |
|---|---|---|
| $Z^{a1}, Z^{a11}$ | 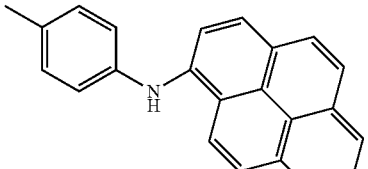 | 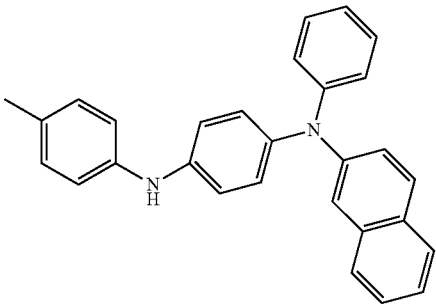 |
| $Z^{a2}, Z^{a12}$ | 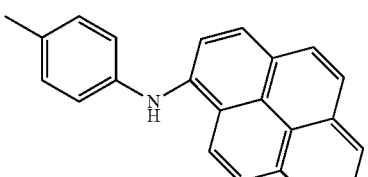 | 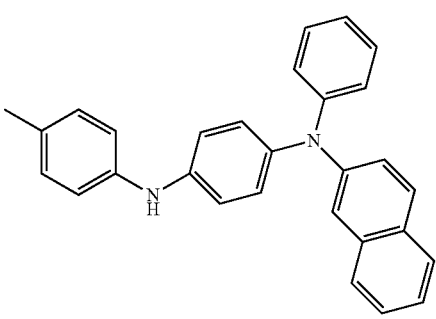 |
| $S^{a1}, S^{a11}$ | —CH$_3$ | —CH$_3$ |
| $S^{a2}, S^{a12}$ | —H | —H |

TABLE 8-continued

| | | |
|---|---|---|
| $R^{a1}, R^{a11}$ | —H | —H |
| $R^{a2}, R^{a12}$ | —H | —H |
| $R^{a3}, R^{a13}$ | —H | —H |
| $R^{a4}, R^{a14}$ | -Propyl-iso | -Propyl-iso |
| $R^{a5}, R^{a15}$ | —H | —H |
| $R^{a6}, R^{a16}$ | —H | —H |

When each of the compounds shown above has a substituent at $S^{a2}$ or $S^{a12}$ on the ethano group or etheno group, it is preferred that this compound should have an alkyl group at $S^{a1}$ or $S^{a11}$ because the efficiency of thermal dissociation reaction of the thermally dissociable and soluble group is improved. Examples of preferred compounds further include the following.

[Chem. 25]

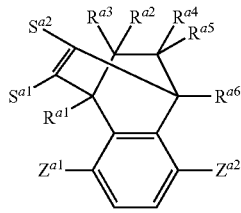
A1

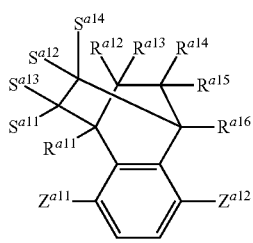
A2

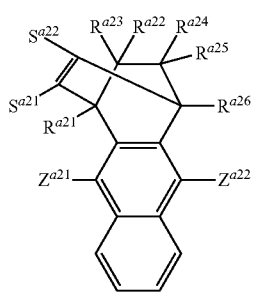
A3

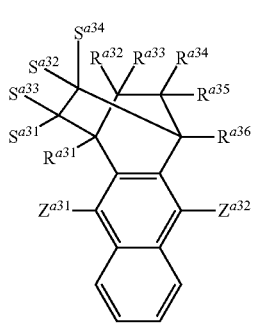
A4

-continued

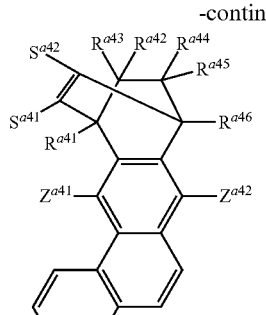
A5

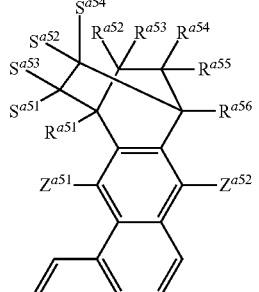
A6

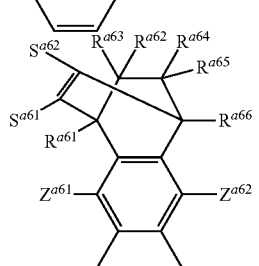
A7

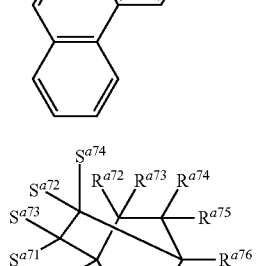
A8

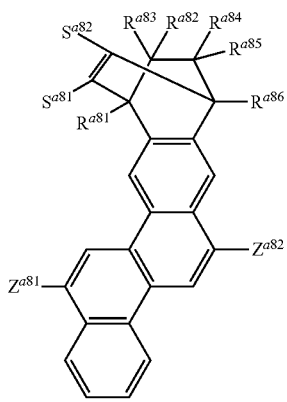

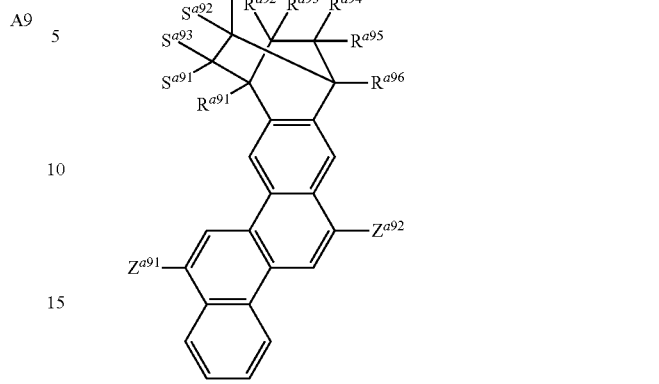

Combinations of groups in each of chemical formulae (A1) to (A10) are shown in the following Tables 9 to 11.

TABLE 9

| Chemical Formula | A1~A10 | | A1~A10 |
|---|---|---|---|
| $Z^{a1}, Z^{a11}, Z^{a21}, Z^{a31}, Z^{a41}, Z^{a51}, Z^{a61}, Z^{a71}, Z^{a81},$ or $Z^{a91}$ | (2-methylnaphthalene) | | (2-methylnaphthalene) |
| $Z^{a2}, Z^{a12}, Z^{a22}, Z^{a32}, Z^{a42}, Z^{a52}, Z^{a62}, Z^{a72}, Z^{a82},$ or $Z^{a92}$ | (extended aryl structure) | | (m-tolyl-naphthalene) |
| $S^{a1}, S^{a11}, S^{a21}, S^{a31}, S^{a41}, S^{a51}, S^{a61}, S^{a71}, S^{a81},$ or $S^{a91}$ | —CH$_3$ | | -Propyl-iso |
| $S^{a2}, S^{a12}, S^{a22}, S^{a32}, S^{a42}, S^{a52}, S^{a62}, S^{a72}, S^{a82},$ or $S^{a92}$ | —H | | —H |

TABLE 9-continued

| | | | |
|---|---|---|---|
| $R^{a1}, R^{a11}, R^{a21}, R^{a31}, R^{a41}, R^{a51}, R^{a61}, R^{a71}, R^{a81},$ or $R^{a91}$ | —H | | —H |
| $R^{a2}, R^{a12}, R^{a22}, R^{a32}, R^{a42}, R^{a52}, R^{a62}, R^{a72}, R^{a82},$ or $R^{a92}$ | —H | | —H |
| $R^{a3}, R^{a13}, R^{a23}, R^{a33}, R^{a43}, R^{a53}, R^{a63}, R^{a73}, R^{a83},$ or $R^{a93}$ | —H | | —H |
| $R^{a4}, R^{a14}, R^{a24}, R^{a34}, R^{a44}, R^{a54}, R^{a64}, R^{a74}, R^{a84},$ or $R^{a94}$ | -Propyl-iso | | —CH$_3$ |
| $R^{a5}, R^{a15}, R^{a25}, R^{a35}, R^{a45}, R^{a55}, R^{a65}, R^{a75}, R^{a85},$ or $R^{a95}$ | —H | | —H |
| $R^{a6}, R^{a16}, R^{a26}, R^{a36}, R^{a46}, R^{a56}, R^{a66}, R^{a76}, R^{a86},$ or $R^{a96}$ | —H | | —H |
| Chemical Formula | A1~A10 | A1~A10 | A1~A10 |
| $Z^{a1}, Z^{a11}, Z^{a21}, Z^{a31}, Z^{a41}, Z^{a51}, Z^{a61}, Z^{a71}, Z^{a81},$ or $Z^{a91}$ | 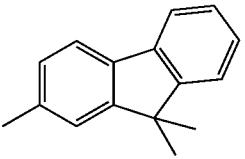 | 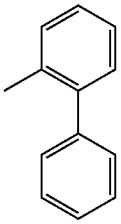 | 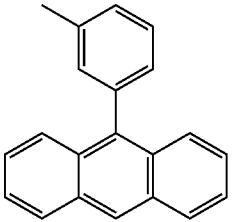 |
| $Z^{a2}, Z^{a12}, Z^{a22}, Z^{a32}, Z^{a42}, Z^{a52}, Z^{a62}, Z^{a72}, Z^{a82},$ or $Z^{a92}$ | 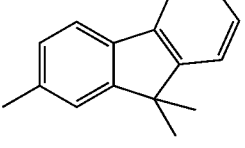 | 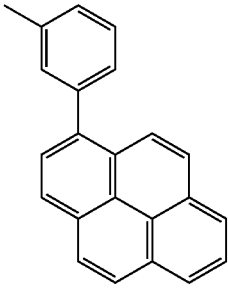 [SMILES: Cc1cccc(-c2ccc3ccc4cccc5ccc2c3c45)c1] | 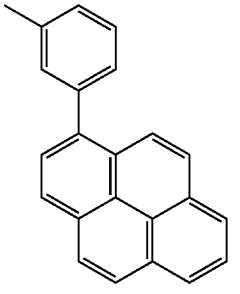 |
| $S^{a1}, S^{a11}, S^{a21}, S^{a31}, S^{a41}, S^{a51}, S^{a61}, S^{a71}, S^{a81},$ or $S^{a91}$ | —H | —CH$_3$ | —CH$_3$ |
| $S^{a2}, S^{a12}, S^{a22}, S^{a32}, S^{a42}, S^{a52}, S^{a62}, S^{a72}, S^{a82},$ or $S^{a92}$ | —H | —H | —H |
| $R^{a1}, R^{a11}, R^{a21}, R^{a31}, R^{a41}, R^{a51}, R^{a61}, R^{a71}, R^{a81},$ or $R^{a91}$ | —H | —H | —H |
| $R^{a2}, R^{a12}, R^{a22}, R^{a32}, R^{a42}, R^{a52}, R^{a62}, R^{a72}, R^{a82},$ or $R^{a92}$ | —H | —H | —H |
| $R^{a3}, R^{a13}, R^{a23}, R^{a33}, R^{a43}, R^{a53}, R^{a63}, R^{a73}, R^{a83},$ or $R^{a93}$ | —H | —H | —H |
| $R^{a4}, R^{a14}, R^{a24}, R^{a34}, R^{a44}, R^{a54}, R^{a64}, R^{a74}, R^{a84},$ or $R^{a94}$ | —H | -Propyl-iso | -Propyl-iso |
| $R^{a5}, R^{a15}, R^{a25}, R^{a35}, R^{a45}, R^{a55},$ | —H | —H | —H |

TABLE 9-continued

| | | | |
|---|---|---|---|
| $R^{a65}, R^{a75}, R^{a85},$ or $R^{a95}$ | | | |
| $R^{a6}, R^{a16}, R^{a26}, R^{a36}, R^{a46}, R^{a56}, R^{a66}, R^{a76}, R^{a86},$ or $R^{a96}$ | —H | —H | —H |

TABLE 10

| Chemical Formula | A1~A10 | A1~A10 | A1~A10 | A1~A10 | A1~A10 |
|---|---|---|---|---|---|
| $Z^{a1}, Z^{a11}, Z^{a21}, Z^{a31}, Z^{a41}, Z^{a51}, Z^{a61}, Z^{a71}, Z^{a81},$ or $Z^{a91}$ | (pyrene structure) | (methyl-chrysene structure) | (2-methylbiphenyl structure) | (methyl-naphthalene-phenyl structure) | —H |
| $Z^{a2}, Z^{a12}, Z^{a22}, Z^{a32}, Z^{a42}, Z^{a52}, Z^{a62}, Z^{a72}, Z^{a82},$ or $Z^{a92}$ | (9-methylanthracene structure) | (methyl-anthracene structure) | (methyl-diphenylanthracene structure) | (methyl-pyrene structure) | —H |
| $S^{a1}, S^{a11}, S^{a21}, S^{a31}, S^{a41}, S^{a51}, S^{a61}, S^{a71}, S^{a81},$ or $S^{a91}$ | —CH$_3$ | —CH$_3$ | —CH$_3$ | —CH$_3$ | —CH$_3$ |
| $S^{a2}, S^{a12}, S^{a22}, S^{a32}, S^{a42}, S^{a52}, S^{a62}, S^{a72}, S^{a82},$ or $S^{a92}$ | —H | —H | —H | —H | —H |
| $R^{a1}, R^{a11}, R^{a21}, R^{a31}, R^{a41}, R^{a51}, R^{a61}, R^{a71}, R^{a81},$ or $R^{a91}$ | —H | —H | —H | —H | —H |
| $R^{a2}, R^{a12}, R^{a22}, R^{a32}, R^{a42}, R^{a52}, R^{a62}, R^{a72}, R^{a82},$ or $R^{a92}$ | —H | —H | —H | —H | —H |
| $R^{a3}, R^{a13}, R^{a23}, R^{a33}, R^{a43}, R^{a53}, R^{a63}, R^{a73}, R^{a83},$ or $R^{a93}$ | —H | —H | —H | —H | —H |
| $R^{a4}, R^{a14}, R^{a24}, R^{a34}, R^{a44}, R^{a54}, R^{a64}, R^{a74}, R^{a84},$ or $R^{a94}$ | -Propyl-iso | -Propyl-iso | -Propyl-iso | -Propyl-iso | -Propyl-iso |
| $R^{a5}, R^{a15}, R^{a25}, R^{a35}, R^{a45}, R^{a55}, R^{a65}, R^{a75}, R^{a85},$ or $R^{a95}$ | —H | —H | —H | —H | —H |
| $R^{a6}, R^{a16}, R^{a26}, R^{a36}, R^{a46}, R^{a56}, R^{a66}, R^{a76}, R^{a86},$ or $R^{a96}$ | —H | —H | —H | —H | —H |

TABLE 11

| Chemical Formula | A1~A10 | A1~A10 | A1~A10 |
|---|---|---|---|
| $Z^{a1}, Z^{a11}, Z^{a21}, Z^{a31}, Z^{a41}, Z^{a51}, Z^{a61}, Z^{a71}, Z^{a81},$ or $Z^{a91}$ | 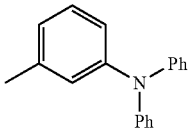 | 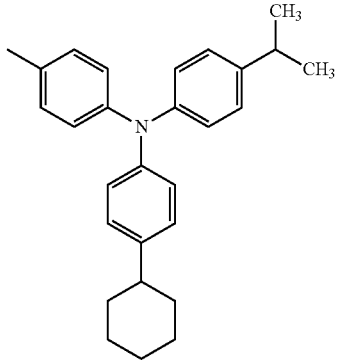 | 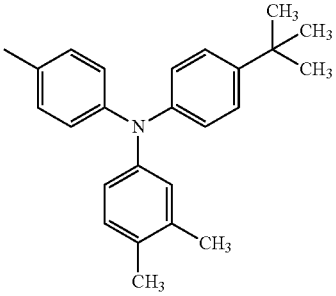 |
| $Z^{a2}, Z^{a12}, Z^{a22}, Z^{a32}, Z^{a42}, Z^{a52}, Z^{a62}, Z^{a72}, Z^{a82},$ or $Z^{a92}$ | 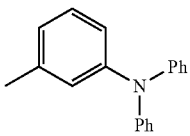 | 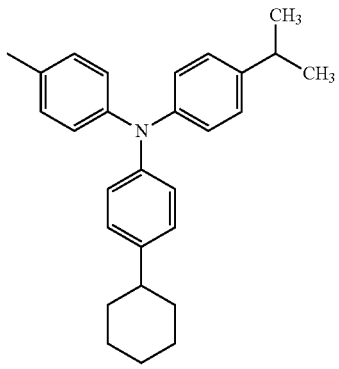 | 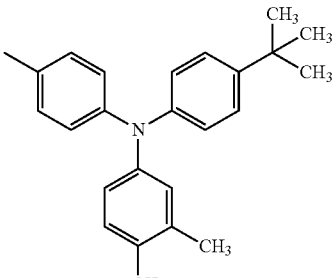 |
| $S^{a1}, S^{a11}, S^{a21}, S^{a31}, S^{a41}, S^{a51}, S^{a61}, S^{a71}, S^{a81},$ or $S^{a91}$ | —CH$_3$ | —CH$_3$ | —CH$_3$ |
| $S^{a2}, S^{a12}, S^{a22}, S^{a32}, S^{a42}, S^{a52}, S^{a62}, S^{a72}, S^{a82},$ or $S^{a92}$ | —H | —H | —H |
| $R^{a1}, R^{a11}, R^{a21}, R^{a31}, R^{a41}, R^{a51}, R^{a61}, R^{a71}, R^{a81},$ or $R^{a91}$ | —H | —H | —H |
| $R^{a2}, R^{a12}, R^{a22}, R^{a32}, R^{a42}, R^{a52}, R^{a62}, R^{a72}, R^{a82},$ or $R^{a92}$ | —H | —H | —H |
| $R^{a3}, R^{a13}, R^{a23}, R^{a33}, R^{a43}, R^{a53}, R^{a63}, R^{a73}, R^{a83},$ or $R^{a93}$ | —H | —H | —H |
| $R^{a4}, R^{a14}, R^{a24}, R^{a34}, R^{a44}, R^{a54}, R^{a64}, R^{a74}, R^{a84},$ or $R^{a94}$ | -Propyl-iso | -Propyl-iso | -Propyl-iso |
| $R^{a5}, R^{a15}, R^{a25}, R^{a35}, R^{a45}, R^{a55}, R^{a65}, R^{a75}, R^{a85},$ or $R^{a95}$ | —H | —H | —H |
| $R^{a6}, R^{a16}, R^{a26}, R^{a36}, R^{a46}, R^{a56}, R^{a66}, R^{a76}, R^{a86},$ or $R^{a96}$ | —H | —H | —H |

TABLE 11-continued

| Chemical Formula | A1~A10 | A1~A10 | A1~A10 |
|---|---|---|---|
| $Z^{a1}, Z^{a11}, Z^{a21}, Z^{a31}, Z^{a41}, Z^{a51}, Z^{a61}, Z^{a71}, Z^{a81},$ or $Z^{a91}$ | 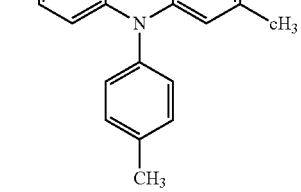 | 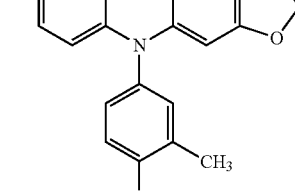 | 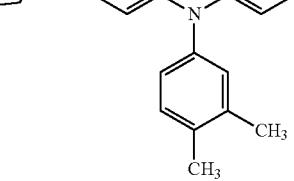 |
| $Z^{a2}, Z^{a12}, Z^{a22}, Z^{a32}, Z^{a42}, Z^{a52}, Z^{a62}, Z^{a72}, Z^{a82},$ or $Z^{a92}$ | 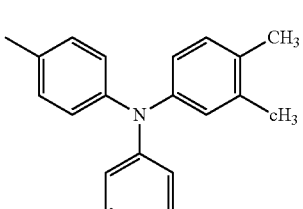 | 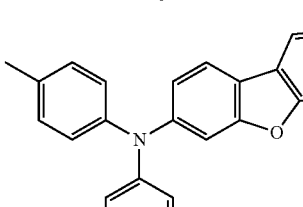 | 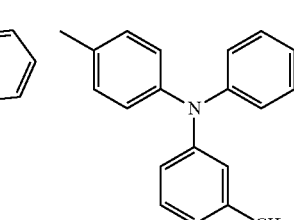 |
| $S^{a1}, S^{a11}, S^{a21}, S^{a31}, S^{a41}, S^{a51}, S^{a61}, S^{a71}, S^{a81},$ or $S^{a91}$ | —$CH_3$ | -Propyl-iso | —$CH_3$ |
| $S^{a2}, S^{a12}, S^{a22}, S^{a32}, S^{a42}, S^{a52}, S^{a62}, S^{a72}, S^{a82},$ or $S^{a92}$ | —H | —H | —H |
| $R^{a1}, R^{a11}, R^{a21}, R^{a31}, R^{a41}, R^{a51}, R^{a61}, R^{a71}, R^{a81},$ or $R^{a91}$ | —H | —H | —H |
| $R^{a2}, R^{a12}, R^{a22}, R^{a32}, R^{a42}, R^{a52}, R^{a62}, R^{a72}, R^{a82},$ or $R^{a92}$ | —H | —H | —H |
| $R^{a3}, R^{a13}, R^{a23}, R^{a33}, R^{a43}, R^{a53}, R^{a63}, R^{a73}, R^{a83},$ or $R^{a93}$ | —H | —H | —H |
| $R^{a4}, R^{a14}, R^{a24}, R^{a34}, R^{a44}, R^{a54}, R^{a64}, R^{a74}, R^{a84},$ or $R^{a94}$ | -Propyl-iso | —$CH_3$ | —H |
| $R^{a5}, R^{a15}, R^{a25}, R^{a35}, R^{a45}, R^{a55}, R^{a65}, R^{a75}, R^{a85},$ or $R^{a95}$ | —H | —H | —H |
| $R^{a6}, R^{a16}, R^{a26}, R^{a36}, R^{a46}, R^{a56}, R^{a66}, R^{a76}, R^{a86},$ or $R^{a96}$ | —H | —H | —H |

Groups which the luminescent-layer material of the invention may possess in the structure thereof are shown in the following structural-formula group C.

<Structural-Formula Group C>

[Chem. 26]

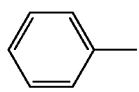 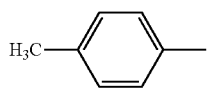 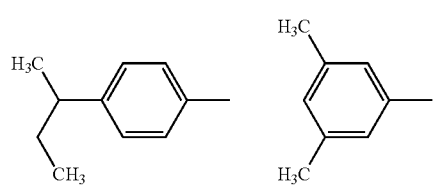

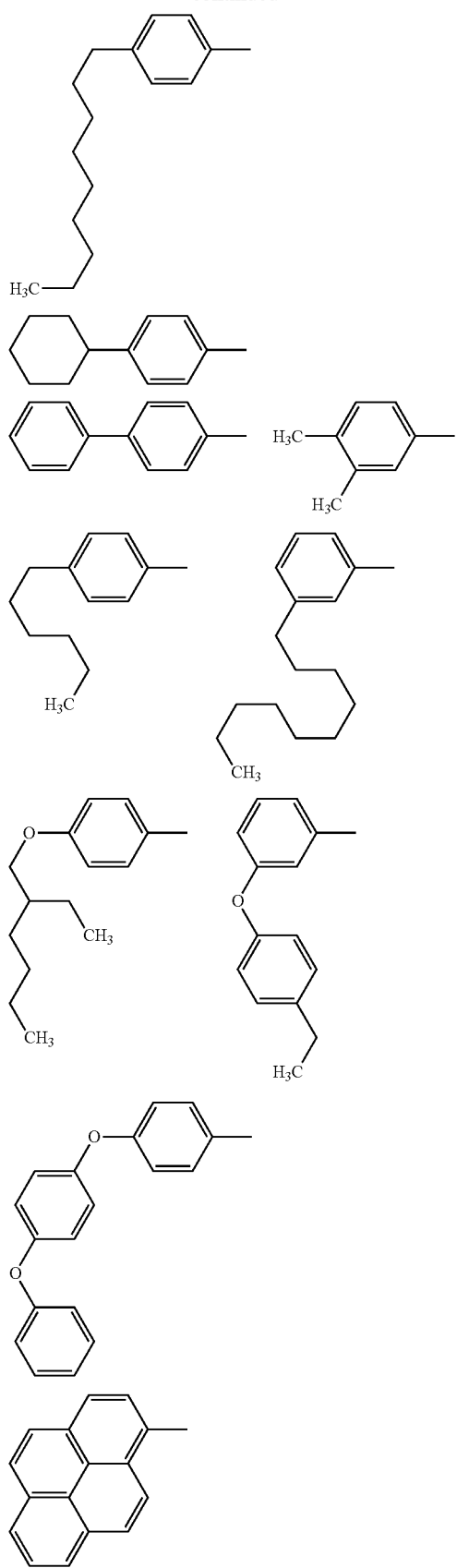
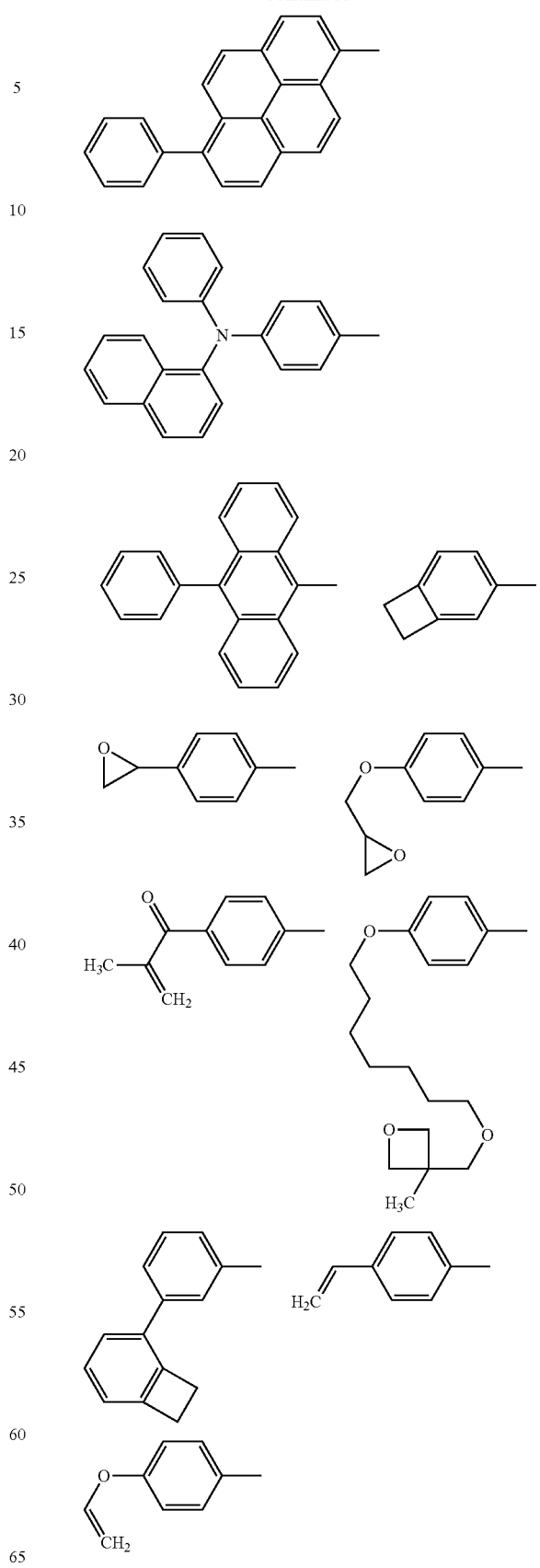

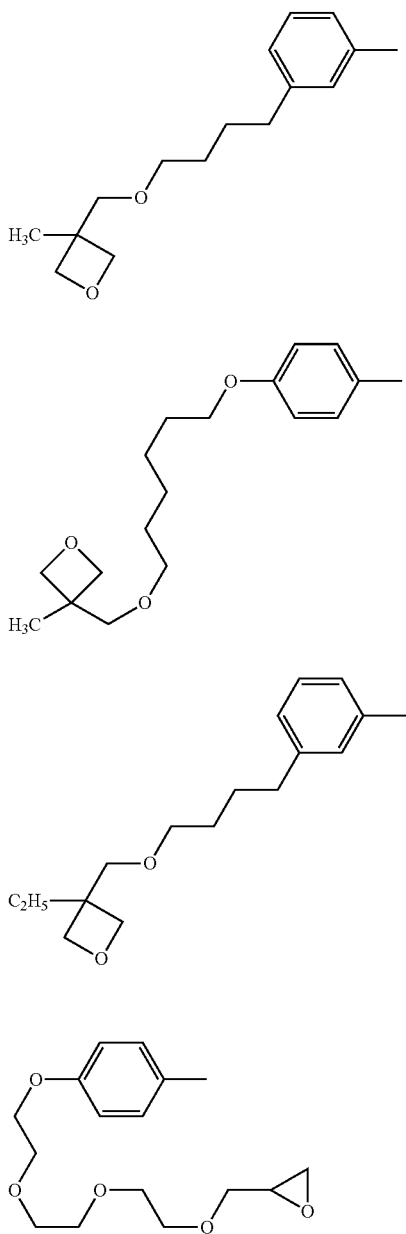

[Methods for Synthesizing the Luminescent-Layer Material (Low-Molecular Compound)]

The luminescent-layer material (low-molecular compound) described above can be synthesized by selecting starting materials according to the structure of the target compound and using a known technique. For example, the luminescent-layer material can be synthesized by the following methods. However, methods for synthesizing the material should not be construed as being limited to the following.

As shown by the following scheme 1 or scheme 2, a diene compound and an acetylene or quinone compound are subjected to addition reaction. Thus, a target low-molecular compound which has a thermally dissociable and soluble group having an etheno structure can be synthesized.

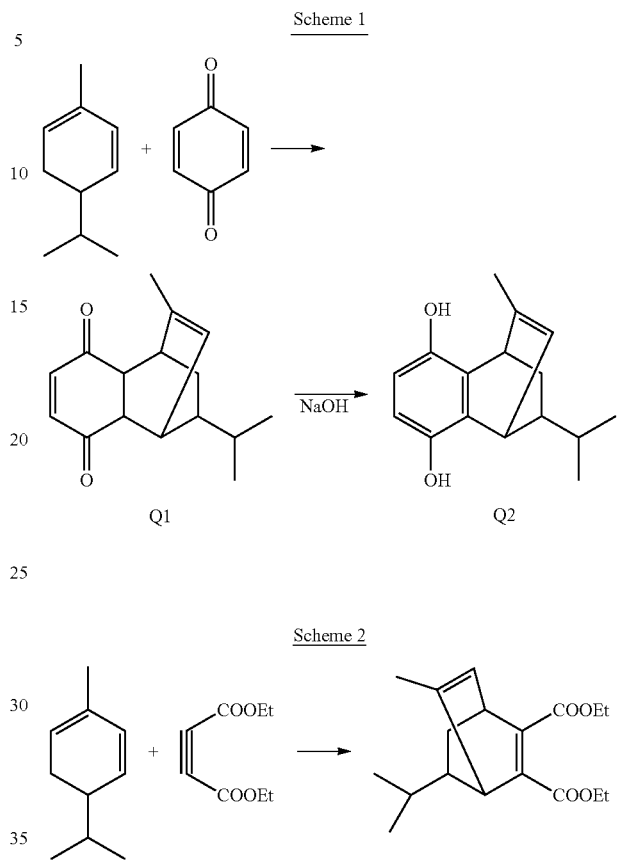

It is preferred that in the synthesis by the method shown above, a diene compound (DDI) should be reacted with a quinone compound (EEI) in a protic solvent such as water or an alcoholic solvent, e.g., methanol, ethanol, or propanol, preferably in an aqueous solution containing ethanol in an amount of 5-50% by weight, because the amount of by-products yielded in this addition reaction is small and the target product is obtained in high yield.

[Chem. 28]

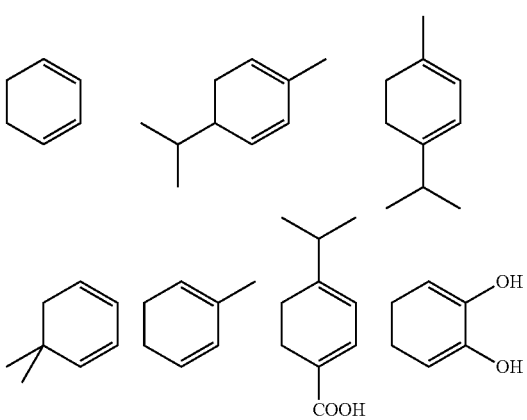

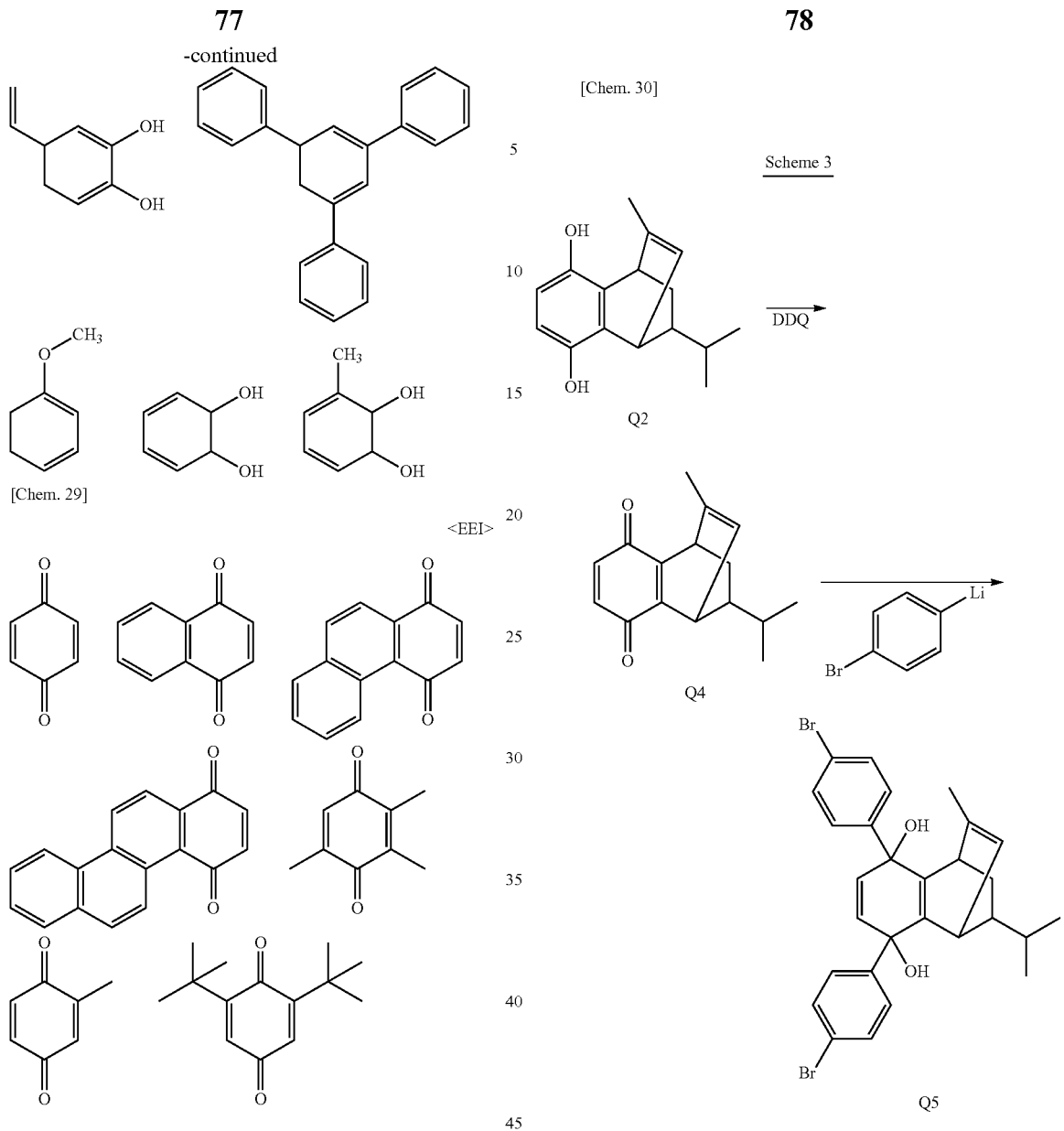

Meanwhile, a dibromo form of a compound having a thermally dissociable and soluble group of the ethano group type is obtained through the reactions shown by the following scheme 3 and scheme 4. The dihydroxy form (Q2) of a compound having a thermally dissociable and soluble group of the etheno type, which was obtained according to scheme 1, is converted to a quinone with 2,3-dichloro-5,6-dicyano-p-benzoquinone (DDQ), and p-bromophenyl groups are introduced into the resultant quinone (Q4) to obtain a dihydroxy form (Q5) (scheme 3).

Furthermore, the dihydroxy form (Q5) is reacted with an aqueous hydrogen iodide solution to thereby obtain a dibromo form (Q6) of a compound having a thermally dissociable and soluble group of the hydroxy-substituted ethano group type.

Moreover, substituents having various functions can be introduced by reacting the hydroxyl group present on the ethano group with any of compounds which have various functional groups and react with the hydroxyl group. Thus, a target compound (Q7) can be obtained (scheme 4).

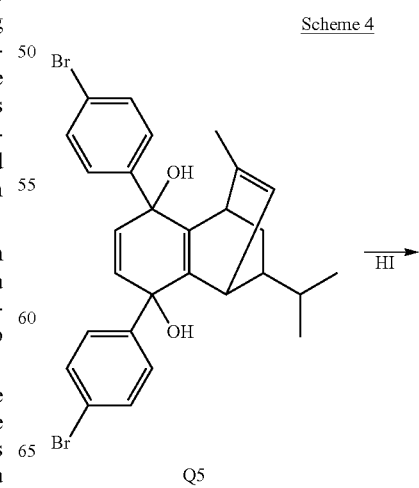

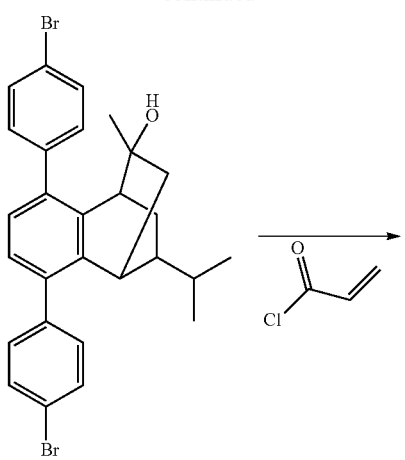

Q6

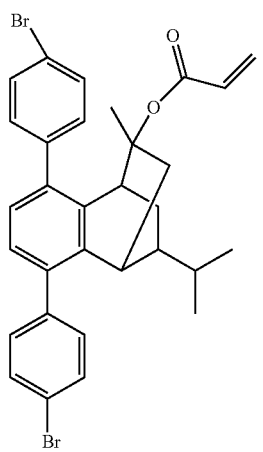

Q7

Furthermore, a diamino form of a compound having a thermally dissociable and soluble group of the etheno group type is synthesized by introducing p-amidophenyl groups into the dihydroxy form (Q2) of a compound having a thermally dissociable and soluble group of the etheno group type, which was obtained according to scheme 1, to obtain a compound (Q8) and aminating the amido groups with potassium hydroxide, as shown by scheme 5.

[Chem. 31]

Scheme 5

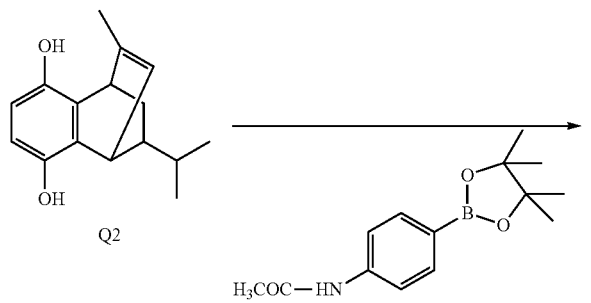

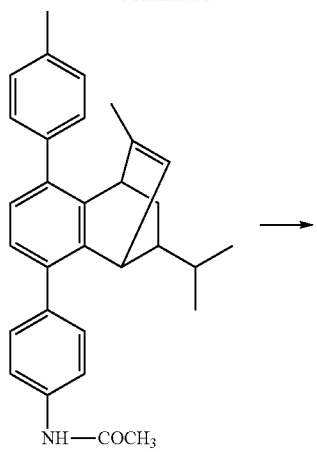

Q8

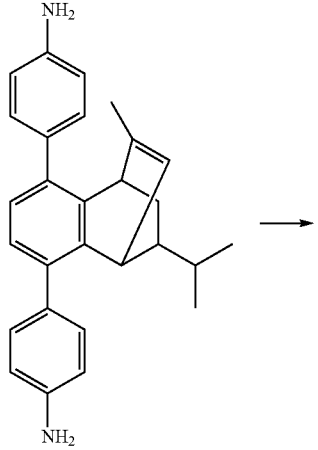

Q9

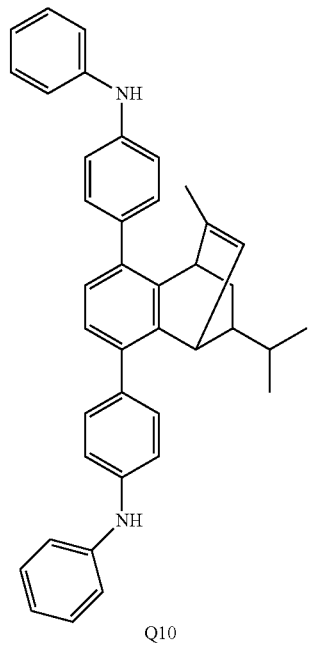 [SMILES: CC1=CC2c3c(-c4ccc(Nc5ccccc5)cc4)ccc(-c4ccc(Nc5ccccc5)cc4)c3C1CC2C(C)C ; "Q10"]

Q10

The low-molecular compound also can be synthesized using known coupling techniques, such as the reaction for forming an N—Ar bond and the reaction for forming an Ar—Ar bond which were explained in the section "Polymer".

Methods for synthesizing compounds each having a single molecular weight through a reaction for forming an N—Ar bond or a reaction for forming an Ar—Ar bond are shown below.

[Chem. 32]

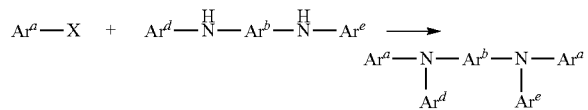

(In the formulae, X represents a halogen atom or a sulfonic ester group, e.g., a $CF_3SO_2O$— group. $Ar^a$, $Ar^d$, and $Ar^e$ each independently represent an aromatic hydrocarbon ring group which may have a substituent or an aromatic heterocyclic group which may have a substituent, and $Ar^b$ represents a divalent aromatic hydrocarbon ring group which may have a substituent or a divalent aromatic heterocyclic group which may have a substituent. At least one of $Ar^a$, $Ar^b$, $Ar^d$, and $Ar^e$ has a partial structure in which a thermally dissociable and soluble group has been bonded, and at least one of $Ar^a$, $Ar^b$, $Ar^d$, and $Ar^e$ may have a crosslinkable group.)

[Chem. 33]

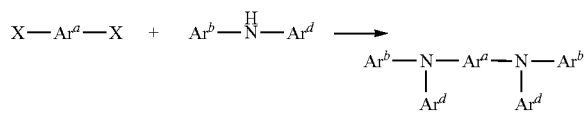

(In the formulae, X represents a halogen atom or a sulfonic ester group, e.g., a $CF_3SO_2O$— group. $Ar^b$ and $Ar^d$ each independently represent an aromatic hydrocarbon ring group which may have a substituent or an aromatic heterocyclic group which may have a substituent, and $Ar^a$ represents a divalent aromatic hydrocarbon ring group which may have a substituent or a divalent aromatic heterocyclic group which may have a substituent.

At least one of $Ar^a$, $Ar^b$, and $Ar^d$ has a partial structure in which a thermally dissociable and soluble group has been bonded, and these groups may have a crosslinkable group.)

[Chem. 34]

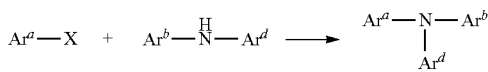

(In the formulae, X represents a halogen atom or a sulfonic ester group, e.g., a $CF_3SO_2O$— group. $Ar^a$, $Ar^b$, and $Ar^d$ each independently represent an aromatic hydrocarbon ring group which may have a substituent or an aromatic heterocyclic group which may have a substituent.

At least one of $Ar^a$, $Ar^b$, and $Ar^d$ has a partial structure in which a thermally dissociable and soluble group has been bonded, and these groups may have a crosslinkable group.)

$$Ar^a—X+R'_2B—Ar^c—BR'_2 \rightarrow Ar^a—Ar^c—Ar^a \quad \text{[Chem. 35]}$$

(In the formulae, X represents a halogen atom or a sulfonic ester group, e.g., a $CF_3SO_2O$— group, and R's each represent a hydroxy group or R's represent alkoxy groups which may be bonded to each other to form a ring. $Ar^a$ represents an aromatic hydrocarbon ring group which may have a substituent or an aromatic heterocyclic group which may have a substituent, and $Ar^c$ represents a divalent aromatic hydrocarbon ring group which may have a substituent or a divalent aromatic heterocyclic group which may have a substituent.

At least $Ar^a$ or $Ar^c$ has a partial structure in which a thermally dissociable and soluble group has been bonded, and these groups may have a crosslinkable group.)

$$X—Ar^a—X+Ar^c—BR'_2 \rightarrow Ar^c—Ar^a—Ar^c \quad \text{[Chem. 36]}$$

(In the formulae, X represents a halogen atom or a sulfonic ester group, e.g., a $CF_3SO_2O$— group, and R's each represent a hydroxy group or R's represent alkoxy groups which may be bonded to each other to form a ring. $Ar^c$ represents an aromatic hydrocarbon ring group which may have a substituent or an aromatic heterocyclic group which may have a substituent, and $Ar^a$ represents a divalent aromatic hydrocarbon ring group which may have a substituent or a divalent aromatic heterocyclic group which may have a substituent.

At least $Ar^a$ or $Ar^c$ has a partial structure in which a thermally dissociable and soluble group has been bonded, and these groups may have a crosslinkable group.)

$$Ar^a—X+Ar^c—BR'_2 \rightarrow Ar^aAr^c \quad \text{[Chem. 37]}$$

(In the formulae, X represents a halogen atom or a sulfonic ester group, e.g., a $CF_3SO_2O$— group, and R's each represent a hydroxy group or R's represent alkoxy groups which may be bonded to each other to form a ring. $Ar^a$ and $Ar^c$ each independently represent an aromatic hydrocarbon ring group which may have a substituent or an aromatic heterocyclic group which may have a substituent. At least $Ar^a$ or $Ar^c$ has a partial structure in which a thermally dissociable and soluble group has been bonded, and these groups may have a crosslinkable group.)

[Reasons for being Luminescent-Layer Material Including Low-Molecular Compound]

Compared to other layers, a luminescent layer has a high possibility that impurities present in slight amounts might serve as a quencher or disturb a charge balance, resulting in a decrease in luminescent efficiency. It is therefore necessary to highly purify the luminescent-layer material as compared with other layers.

It is preferred that the luminescent-layer material should be a low-molecular compound because a low-molecular compound has a single molecular weight to facilitate purity determination, is free from the possibility that fluctuations of molecular weight distribution might lead to fluctuations of element performance, and has no end group.

Materials having a high luminescent efficiency usually have high symmetry, have poor solubility in organic solvents, and are difficult to highly purify. Possession of a thermally dissociable and soluble group enables such a material having a high luminescent efficiency to have improved solubility and be highly purified with ease.

[Composition B for Organic Electroluminescence Elements]

The composition B for organic electroluminescence elements of the invention includes at least the luminescent-layer material and a solvent.

Luminescent materials (dopant materials) are most required to have a high purity. It is therefore preferred that the composition B for organic electroluminescence elements of the invention should include, as a luminescent material (dopant material), a material having a thermally dissociable and soluble group.

The amount of the luminescent material to be contained in the composition B for organic electroluminescence elements is generally 0.5 parts by weight or more, preferably 1 part by weight or more, and is generally 50 parts by weight or less, preferably 10 parts by weight or less. By regulating the amount thereof so as to be within that range, the effects of improving luminescent efficiency and reducing element voltage are obtained. The luminescent material of one kind only may be contained in the composition B, or a combination of two or more such luminescent materials may be contained therein.

The solvent to be contained in the composition B for organic electroluminescence elements is a volatile liquid ingredient which is used in order to form, through wet film formation, a layer including the luminescent material.

The solvent is not particularly limited so long as the solutes satisfactorily dissolve therein. However, the following examples are preferred.

Examples thereof include alkanes such as n-decane, cyclohexane, ethylcyclohexane, decalin, and bicyclohexane; aromatic hydrocarbons such as toluene, xylene, metysilene, cyclohexylbenzene, and tetralin; halogenated aromatic hydrocarbons such as chlorobenzene, dichlorobenzene, and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic esters such as phenyl acetate, phenyl propionate, methyl benzoate, ethyl benzoate, ethyl benzoate, propyl benzoate, and n-butyl benzoate; alicyclic ketones such as cyclohexanone, cyclooctanone, and fenchone; alicyclic alcohols such as cyclohexanol and cyclooctanol; aliphatic ketones such as methyl ethyl ketone and dibutyl ketone; aliphatic alcohols such as butanol and hexanol; and aliphatic ethers such as ethylene glycol dimethyl ether, ethylene glycol diethyl ether, and propylene glycol 1-monomethyl ether acetate (PGMEA).

Preferred of these are alkanes and aromatic hydrocarbons. One of these solvents may be used alone, or two or more thereof may be used in any desired combination and proportion.

From the standpoint of obtaining a more even film, it is preferred that the solvent should vaporize at an appropriate rate from the liquid film just after application. Consequently, the boiling point of the solvent is generally 80° C. or higher, preferably 100° C. or higher, more preferably 120° C. or higher, and is generally 270° C. or lower, preferably 250° C. or lower, more preferably 230° C. or lower.

The amount of the solvent to be used per 100 parts by weight of the composition B for organic electroluminescence elements is preferably 10 parts by weight or more, more preferably 50 parts by weight or more, especially preferably 80 parts by weight or more, and is preferably 99.95 parts by weight or smaller, more preferably 99.9 parts by weight or smaller, especially preferably 99.8 parts by weight or smaller. In case where the content thereof is lower than the lower limit, there is a possibility that the composition might have too high viscosity and have reduced applicability in film formation. On the other hand, in case where the content thereof exceeds the upper limit, there is a tendency that a film having a sufficient thickness is not obtained through application and subsequent solvent removal, making it difficult to form a film.

A charge-transporting compound for use in organic electroluminescence elements, in particular, luminescent layers, can be incorporated into the composition B for organic electroluminescence elements of the invention besides the luminescent material of the invention and a solvent.

In the case where the composition B for organic electroluminescence elements of the invention is to be used for forming a luminescent layer, the composition B may contain the luminescent-layer material of the invention as a dopant material and further contain another charge-transporting compound as a host material.

As the other charge-transporting compound, use can be made of compounds which have conventionally been used as materials for organic electroluminescence elements. Examples thereof include naphthalene, perylene, anthracene, pyrene, triphenylene, chrysene, naphthacene, phenanthrene, coronene, fluoranthene, benzophenanthrene, fluorene, acetonaphthofluoranthene, coumarin, p-bis(2-phenylethenyl)benzene, derivatives of these, quinacridone derivatives, DCM (4-(dicyanomethylene)-2-methyl-6-(p-dimethylaminostyryl)-4H-pyran) type compounds, benzopyran derivatives, Rhodamine derivatives, benzothioxanthene derivatives, azabenzothioxanthene, fused aromatic ring compounds substituted with an arylamino group, and styryl derivatives substituted with an arylamino group.

The amount of the other charge-transporting compound per 100 parts by weight of the composition B is generally 1 part by weight or more and is generally 50 parts by weight or less, preferably 30 parts by weight or less.

The composition B for organic electroluminescence elements may further contain other compounds according to need besides the compounds and the like described above. For example, the composition B may contain a solvent besides the solvent described above. Examples of such solvent include amides, such as N,N-dimethylformamide and N,N-dimethylacetamide, and dimethyl sulfoxide. One of these may be used alone, or two or more thereof may be used in any desired combination and proportion.

Furthermore, various additives including a leveling agent and a defoamer may be incorporated for the purpose of improving film-forming properties.

(Formation of Organic Layer Using Composition B for Organic Electroluminescence Elements)

An organic layer may be formed from the composition B for organic electroluminescence elements using the same techniques as described above in the section "Formation of Organic Layer Using Composition A for Organic electroluminescence elements". Preferred embodiments of the film formation are also the same.

C. Material for Organic Electroluminescence Elements

The material for organic electroluminescence elements of the invention may be a compound which has an aromatic hydrocarbon ring or an aromatic heterocycle in the molecule, and which is obtained by heating a compound having a partial structure that includes the aromatic hydrocarbon ring or the aromatic heterocycle, a hydrocarbon ring fused thereto, and a thermally dissociable and soluble group bonded to the hydrocarbon ring.

The material for organic electroluminescence elements can be one having a structure obtained by heating the polymer or luminescent-layer material explained above. Specifically, the material for organic electroluminescence elements can, for example, be one having a structure obtained by dissociating the thermally dissociable and soluble group(s) from the polymer or luminescent-layer material (low-molecular compound) described above.

The heating may be conducted at a temperature which is generally 70° C. or higher, preferably 100° C. or higher, and is preferably 300° C. or lower.

D. Organic Electroluminescence Element

The organic electroluminescence element of the invention includes an anode, a cathode, and an organic layer disposed between the anode and the cathode, and is characterized in that the organic layer is a layer formed from the composition for organic electroluminescence elements described above by a wet film-forming method. It is especially preferred in the invention that a hole injection layer, a hole transport layer, or a luminescent layer, among organic layers, should be formed from the composition for organic electroluminescence elements by a wet film-forming method.

It is especially preferred that the layer formed from the composition A for organic electroluminescence elements of the invention by a wet film-forming method should be a hole injection layer or a hole transport layer.

Furthermore, it is preferred that the layer formed from the composition B for organic electroluminescence elements of the invention by a wet film-forming method should be a luminescent layer.

<Configuration of Organic Electroluminescence Element>

The layer configuration of the organic electroluminescence element of the invention, methods for forming the element, etc. are explained below by reference to FIG. 1.

FIG. 1 is a diagrammatic view of a section showing an example of the structure of an organic electroluminescence element according to the invention. In FIG. 1, numeral 1 denotes a substrate, 2 an anode, 3 a hole injection layer, 4 a hole transport layer, 5 a luminescent layer, 6 a hole blocking layer, 7 an electron transport layer, 8 an electron injection layer, and 9 a cathode.

(Substrate)

The substrate 1 serves as the support of the organic electroluminescence element, and use may be made, for example, of a plate of quartz or glass, a metal plate, a metal foil, a plastic film or sheet, or the like. One of these may be used alone, or any desired combination of two or more thereof may be used. Especially preferred of these are a glass plate and a plate of a transparent synthetic resin such as a polyester, polymethacrylate, polycarbonate, or polysulfone. In the case of using a synthetic-resin substrate, it is necessary to take account of gas barrier properties. In case where the substrate 1 has too low gas barrier properties, there is a possibility that the surrounding air might pass through the substrate 1 to deteriorate the organic electroluminescence element. Too low gas barrier properties are hence undesirable. Consequently, one of preferred methods is to form a dense silicon oxide film on at least one surface of a synthetic-resin substrate to ensure gas barrier properties.

(Anode)

The anode 2 has the function of injecting holes into layers located on the luminescent layer 5 side.

This anode 2 is usually constituted of a metal, e.g., aluminum, gold, silver, nickel, palladium, or platinum, a metal oxide, e.g., an indium and/or tin oxide, a metal halide, e.g., copper iodide, carbon black, a conductive polymer, e.g., poly(3-methylthiophene), polypyrrole, or polyaniline, or the like. One of these may be used alone, or two or more thereof may be used in any desired combination and proportion.

Usually, the anode 2 is frequently formed by sputtering, vacuum deposition, or the like. In the case where an anode 2 is to be formed using fine particles of a metal, e.g., silver, fine particles of copper iodide or the like, carbon black, fine particles of a conductive metal oxide, fine particles of a conductive polymer, or the like, use may be made of a method in which such fine particles are dispersed in an appropriate binder resin solution and the dispersion is applied to a substrate 1 to form an anode 2. Furthermore, in the case of a conductive polymer, an anode 2 can be formed by directly forming a thin film on a substrate 1 through electrolytic polymerization or by applying the conductive polymer to a substrate 1 (*Appl. Phys. Lett.*, Vol. 60, p. 2711, 1992).

The anode 2 usually has a single-layer structure. However, the anode 2 can have a multilayer structure composed of a plurality of materials, according to need.

The thickness of the anode 2 varies depending on the degree of transparency required. When transparency is required, it is preferred that the anode 2 should be regulated so as to have a visible-light transmittance of generally 60% or higher, preferably 80% or higher. In this case, the thickness of the anode 2 is generally 5 nm or more, preferably 10 nm or more, and is generally 1,000 nm or less, preferably about 500 nm or less. When the anode 2 may be opaque, this anode 2 can have any desired thickness and may be identical with the substrate 1. Furthermore, it is possible to superpose a different conductive material on the anode 2.

It is preferred that the surface of the anode 2 should be subjected to an ultraviolet (UV)/ozone treatment or a treatment with an oxygen plasma or argon plasma for the purposes of removing impurities adherent to the anode 2 and regulating ionization potential to improve hole injection properties.

(Hole Injection Layer)

The hole injection layer 3 is a layer which transports holes from the anode 2 to the luminescent layer 5, and is usually formed on the anode 2.

Methods for forming the hole injection layer 3 according to the invention are not particularly limited, and either vacuum deposition or a wet film-forming method may be used. However, from the standpoint of diminishing dark spots, it is preferred to form the hole injection layer 3 by a wet film-forming method. In this case, it is preferred to use the composition A for organic electroluminescence elements described above.

The thickness of the hole injection layer 3 is generally 5 nm or more, preferably 10 nm or more, and is generally 1,000 nm or less, preferably 500 nm or less.

<Formation of Hole Injection Layer by Wet Film-Forming Method>

In the case where a hole injection layer 3 is to be formed through wet film formation, the hole injection layer 3 is formed usually by mixing materials for constituting the hole injection layer 3 with an appropriate solvent (solvent for hole injection layer) to prepare a composition for film formation (composition for hole injection layer formation), applying this composition for hole injection layer formation by a suitable technique to the layer (usually, the anode) which is to underlie the hole injection layer 3, and then drying the resultant coating film.

(Hole-Transporting Compound)

The composition for hole injection layer formation usually contains a hole-transporting compound, as a material for constituting the hole injection layer, and a solvent.

The hole-transporting compound may usually be a high-molecular compound or a low-molecular compound so long as the compound has hole-transporting properties and is for use in the hole injection layers of organic electroluminescence elements. In the invention, the polymer of the invention described above can be used as the hole-transporting compound.

From the standpoint of a barrier to charge injection from the anode 2 into the hole injection layer 3, it is preferred that the hole-transporting compound should be a compound having an ionization potential of 4.5 eV to 6.0 eV. Other examples of the hole-transporting compound include aromatic amine compounds, phthalocyanine derivatives, porphyrin derivatives, oligothiophene derivatives, polythiophene derivatives, benzylphenyl compounds, compounds including a tertiary amine connected with a fluorene group, hydrazone compounds, silazane compounds, silanamine derivatives, phosphamine derivatives, and quinacridone compounds.

Any one of such hole-transporting compounds may be contained alone as a material for the hole injection layer 3, or two or more thereof may be contained as the material. In the case where two or more hole-transporting compounds are contained, any desired combination of such compounds may be used. However, it is preferred to use one or more aromatic tertiary amine high-molecular compounds in combination with one or more other hole-transporting compounds.

Of the compounds shown above as examples, aromatic amine compounds are preferred from the standpoints of non-crystallinity and visible-light transmittance. In particular, aromatic tertiary amine compounds are preferred. The term aromatic tertiary amine compound means a compound having an aromatic tertiary amine structure, and includes a compound having a group derived from an aromatic tertiary amine.

The kind of aromatic tertiary amine compound is not particularly limited. However, a high-molecular compound (polymeric compound made up of consecutive repeating units) having a weight-average molecular weight of 1,000-1,000,000 is more preferred from the standpoint of even luminescence based on the effect of surface smoothing. Preferred examples of the aromatic tertiary amine high-molecular compounds include high-molecular compounds having a repeating unit represented by the following formula (I).

[Chem. 38]

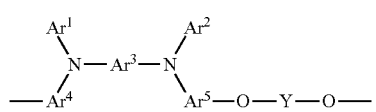

(In formula (I), $Ar^1$ and $Ar^2$ each independently represent a monovalent aromatic hydrocarbon ring group which may have a substituent or a monovalent aromatic heterocyclic group which may have a substituent. $Ar^3$ to $Ar^5$ each independently represent a divalent aromatic hydrocarbon ring group which may have a substituent or a divalent aromatic heterocyclic group which may have a substituent. Y represents a linking group selected from the following linking groups. Of $Ar^1$ to $Ar^5$, two groups bonded to the same nitrogen atom may be bonded to each other to form a ring.)

[Chem. 39]

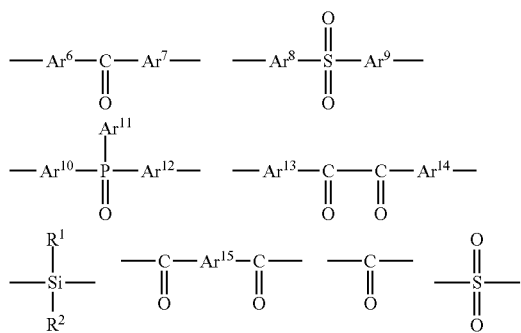

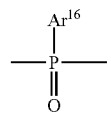

(In the formulae, $Ar^6$ to $Ar^{16}$ each independently represent an aromatic hydrocarbon ring group which may have a substituent or an aromatic heterocyclic group which may have a substituent. $Ar^6$ to $Ar^{10}$ and $Ar^{12}$ to $Ar^{15}$ each represent a divalent group, and $Ar^{11}$ and $Ar^{16}$ each represent a monovalent group. $R^1$ and $R^2$ each independently represent a hydrogen atom or any desired monovalent substituent.)

The aromatic hydrocarbon ring groups and aromatic heterocyclic groups represented by $Ar^1$ to $Ar^{16}$ preferably are groups derived from a benzene ring, naphthalene ring, phenanthrene ring, thiophene ring, or pyridine ring, from the standpoints of the solubility, heat resistance, and suitability for hole injection and transport of the high-molecular compound. More preferred are groups derived from a benzene ring or a naphthalene ring.

The aromatic hydrocarbon ring groups and aromatic heterocyclic groups represented by $Ar^1$ to $Ar^{16}$ may have substituents. It is preferred that the molecular weights of the substituents should be generally about 400 or lower, in particular, about 250 or lower. Preferred examples of the substituents are alkyl groups, alkenyl groups, alkoxy groups, aromatic hydrocarbon ring groups, aromatic heterocyclic groups, and the like.

In the case where $R^1$ and $R^2$ are any desired substituents, examples of the substituents include alkyl groups, alkenyl groups, alkoxy groups, silyl group, siloxy group, aromatic hydrocarbon ring groups, and aromatic heterocyclic groups.

Specific examples of the aromatic tertiary amine high-molecular compounds having a repeating unit represented by formula (I) include the compounds described in International Publication No. 2005/089024, pamphlet.

The concentration of the hole-transporting compound in the composition for hole injection layer formation is not limited unless the effects of the invention are lessened. However, from the standpoint of the evenness of film thickness, the concentration thereof is generally 0.01% by weight or higher, preferably 0.1% by weight or higher, more preferably 0.5% by weight or higher, and is generally 70% by weight or lower, preferably 60% by weight or lower, more preferably 50% by weight or lower. In case where the concentration thereof is too high, there is a possibility that unevenness of film thickness might result. In case where the concentration thereof is too low, there is a possibility that the resultant hole injection layer might have defects.

(Electron-Accepting Compound)

It is preferred that the composition for hole injection layer formation should contain an electron-accepting compound as a constituent material for the hole injection layer 3.

The electron-accepting compound preferably is a compound which has oxidizing ability and has the ability to accept one electron from the hole-transporting compound described above. Specifically, compounds having an electron affinity of 4 eV or higher are preferred, and compounds having an electron affinity of 5 eV or higher are more preferred.

Examples of such electron-accepting compounds include one or more compounds selected from the group consisting of triarylboron compounds, metal halides, Lewis acids, organic acids, onium salts, salts of an arylamine with a metal halide, and salts of an arylamine with a Lewis acid. More specifically, examples thereof include onium salts substituted with organic groups, such as 4-isopropyl-4'-methyldiphenyliodonium tetrakis(pendafluorophenyl)borate and triphenylsulfonium tetrafluoroborate (International Publication No. 2005/089024, pamphlet); inorganic compounds having a high valence, such as iron(III) chloride (JP-A-11-251067) and ammonium peroxodisulfate; cyano compounds such as tetracyanoethylene; aromatic boron compounds such as tris(pendafluorophenyl)boran (JP-A-2003-31365); fullerene derivatives; and iodine.

These electron-accepting compounds oxidize the hole-transporting compound and can thereby improve the conductivity of the hole injection layer 3.

In the hole injection layer 3 or in the composition for hole injection layer formation, the content of the electron-accepting compound is generally 0.1% by mole or higher, preferably 1% by mole or higher, based on the hole-transporting compound. However, the content thereof is generally 100% by mole or lower, preferably 40% by mole or lower.

(Other Constituent Materials)

Besides the hole-transporting compound and electron-accepting compound described above, other ingredients may be incorporated as materials for the hole injection layer 3 unless the incorporation thereof considerably lessens the effects of the invention. Examples of the other ingredients include various luminescent materials, electron-transporting compounds, binder resins, and applicability improvers. One of such other ingredients may be used alone, or two or more thereof may be used in any desired combination and proportion.

(Solvent)

It is preferred that the solvent contained in the composition for use in hole injection layer formation by a wet film-forming method should include at least one compound in which the constituent materials for the hole injection layer described above can dissolve. It is also preferred that the boiling point of the solvent should be generally 110° C. or higher, preferably 140° C. or higher, more preferably 200° C. or higher, and be generally 400° C. or lower, in particular 300° C. or lower. In case where the boiling point of the solvent is too low, there is a possibility that the composition might dry at too high a rate, resulting in impaired film quality. In case where the boiling point of the solvent is too high, it is necessary to use a higher temperature in the drying step and this may adversely affect other layers or the substrate.

Examples of the solvent include ether solvents, ester solvents, aromatic hydrocarbon solvents, and amide solvents.

Examples of the ether solvents include aliphatic ethers such as ethylene glycol dimethyl ether, ethylene glycol diethyl ether, and propylene glycol 1-monomethyl ether acetate (PGMEA); and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of the ester solvents include aromatic esters such as phenyl acetate, phenyl propionate, methyl benzoate, ethyl benzoate, propyl benzoate, and n-butyl benzoate.

Examples of the aromatic hydrocarbon solvents include toluene, xylene, cyclohexylbenzene, 3-iropropylbiphenyl, 1,2,3,4-tetramethylbenzene, 1,4-diisopropylbenzene, cyclohexylbenzene, and methylnaphthalene.

Examples of the amide solvents include N,N-dimethylformamide and N,N-dimethylacetamide.

Furthermore, dimethyl sulfoxide and the like are also usable.

One of these solvents may be used alone, or two or more thereof may be used in any desired combination and proportion.

(Methods of Film Formation)

After the composition for hole injection layer formation has been prepared, this composition is applied, by wet film formation, to the layer (usually, the anode 2) which is to underlie the hole injection layer 3, and the resultant coating film is dried. Thus, a hole injection layer 3 is formed.

The temperature to be used in the film formation step is preferably 10° C. or higher and is preferably 50° C. or lower, from the standpoint of preventing crystals from generating in the composition and thereby causing film defects.

The relative humidity in the film formation step is not limited unless the effects of the invention are considerably lessened. However, the relative humidity is generally 0.01 ppm or higher and is generally 80% or less.

After the film formation, the film of the composition for hole injection layer formation is dried usually by heating, etc. In particular, when a hole injection layer 3 is to be formed from the composition for organic electroluminescence elements of the invention, a heating step is usually conducted. Examples of means for heating usable in the heating step include a clean oven, hot plate, infrared rays, halogen heater, and irradiation with microwaves. Of these, a clean oven and a hot plate are preferred from the standpoint of evenly heating the whole film.

With respect to heating temperature in the heating step, it is preferred to heat the film at a temperature not lower than the boiling point of the solvent used in the composition for hole injection layer formation, unless this drying considerably lessens the effects of the invention. In the case where the material for organic electroluminescence elements of the invention is contained in the hole injection layer, it is preferred to heat the film at a temperature not lower than the temperatures at which the thermally dissociable and soluble group dissociates. Furthermore, in the case where the solvent used in the composition for hole injection layer formation is a mixed solvent including two or more solvents, it is preferred to heat the film at a temperature not lower than the boiling point of at least one of the solvents. When an increase in the boiling point of solvents is taken into account, it is preferred to heat the film in the heating step at a temperature which is preferably 120° C. or higher and is preferably 410° C. or lower.

Heating period in the heating step is not limited so long as the heating temperature is not lower than the boiling point of the solvent of the composition for hole injection layer formation and the coating film is not sufficiently insolubilized. However, the heating period is preferably 10 seconds or longer, and is generally 180 minutes or shorter. In case where the drying period is too long, components of other layers tend to diffuse. In case where the drying period is too short, the resultant hole injection layer 3 tends to be inhomogeneous. Heating may be conducted two times.

<Formation of Hole Injection Layer by Vacuum Deposition>

In the case where a hole injection layer 3 is to be formed by vacuum deposition, one or more constituent materials (e.g., the hole-transporting compound and electron-accepting compound described above) for the hole injection layer 3 are placed in one or more crucibles disposed within a vacuum vessel (when two or more materials are used, the materials are placed in respective crucibles). The inside of the vacuum vessel is evacuated with an appropriate vacuum pump to about $10^{-4}$ Pa, and the crucibles are then heated (when two or more materials are used, the respective crucibles are heated) to vaporize the materials while controlling vaporization amount (when two or more materials are used, the materials are vaporized while independently controlling the amounts of the materials being vaporized) to form a hole injection layer 3 on the anode 2 of a substrate 1 placed so as to face the crucibles. Incidentally, in the case where two or more materials are used, use may be made of a method in which a mixture of these materials is placed in a crucible, heated, and vaporized to form a hole injection layer 3.

The degree of vacuum during the deposition is not limited unless the effects of the invention are considerably lessened. However, the degree of vacuum is generally $0.1 \times 10^{-6}$ Torr ($0.13 \times 10^{-4}$ Pa) or higher, and is generally $9.0 \times 10^{-6}$ Torr ($12.0 \times 10^{-4}$ Pa) or lower. The rate of deposition is not limited unless the effects of the invention are considerably lessened. However, the rate of deposition is generally 0.1 Å/sec or higher, and is generally 5.0 Å/sec or lower. Film formation temperature during the deposition is not limited unless the effects of the invention are considerably lessened. However, the deposition is conducted at a temperature which is preferably 10° C. or higher and is preferably 50° C. or lower.

[Hole Transport Layer]

Methods for forming the hole transport layer 4 according to the invention are not particularly limited, and either vacuum deposition or a wet film-forming method may be used. However, from the standpoint of diminishing dark spots, it is preferred to form the hole transport layer 4 by a wet film-forming method. In this case, it is preferred that the composition A for organic electroluminescence elements of the invention described above should be used to form the film by a wet process.

In the case where there is a hole injection layer 3, a hole transport layer 4 can be formed on the hole injection layer 3. When there is no hole injection layer 3, then a hole transport layer 4 can be formed on the anode 2. The organic electroluminescence element of the invention may have a configuration in which the hole transport layer 4 has been omitted.

For forming the hole transport layer 4, it is preferred to use a material which has high hole-transporting properties and can efficiently transport injected holes. In order for a material to have such properties, it is preferred that the material should have a low ionization potential, be highly transparent to visible light, and have a high hole mobility and excellent stability, and that impurities functioning as a trap do not generate during production of the material or during use. Furthermore, since the hole transport layer 4 is in contact with the luminescent layer 5 in many cases, it is preferred that the material constituting the hole transport layer 4 should not function to cause extinction of luminescence from the luminescent layer 5 or to form an exciplex with the luminescent layer 5 and thereby reduce efficiency.

As such a material for the hole transport layer 4, use can be made, for example, of the polymer of the invention or materials which have conventionally been used as constituent materials for hole transport layers. Examples of the materials which have conventionally been used include the hole-transporting compounds shown above as examples for use in the hole injection layer 3 described above. Examples thereof further include aromatic diamines which contain two or more tertiary amines and in which the nitrogen atoms have two or more fused aromatic rings bonded thereto as substituents, the aromatic diamines being represented by 4,4'-bis[N-(1-naphthyl)-N-phenylamino]biphenyl (JP-A-5-234681), aromatic amine compounds having a starburst structure, such as 4,4', 4''-tris(1-naphthylphenylamino)triphenylamine (*J. Lumin.*, Vol. 72-74, p. 985, 1997), the aromatic amine compound constituted of the tetramer of triphenylamine (*Chem. Commun.*, p. 2175, 1996), spiro compounds such as 2,2',7,7'-tetrakis(diphenylamino)-9,9'-spirobifluorene (*Synth. Metals*, Vol. 91, p. 209, 1997), and carbazole derivatives such as 4,4'-N,N'-dicarbazolylbiphenyl. Other examples include polyvinylcarbazole, polyvinyltriphenylamine (JP-A-7-53953), and poly(arylene ether sulfone)s containing tetraphenylbenzidine (*Polym. Adv. Tech.*, Vol. 7, p. 33, 1996).

In the case where a hole transport layer 4 is to be formed through wet film formation, a composition for hole transport layer formation is prepared and thereafter formed into a film by a wet process and dried by heated, in the same manner as in the formation of the hole injection layer 3.

Besides the hole-transporting compound described above, a solvent is contained in the composition for hole transport layer formation. The solvent to be used may be the same as that used in the composition for hole injection layer formation. Film formation conditions, heating/drying conditions, and the like may also be the same as in the formation of the hole injection layer 3. Incidentally, the composition for organic electroluminescence elements of the invention can be used as a composition for hole transport layer formation.

In the case where a hole transport layer 4 is to be formed by vacuum deposition, conditions for the deposition and other conditions may be the same as in the formation of the hole injection layer 3.

The hole transport layer 4 may contain various luminescent materials, electron-transporting compounds, binder resins, applicability improvers, etc., besides the hole-transporting compound.

The hole transport layer 4 may also be a layer formed by crosslinking a crosslinkable compound. The crosslinkable compound is a compound which has a crosslinkable group and forms a polymer through crosslinking.

Examples of the crosslinkable group include cyclic ethers such as oxetane and epoxy; unsaturated double bonds such as vinyl, trifluorovinyl, styryl, acryloyl, methacryloyl, and cinnamoyl; and benzocyclobutane.

The crosslinkable compound may be any of a monomer, an oligomer, and a polymer. One crosslikable compound may be contained alone, or two or more crosslinkable compounds may be contained in any desired combination and proportion.

Examples of the crosslinkable group include cyclic ethers such as oxetane and epoxy; unsaturated double bonds such as vinyl, trifluorovinyl, styryl, acryloyl, methacryloyl, and cinnamoyl; and benzocyclobutane.

As the crosslinkable compound, it is preferred to use a hole-transporting compound having a crosslinkable group. Examples of the hole-transporting compound include nitrogen-containing aromatic compound derivatives such as pyridine derivatives, pyrazine derivatives, pyrimidine derivatives, triazine derivatives, quinoline derivatives, phenanthroline derivatives, carbazole derivatives, phthalocyanine derivatives, and porphyrin derivatives; triphenylamine derivatives; silole derivatives; oligothiophene derivatives; fused-ring aromatic derivatives; and metal complexes. Preferred of these are: nitrogen-containing aromatic derivatives such as pyridine derivatives, pyrazine derivatives, pyrimidine derivatives, triazine derivatives, quinoline derivatives, phenanthroline derivatives, and carbazole derivatives; and triphenylamine derivatives, silole derivatives, fused-ring aromatic derivatives, metal complexes, and the like. In particular, triphenylamine derivatives are more preferred.

For forming a hole transport layer 4 through crosslinking of a crosslinkable compound, use is generally made of a method which includes dissolving or dispersing the crosslinkable compound in a solvent to prepare a composition for hole transport layer formation, forming this composition into a film by a wet process, and crosslinking the crosslinkable compound.

The composition for hole transport layer formation may contain an additive which accelerates the crosslinking reaction, besides the crosslinkable compound. Examples of the additive which accelerates the crosslinking reaction include polymerization initiators and polymerization accelerators, such as alkylphenone compounds, acylphosphine oxide compounds, metallocene compounds, oxime ester compounds, azo compounds, and onium salts; and photosensitizers such as fused-ring hydrocarbons, porphyrin compounds, and diaryl ketone compounds.

The composition may further contain an applicability improver such as a leveling agent or a defoamer, an electron-accepting compound, a binder resin, and the like.

The amount of the crosslinkable compound contained in the composition for hole transport layer formation is generally 0.01% by weight or more, preferably 0.05% by weight or more, more preferably 0.1% by weight or more, and is generally 50% by weight or less, preferably 20% by weight or less, more preferably 10% by weight or less.

The composition for hole transport layer formation which contains a crosslinkable compound in such a concentration is applied to the layer to be an underlying layer (usually, the hole injection layer 3) to form a film. Thereafter, the crosslinkable compound is crosslinked by means of heating and/or irradiation with electromagnetic energy, such as light, and thereby converted into a polymer.

Conditions including temperature and humidity for the film formation may be the same as those for the wet film formation for the hole injection layer 3.

Techniques for the heating to be conducted after the film formation are not particularly limited. Examples thereof include drying by heating and vacuum drying. Heating temperature conditions in the case of drying by heating include a temperature which is generally 120° C. or higher and is preferably 400° C. or lower.

The heating period is generally 1 minute or longer but preferably 24 hours or shorter. Although means for heating are not particularly limited, use may be made, for example, of a method in which the multilayer structure including the layer formed is put on a hot plate or heated in an oven. For example, use can be made of conditions under which the multilayer structure is heated on a hot plate at 120° C. or higher for 1 minute or longer.

In the case of the crosslinking by irradiation with electromagnetic energy such as light, examples of methods for the irradiation include a method in which an ultraviolet, visible, or infrared light source, e.g., an ultrahigh-pressure mercury lamp, high-pressure mercury lamp, halogen lamp, or infrared lamp, is used to directly illuminate the layer and a method in which a mask aligner or conveyor type illuminator that has any of those light sources built therein is used to illuminate the layer. With respect to irradiation with electromagnetic energy other than light, examples of methods therefor include a method in which an apparatus for irradiating with microwaves generated by a magnetron, i.e., the so-called electronic oven, is used for the irradiation. With respect to irradiation period, it is preferred to set conditions necessary for lowering the solubility of the film. However, the film may be irradiated for a period of generally 0.1 sec or longer but preferably 10 hours or shorter.

Heating and irradiation with electromagnetic energy, e.g., light, may be conducted alone or in combination. In the case where heating and irradiation are conducted in combination, the sequence of performing these is not particularly limited.

The thickness of the hole transport layer 4 thus formed is generally 5 nm or larger, preferably 10 nm or larger, and is generally 300 nm or smaller, preferably 100 nm or smaller.

[Luminescent Layer]

A luminescent layer 5 is disposed on the hole injection layer 3, or is disposed on the hole transport layer 4 when the hole transport layer 4 has been disposed. The luminescent layer 5 is a layer which, between the electrodes placed in an electric field, is excited by recombination of holes injected from the anode 2 with electrons injected from the cathode 9 and which thus functions as the main luminescence source.

Methods for forming the luminescent layer are not particularly limited, and either vacuum deposition or a wet film-forming method may be used. However, from the standpoint of diminishing dark spots, it is preferred to form the luminescent layer by a wet film-forming method. In this case, it is preferred that the composition B for organic electroluminescence elements of the invention described above should be used to form the film by a wet process.

<Materials for Luminescent Layer>

The luminescent layer 5 contains, as a constituent material therefor, at least a material having the property of luminescing (luminescent material), and preferably further contains a compound having the property of transporting holes (hole-transporting compound) or a compound having the property of transporting electrons (electron-transporting compound) as another constituent material. A luminescent material may be used as a dopant material, and a hole-transporting compound or electron-transporting compound or the like may be used as a host material.

As a material for the luminescent layer, it is preferred to use the luminescent-layer material of the invention because this material has high solubility and excellent film-forming properties before thermal dissociation and comes to have high heat resistance through thermal dissociation to attain excellent driving stability. The luminescent layer 5 may contain other ingredients so long as this does not considerably lessen the effects of the invention. In the case where the luminescent layer 5 is to be formed by a wet film-forming method, it is preferred to use materials each having a low molecular weight.

(Luminescent Material)

As the luminescent material, any desired known material can be applied. For example, the luminescent material may be either a fluorescent material or a phosphorescent material. However, a phosphorescent material is preferred from the standpoint of inner-quantum efficiency. Furthermore, the material for organic electroluminescence elements of the invention may be used as a luminescent material. Moreover, luminescent materials may be used in combination so that, for example, a fluorescent material is used for blue and a phosphorescent material is used for green or red.

It is preferred to reduce the symmetry or rigidity of the molecule of a luminescent material or introduce an oleophilic substituent, e.g., an alkyl group, for the purpose of improving solubility in solvents.

Examples of fluorescent colorants among luminescent materials are shown below. However, usable fluorescent colorants should not be construed as being limited to the following examples.

Examples of fluorescent colorants which give blue luminescence (blue fluorescent colorants) include naphthalene, chrysene, perylene, pyrene, anthracene, coumarin, p-bis(2-phenylethenyl)benzene, and derivatives of these.

Examples of fluorescent colorants which give green luminescence (green fluorescent colorants) include quinacridone derivatives, coumarin derivatives, and aluminum complexes such as $Al(C_9H_6NO)_3$.

Examples of fluorescent colorants which give yellow luminescence (yellow fluorescent colorants) include rubrene and perimidone derivatives.

Examples of fluorescent colorants which give red luminescence (red fluorescent colorants) include DCM (4-(dicyanomethylene)-2-methyl-6-(p-dimethylaminostyryl)-4H-pyran) type compounds, benzopyran derivatives, Rhodamine derivatives, benzothioxanthene derivatives, and azabenzothioxanthene.

Examples of phosphorescent materials include organometallic complexes containing a metal selected from Groups 7 to 11 of the long-form periodic table (hereinafter, the expression "periodic table" means the long-form periodic table unless otherwise indicated).

Preferred examples of the metal selected from Groups 7 to 11 of the periodic table include ruthenium, rhodium, palladium, silver, rhenium, osmium, iridium, platinum, and gold.

Preferred ligands of the complexes are ligands constituted of a (hetero)aryl group and pyridine, pyrazole, phenanthroline, or the like linked to the group, such as a (hetero)arylpyridine ligand and a (hetero)arylpyrazole ligand. Especially preferred are a phenylpyridine ligand and a phenylpyrazole ligand. The term (hetero)aryl means an aryl group or a heteroaryl group.

Specific examples of the phosphorescent materials include tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethylplatinum porphyrin, octaphenylplatinum porphyrin, octaethylpalladium porphyrin, and octaphenylpalladium porphyrin.

The molecular weight of the compound to be used as a luminescent material is not limited unless the effects of the invention are considerably lessened. However, the molecular weight thereof is generally 10,000 or lower, preferably 5,000 or lower, more preferably 4,000 or lower, even more preferably 3,000 or lower, and is generally 100 or higher, preferably 200 or higher, more preferably 300 or higher, even more preferably 400 or higher. When the molecular weight of the luminescent material is too low, there are cases where this luminescent material has considerably reduced heat resistance or is causative of gas generation or use of this luminescent material in film formation results in reduced film quality. There also are cases where the organic electroluminescence element suffers a morphological change due to migration, etc. On the other hand, in case where the molecular weight of the luminescent material is too high, there is a tendency that the material for organic electroluminescence elements is difficult to purify or dissolution of the material in a solvent necessitates a prolonged time period.

Any one of the luminescent materials described above may be used alone, or two or more thereof may be used in any desired combination and proportion.

The proportion of the luminescent material in the luminescent layer 5 is not limited unless the effects of the invention are considerably lessened. However, the proportion thereof is generally 0.05% by weight or more and is generally 35% by weight or less. When the amount of the luminescent material is too small, there is a possibility that unevenness of luminescence might result. When the amount thereof is too large, there is a possibility that a decrease in luminescent efficiency might result. In the case where two or more luminescent materials are used in combination, these materials are incorporated so that the total content thereof is within that range.

(Hole-Transporting Compound)

A hole-transporting compound may be contained, as a constituent material, in the luminescent layer 5. Examples of low-molecular hole-transporting compounds, among hole-transporting compounds, include aromatic diamines which contain two or more tertiary amines and in which the nitrogen atoms have two or more fused aromatic rings bonded thereto as substituents, the aromatic diamines being represented by 4,4'-bis[N-(1-naphthyl)-N-phenylamino]biphenyl (JP-A-5-234681), aromatic amine compounds having a starburst structure, such as 4,4',4"-tris(1-naphthylphenylamino)triphenylamine (*Journal of Luminescence*, Vol. 72-74, p. 985, 1997), the aromatic amine compound constituted of the tetramer of triphenylamine (*Chemical Communications*, p. 2175, 1996), spiro compounds such as 2,2',7,7'-tetrakis (diphenylamino)-9,9'-spirobifluorene (*Synthetic Metals*, Vol. 91, p. 209, 1997).

In the luminescent layer 5, one hole-transporting compound only may be used, or two or more hole-transporting compounds may be used in any desired combination and proportion.

The proportion of the hole-transporting compound in the luminescent layer 5 is not limited unless the effects of the invention are considerably lessened. However, the proportion thereof is generally 0.1% by weight or more and is generally 65% by weight or less. When the amount of the hole-transporting compound is too small, there is a possibility that the luminescent layer might be apt to be affected by short-circuiting. When the amount thereof is too large, there is a possibility that unevenness in film thickness might result. In the case where two or more hole-transporting compounds are used in combination, these compounds are incorporated so that the total content thereof is within that range.

(Electron-Transporting Compound)

An electron-transporting compound may be contained, as a constituent material, in the luminescent layer 5. Examples of low-molecular electron-transporting compounds, among electron-transporting compounds, include 2,5-bis(1-naphthyl)-1,3,4-oxadiazole (BND), 2,5-bis(6'-(2',2"-bipyridyl))-1,1-dimethyl-3,4-diphenylsilole (PyPySPyPy), bathophenanthroline (BPhen), 2,9-dimethyl-4,7-diphenyl-1,10-phenanthroline (BCP, bathocuproine), 2-(4-biphenylyl)-5-(p-tert-butylphenyl)-1,3,4-oxadiazole (tBu-PBD), and 4,4'-bis(9-carbazole)biphenyl (CBP). In the luminescent layer 5, one electron-transporting compound only may be used, or two or more electron-transporting compounds may be used in any desired combination and proportion.

The proportion of the electron-transporting compound in the luminescent layer 5 is not limited unless the effects of the invention are considerably lessened. However, the proportion thereof is generally 0.1% by weight or more and is generally 65% by weight or less. When the amount of the electron-transporting compound is too small, there is a possibility that the luminescent layer might be apt to be affected by short-circuiting. When the amount thereof is too large, there is a possibility that unevenness in film thickness might result. In the case where two or more electron-transporting compounds are used in combination, these compounds are incorporated so that the total content thereof is within that range.

<Formation of Luminescent Layer>

When a luminescent layer 5 is formed, the materials are dissolved in an appropriate solvent to prepare a composition for luminescent-layer formation and this composition is used to form a film. Thus, a luminescent layer 5 is formed. In this case, it is preferred to use the composition B for organic electroluminescence elements of the invention described above.

As the luminescent-layer solvent to be contained in the composition for luminescent-layer formation which is a composition for forming a luminescent layer 5 by a wet film-forming method, any desired solvent can be used so long as a luminescent layer can be formed therewith. Suitable examples of the luminescent-layer solvent are the same as the solvents explained above with regard to the composition for hole injection layer formation.

The proportion of the luminescent-layer solvent to the composition for luminescent-layer formation, which is for forming a luminescent layer 5, is not limited unless the effects of the invention are considerably lessened. However, the proportion thereof is generally 0.01% by weight or more and is generally 70% by weight or less. In the case where a mixture of two or more solvents is used as the luminescent-layer solvent, these solvents are incorporated so that the total amount of these is within that range.

The concentration of solid components, e.g., the luminescent material, hole-transporting compound, and electron-transporting compound, in the composition for luminescent-layer formation is generally 0.01% by weight or higher and is generally 70% by weight or lower. When the concentration thereof is too high, there is a possibility that unevenness in film thickness might result. When the concentration thereof is too low, there is a possibility that the composition might give a film having defects.

After the composition for luminescent-layer formation is formed into a film by a wet process, the coating film obtained is dried to remove the solvent. Thus, a luminescent layer is formed. Specifically, the luminescent layer may be formed by the same method as that described above with regard to the formation of the hole injection layer. Techniques for the wet film-forming method are not limited unless the effects of the invention are considerably lessened, and any of the techniques described above can be used.

The thickness of the luminescent layer 5 is not limited unless the effects of the invention are considerably lessened. However, the thickness thereof is generally 3 nm or larger, preferably 5 nm or larger, and is generally 200 nm or smaller, preferably 100 nm or smaller. In case where the thickness of the luminescent layer 5 is too small, there is a possibility that the film might have defects. In case where the thickness thereof is too large, there is a possibility that an increase in driving voltage might result.

[Hole Blocking Layer]

A hole blocking layer 6 may be disposed between the luminescent layer 5 and the electron injection layer 8 which will be described later. The hole blocking layer 6 is a layer superposed on the luminescent layer 5 so as to be in contact with that interface of the luminescent layer 5 which faces the cathode 9.

This hole blocking layer 6 has the function of blocking holes sent from the anode 2 and preventing the holes from reaching the cathode 9, and further has the function of efficiently transporting, toward the luminescent layer 5, electrons injected from the cathode 9.

Examples of properties which are required of the material constituting the hole blocking layer 6 include a high electron mobility and a low hole mobility, a large energy gap (difference between HOMO and LUMO), and a high excited-triplet level (T1). Examples of materials for the hole blocking layer which satisfy such requirements include metal complexes such as mixed-ligand complexes, e.g., bis(2-methyl-8-quinolinolato)(phenolato)aluminum and bis(2-methyl-8-quinolinolato)(triphenylsilanolato)aluminum, and dinuclear metal complexes such as bis(2-methyl-8-quinolato)aluminum-μ-oxobis(2-methyl-8-quinolato)aluminum, styryl compounds such as distyrylbiphenyl derivatives (JP-A-11-242996), triazole derivatives such as 3-(4-biphenylyl)-4-phenyl-5-(4-tert-butylphenyl)-1,2,4-triazole (JP-A-7-41759), and phenanthroline derivatives such as bathocuproine (JP-A-10-79297). Furthermore, the compound having at least one pyridine ring substituted in the 2, 4, and 6 positions which is described in International Publication No. 2005-022962 is also preferred as a material for the hole blocking layer 6.

One material only may be used for forming the hole blocking layer 6, or two or more materials may be used for forming the layer 6 in any desired combination and proportion.

Methods for forming the hole blocking layer 6 are not limited. Consequently, the hole blocking layer 6 can be formed by a wet film-forming method, vapor deposition, or another method.

The thickness of the hole blocking layer 6 is not limited unless the effects of the invention are considerably lessened. However, the thickness thereof is generally 0.3 nm or larger, preferably 0.5 nm or larger, and is generally 100 nm or smaller, preferably 50 nm or smaller.

[Electron Transport Layer]

An electron transport layer 7 may be disposed between the luminescent layer 5 and the electron injection layer 8 which will be described later.

The electron transport layer 7 is disposed for the purpose of further improving the luminescent efficiency of the element, and is constituted of one or more compounds which, between the electrodes placed in an electric field, can efficiently transport, toward the luminescent layer 5, electrons injected from the cathode 9.

As electron-transporting compounds for the electron transport layer 7, use is generally made of compounds which attain a high efficiency of electron injection from the cathode 9 or electron injection layer 8 and which have a high electron mobility and can efficiently transport injected electrons. Examples of compounds satisfying such requirements include metal complexes such as the aluminum complex of 8-hydroxyquinoline (JP-A-59-194393), metal complexes of 10-hydroxybenzo[h]quinoline, oxadiazole derivatives, distyrylbiphenyl derivatives, silole derivatives, 3-hydroxyflavone metal complexes, 5-hydroxyflavone metal complexes, benzoxazole metal complexes, benzthiazole metal complexes, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N'-dicyanoanthraquinonediimine, n-type amorphous silicon hydride carbide, n-type zinc sulfide, and n-type zinc selenide.

One material only may be used for forming the electron transport layer 7, or two or more materials may be used for forming the layer 7 in any desired combination and proportion.

Methods for forming the electron transport layer 7 are not limited. Consequently, the electron transport layer 7 can be formed by a wet film-forming method, vapor deposition, or another method.

The thickness of the electron transport layer 7 is not limited unless the effects of the invention are considerably lessened. However, the thickness thereof is generally 1 nm or larger, preferably 5 nm or larger, and is generally 300 nm or smaller, preferably 100 nm or smaller.

[Electron Injection Layer]

The electron injection layer 8 has the function of efficiently injecting, into the luminescent layer 5, electrons injected from the cathode 9. From the standpoint of efficiently injecting electrons, it is preferred that the material constituting the electron injection layer 8 should be a metal having a low work function. For example, an alkali metal such as sodium or cesium, an alkaline earth metal such as barium or calcium, or the like is used. The thickness thereof is generally 0.1 nm or larger and is preferably 5 nm or smaller.

Furthermore, doping of an organic electron-transporting compound represented by a nitrogen-containing heterocyclic compound, e.g., bathophenanthroline, or a metal complex, e.g., the aluminum complex of 8-hydroxyquinoline, with an alkali metal such as sodium, potassium, cesium, lithium, or rubidium (described in JP-A-10-270171, JP-A-2002-100478, JP-A-2002-100482, etc.) is preferred because this doping improves suitability for electron injection and transport and enables the layer to combine the improved suitability and excellent film quality. It is preferred that the thickness of the film in this case should be generally 5 nm or larger, especially 10 nm or larger, and be generally 200 nm or smaller, especially 100 nm or smaller.

One material only may be used for forming the electron injection layer 8, or two or more materials may be used for forming the layer 8 in any desired combination and proportion.

Methods for forming the electron injection layer 8 are not limited. Consequently, the electron injection layer 8 can be formed by a wet film-forming method, vapor deposition, or another method.

[Cathode]

The cathode 9 has the function of injecting electrons into a layer located on the luminescent layer 5 side (e.g., the electron injection layer 8 or the luminescent layer 5).

As the material of the cathode 9, the materials usable for the anode 2 can be used. However, metals having a low work function are preferred from the standpoint of efficiently injecting electrons. For example, suitable metals such as tin, magnesium, indium, calcium, aluminum, and silver and alloys of these are used. Specific examples thereof include electrodes of alloys having a low work function, such as magnesium-silver alloys, magnesium-indium alloys, and aluminum-lithium alloys.

One material only may be used for forming the cathode 9, or two or more materials may be used for forming the cathode 9 in any desired combination and proportion.

The thickness of the cathode 9 is generally the same as that of the anode 2.

For the purpose of protecting the cathode 9 made of a metal having a low work function, a layer of a metal which has a high work function and is stable to the air may be formed on the cathode 9. This layer formation is preferred because the stability of the element is enhanced thereby. For this purpose, a metal such as, for example, aluminum, silver, copper, nickel, chromium, gold, or platinum is used. One of these materials may be used alone, or two or more thereof may be used in any desired combination and proportion.

[Other Layers]

The organic electroluminescence element according to the invention may have other configurations unless the configurations depart from the spirit of the invention. For example, the element may have any desired layer other than the layers explained above, between the anode 2 and the cathode 9. Alternatively, any desired layer may have been omitted. For example, in the organic electroluminescence element produced in an Example which will be given later, the hole blocking layer 6 and the electron transport layer 7 in the organic electroluminescence element shown in FIG. 1 have been omitted.

<Electron Blocking Layer>

Examples of the layers which may be possessed by the organic electroluminescence element besides the layers described above include an electron blocking layer.

The electron blocking layer is disposed between the hole injection layer 3 or hole transport layer 4 and the luminescent layer 5. The electron blocking layer serves to block electrons sent from the luminescent layer 5 and prevent the electrodes from reaching the hole injection layer 3. The electron blocking layer thus functions to heighten the probability of recombination of holes with electrons within the luminescent layer 5 and to confine the resultant excitons in the luminescent layer 5. The electron blocking layer further has the function of efficiently transporting, toward the luminescent layer 5, holes injected from the hole injection layer 3. To dispose the electron blocking layer is effective especially when a phosphorescent material or a blue luminescent material is used as a luminescent material.

Examples of properties which are required of the electron blocking layer include high hole-transporting properties, a large energy gap (difference between HOMO and LUMO), and a high excited-triplet level (T1). Furthermore, in the invention, when the luminescent layer 5 is to be formed as an organic layer according to the invention by a wet film-forming method, the electron blocking layer also is required to have suitability for the wet film formation. Examples of materials usable for forming such an electron blocking layer include copolymers of dioctylfluorene and triphenylamine which are represented by F8-TFB (described in International Publication No. 2004/084260, pamphlet).

One material only may be used for forming the electron blocking layer, or two or more materials may be used for forming the layer in any desired combination and proportion.

Methods for forming the electron blocking layer are not limited. Consequently, the electron blocking layer can be formed by a wet film-forming method, vapor deposition, or another method.

<Others>

Furthermore, to interpose an ultrathin insulating film (0.1-5 nm) made of, for example, lithium fluoride (LiF), magnesium fluoride ($MgF_2$), lithium oxide ($Li_2O$), or cesium (II) carbonate ($CsCO_3$) at the interface between the cathode 9 and the luminescent layer 5 or electron transport layer 7 is an effective technique for improving the efficiency of the element (see, for example, *Applied Physics Letters*, Vol. 70, p. 152, 1997; JP-A-10-74586; *IEEE Transactions on Electron Devices*, Vol. 44, p. 1245, 1997; and *SID 04 Digest*, p. 154).

Moreover, in any of the layer configurations explained above, the constituent elements excluding the substrate may be superposed in the reverse order. For example, in the case of the layer configuration shown in FIG. 1, the constituent elements other than the substrate 1 may be disposed on the substrate 1 in the order of: the cathode 9, electron injection layer 8, electron transport layer 7, hole blocking layer 6, luminescent layer 5, hole transport layer 4, hole injection layer 3, and anode 2.

It is also possible to constitute an organic electroluminescence element according to the invention by superposing the constituent elements other than the substrate between two substrates, at least one of which is transparent.

A structure composed of a stack of stages each composed of constituent elements other than substrates (luminescent units) (i.e., a structure composed of a plurality of stacked luminescent units) is also possible. In this case, when a carrier generation layer (CGL) made of, for example, vanadium pentoxide ($V_2O_5$) is disposed in place of the interfacial layers located between the stages (i.e., between the luminescent units) (when the anode is ITO and the cathode is aluminum, the interfacial layers are these two layers), then the barrier between the stages is reduced. This configuration is more preferred from the standpoints of luminescent efficiency and driving voltage.

Furthermore, the organic electroluminescence element according to the invention may be configured so as to be a single organic electroluminescence element, or may be applied to a configuration in which a plurality of organic electroluminescence elements have been disposed in an array arrangement. The organic electroluminescence element may also be applied to a configuration in which anodes and cathodes have been disposed in an X-Y matrix arrangement.

Each of the layers described above may contain ingredients other than those described above as materials for the layer, unless the effects of the invention are considerably lessened thereby.

The organic electroluminescence element of the invention may be used in organic EL displays. Organic electroluminescence elements obtained according to the invention can be used to produce an organic EL display by a method such as those described in, for example, *Yūki EL Dispurei* (Ohmsha, Ltd., published on Aug. 20, 2004, written by TOKITO Shizuo, ADACHI Chihaya, and MURATA Hideyuki).

The organic EL display device and organic EL lighting of the invention employ the organic electroluminescence element of the invention described above. The types and structures of the organic EL display device and organic EL lighting of the invention are not particularly limited, and can be fabricated using the organic electroluminescence element of the invention according to ordinary methods.

For example, the organic EL display device and organic EL lighting of the invention can be formed by the methods described in *Yūki EL Dispurei* (Ohmsha, Ltd., published on Aug. 20, 2004, written by TOKITO Shizuo, ADACHI Chihaya, and MURATA Hideyuki).

Furthermore, organic electroluminescence elements having an organic layer including the material for organic electroluminescence elements of the invention, which has a thermally dissociable and soluble group, are thought to be applicable to flat panel displays (e.g., displays for OA computers and wall-mounted TV receivers), vehicle-mounted display elements, cell phone display elements, light sources taking advantage of the feature of a surface light emitter (e.g., the light source of a copier and the backlight of a liquid-crystal display or instrument), display panels, and marker lights, and have a high technical value.

<Solar Cell Element>

The solar cell element of the invention is an organic solar cell element which includes an anode, a cathode, and an organic layer disposed therebetween, wherein the organic layer includes a layer (dissociation layer) formed from the composition A for solar cell elements, which contains the polymer of the invention, by a wet film-forming method.

The organic solar cell of the invention preferably is one which includes a photoelectric conversion layer and a hole extraction layer as organic layers and in which the hole extraction layer is the dissociation layer.

[Substrate]

The substrate is a supporting member which supports the organic semiconductor element. Examples of materials for constituting the substrate include inorganic materials such as glass, sapphire, and titania; organic materials such as poly(ethylene terephthalate), poly(ethylene naphthalate), polyethersulfones, polyimides, nylons, polystyrene, poly(vinyl alcohol), ethylene/vinyl alcohol copolymers, fluororesins, PVC, polyethylene, polypropylene, cycloolefin polymers, cellulose, acetyl cellulose, poly(vinylidene chloride), aramids, poly(phenylene sulfide), polyurethanes, polycarbonates, poly(meth)acrylic resins, phenolic resins, epoxy resins, polyarylates, and polynorbornene; and metallic materials such as stainless steel, titanium, nickel, silver, gold, copper, and aluminum.

Preferred of these, from the standpoint of ease of formation of an organic semiconductor element, are glass, poly(ethylene terephthalate), poly(ethylene naphthalate), polyimides, poly(meth)acrylic resins, stainless steel, and aluminum.

One material only may be used for forming the substrate, or two or more materials may be used for forming the substrate in any desired combination and proportion. Reinforcing fibers such as carbon fibers or glass fibers may be incorporated into those organic materials to enhance the mechanical strength thereof. Furthermore, the substrate may be a composite material, for example, one obtained by coating or laminating the surface of any of those metallic materials in order to impart insulating properties thereto.

[Organic Semiconductor Element]

An organic thin-film solar cell element (also referred to simply as solar cell element in this description) is described below as an organic semiconductor element. However, the term organic semiconductor element does not exclude other organic electron devices unless these devices considerably lessen the effects of the invention. Furthermore, organic thin-film solar cell elements also should not be construed as being limited to the embodiment explained below.

The organic thin-film solar cell element is configured at least of a pair of electrodes and an organic semiconductor layer disposed between the electrodes and including an organic semiconductor. The element has been configured so that the organic semiconductor layer absorbs light to generate electric power and the electric power generated is taken out through the electrodes.

[Organic Semiconductor Layer]

The organic semiconductor layer can be constituted of any desired organic semiconductors. Organic semiconductors are divided into the p-type and the n-type by semiconductor properties. The terms p-type and n-type indicate that the factor which contributes to electrical conduction is either holes or electrons, and whether a material is of the p-type or n-type depends on the electronic state, doped state, and trap state of the material. Consequently, although examples of organic semiconductors are shown below, there are cases where organic semiconductors cannot be always clearly classified in the p-type and the n-type, and there are substances which each exhibit both p-type properties and n-type properties.

Examples of p-type semiconductors include porphyrin compounds such as tetrabenzoporphyrin, tetrabenzocopper porphyrin, and tetrabenzozinc porphyrin; phthalocyanine compounds such as phthalocyanine, copper phthalocyanine, and zinc phthalocyanine; naphthalocyanine compounds; polyacenes such as tetracene and pentacene; and oligothiophenes such as sexithiophene and derivatives including any of these compounds as a framework. Examples thereof further include high-molecular compounds such as polythiophenes including poly(3-alkylthiophene)s, polyfluorene, polyphenylenevinylene, poly(triallylamine), polyacetylene, polyaniline, and polypyrrole.

Examples of n-type semiconductors include fullerenes (C60, C70, and C76); octaazaporphyrin; the perfluoro forms of the p-type semiconductors shown above; aromatic carboxylic acid anhydrides and imides thereof, such as naphthalenetetracarboxylic anhydride, naphthalenetetracarboxylic acid diimide, perylenetetracarboxylic anhydride, and perylenetetracarboxylic acid diimide; and derivatives including any of these compounds as a framework.

So long as at least a p-type semiconductor and an n-type semiconductor are contained, the organic semiconductor layer can have any desired configuration. The organic semiconductor layer may be constituted of a single-layer film only, or may be composed of two or more superposed films. For example, the organic semiconductor layer may be formed so that an n-type semiconductor and a p-type semiconductor are contained in respective films, or may be formed so that an n-type semiconductor and a p-type semiconductor are contained in the same film.

With respect to each of an n-type semiconductor and a p-type semiconductor, one substance may be used alone or two or more substances may be used in any desired combination and proportion.

Specific examples of the configuration of the organic semiconductor layer include: a bulk heterojunction type which has a layer (i layer) in which a p-type semiconductor and an n-type semiconductor are present as separate phases; a multilayer type (hetero-pn-junction type) in which a layer (p layer) including a p-type semiconductor and a layer (p layer) including an n-type semiconductor have an interface therebetween; the Schottky type; and combinations of these. Of these, the bulk heterojunction type and a p-i-n junction type, which is a combination of the bulk heterojunction type and the multilayer type, are preferred because these types have high performance.

The thicknesses of the p layer, i layer, and n layer of the organic semiconductor layer are not limited. However, it is preferred that the thicknesses thereof should be generally 3 nm or more, especially 10 nm or more, and be generally 200 nm or less, especially 100 nm or less. Increasing the layer thickness tends to result in heightened evenness of the film, while reducing the layer thickness tends to result in an improvement in transmittance and a decrease in series resistance.

[Hole Extraction Layer]

The hole extraction layer is a layer disposed on that interface of an electrode which faces the organic semiconductor layer, in order to improve electrical properties, etc.

As a material for forming the hole extraction layer, it is especially preferred to use the polymer of the invention. However, other materials can be used. Examples of the other materials include poly(ethylenedioxythiophene):poly(styrenesulfonic acid) (PEDOT:PSS), molybdenum oxide, lithium fluoride, and 2,9-dimethyl-4,7-diphenyl-1,10-phenanthroline.

[Electrodes]

The electrodes can be constituted of any desired material having electrical conductivity. Examples of materials for the electrodes include metals such as platinum, gold, silver, aluminum, chromium, nickel, copper, titanium, magnesium, calcium, barium, and sodium or alloys of these; metal oxides such as indium oxide and tin oxide or alloys thereof (ITO); conductive polymers such as polyaniline, polypyrrole, polythiophene, and polyacetylene; materials obtained by incorporating a dopant such as an acid, e.g., hydrochloric acid, sulfuric acid, or a sulfonic acid, a Lewis acid, e.g., $FeCl_3$, atoms of a halogen, e.g., iodine, or atoms of a metal, e.g., sodium or potassium, into the conductive polymers; and conductive composite materials obtained by dispersing conductive particles, e.g., metal particles, carbon black, fullerene, or carbon nanotubes, in a matrix, e.g., a polymer binder. Of these, a material having a high work function, such as gold or ITO, is preferred for the electrode where holes are collected. On the other hand, for the electrode where electrons are collected, a material having a low work function, such as aluminum, is preferred. Optimizing the work function has an advantage that the holes and electrons yielded by light absorption are satisfactorily collected.

It is preferred that at least the light-receiving-side electrode, of the pair of electrodes, should have light-transmitting properties from the standpoint of power generation. However, the light-receiving-side electrode need not be transparent when use of an opaque electrode does not considerably exert an adverse influence on power generation performance, as in the case where the area of the electrode is small as compared with the area of the power generation layer. Examples of materials for transparent electrodes include oxides, such as ITO and indium-zinc oxide (IZO), and thin metal films. In this case, there are no limitations on specific ranges of light transmittance. However, when the power generation efficiency of the solar cell element is taken into account, the light transmittance of the electrode is preferably 80% or higher, excluding any loss caused by partial reflection occurring at the optical interfaces.

One material only may be used for forming each electrode, or two or more materials may be used for forming each electrode in any desired combination and proportion.

Methods for forming the electrodes are not limited. For example, the electrodes can be formed by a dry process such as vacuum deposition or sputtering. It is also possible to form the electrodes by a wet process using, for example, a conductive ink or the like. In this case, any desired conductive ink can be used. For example, use can be made of a conductive polymer, a dispersion of metal particles, or the like.

Furthermore, each electrode may be composed of two or more superposed layers, or may be improved in properties (electrical properties, wettability, etc.) by a surface treatment.

[Other Layers]

The organic solar cell element shown above as an embodiment may be equipped with layers other than the organic semiconductor layer and electrodes described above. The positions where other layers are to be formed are not limited unless power generation by the solar cell element is inhibited.

<Performance Evaluation of the Organic Solar Cell Element>

The organic solar cell element according to the invention has the following performance.

The performance can be evaluated by conducting the accelerated test shown below and comparing the photoelectric conversion characteristics observed before the test with those observed after the test.

Evaluation Method: In an accelerated test, the solar cell element is installed in a high-temperature high-humidity environment within an environmental tester (e.g., SH-241, manufactured by ESPEC Corp.). The high-temperature high-humidity environment preferably is a 40° C. 90% RH or 85° C. 85% RH environment. Although a test period can be suitably selected according to the materials constituting the device, it is preferred to conduct the test over 24 hours or longer. Photoelectric conversion characteristics are determined in the following manner. The organic thin-film solar cell is irradiated, at an irradiation intensity of 100 $mW/cm^2$, with light emitted using a solar simulator under the conditions of AM 1.5 G to examine the current-voltage characteristics. The energy conversion efficiency (PCE), short-circuit current, open-circuit voltage, FF (filter factor), series resistance, and shunt resistance can be determined from the current-voltage curve obtained through the examination.

Examples of equations for comparing the photoelectric conversion characteristics observed before the accelerated test with those observed after the test include $$(PCE\ change) = (PCE\ after\ accelerated\ test)/(PCE\ before\ accelerated\ test).$$

Specifically, the change in energy conversion efficiency (PCE) of the organic electron device according to the invention, as defined by the equation, is generally 0.86 or larger, preferably 0.88 or larger, more preferably 0.90 or larger, in terms of the value after the accelerated test relative to the initial performance.

The organic electron device according to the invention further has such performance that the device is highly prevented from deteriorating, because the layer (C) containing a trapping agent does not come into contact with the element electrode even under load. For evaluating this performance, use may be made of a method in which the layer (C) containing a trapping agent is pushed from the gas barrier film side toward the organic semiconductor element to check whether the layer (C) is in contact with the electrode or not.

The organic electron device according to the invention has satisfactory weatherability. Even when subjected to an outdoor exposure test or a weatherability test using a weatherometer, the organic electron device retains the performance and shows high durability. This is thought to be because electrode deterioration is inhibited by the presence of the anticorrosive layer. When a weatherable protective sheet is superposed, the device has higher weatherability.

EXAMPLES

The invention will be explained in more detail by reference to Examples, but the invention should not be construed as being limited to the following Examples unless the invention departs from the spirit thereof.

Synthesis Examples

Synthesis Example 1

Synthesis of Compound Q2

[Chem. 40]

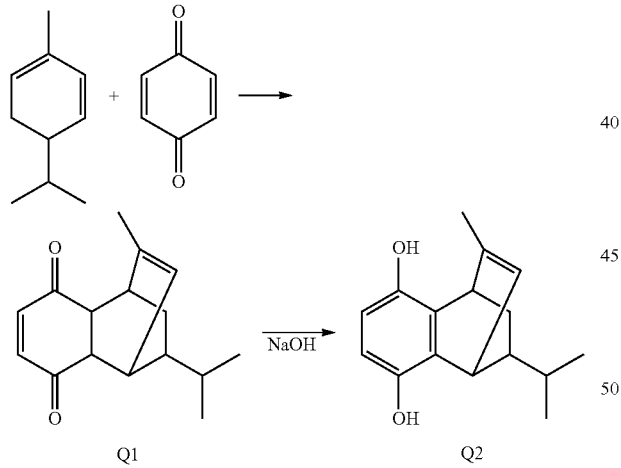

In an air stream, α-phellandrene (42.12 g) and benzoquinone (33.8 g) were added to water (4,500 mL), and the mixture was stirred by means of an ultrasonic wave at room temperature for 2 days. The crystals which had precipitated were taken out by filtration, washed with water, and dried to obtain compound Q1.

Subsequently, the compound Q1 (39 g) was dissolved in ethanol (200 mL) with stirring, and 0.1 g of 35% NaOH solution was then added thereto. This mixture was continuously stirred for 30 minutes. Thereafter, water (400 mL) was added thereto, and the crystals which had precipitated were taken out by filtration, washed with water, and dried to obtain compound Q2 (39 g).

(Results of NMR Analysis)

Compound Q2: 1H NMR (CDCl$_3$, 400 MHz) δ 0.84 (d, 3H), 0.93 (d, 3H), 1.04-1.118 (m, 1H), 1.19-1.23 (m, 3H), 1.80 (s, 3H), 3.94-3.97 (m, 1H), 4.22 (d, 1H), 5.84 (d, 1H), 6.45 (s, 2H).

Synthesis Example 2

Synthesis of Compound Q6

[Chem. 41]

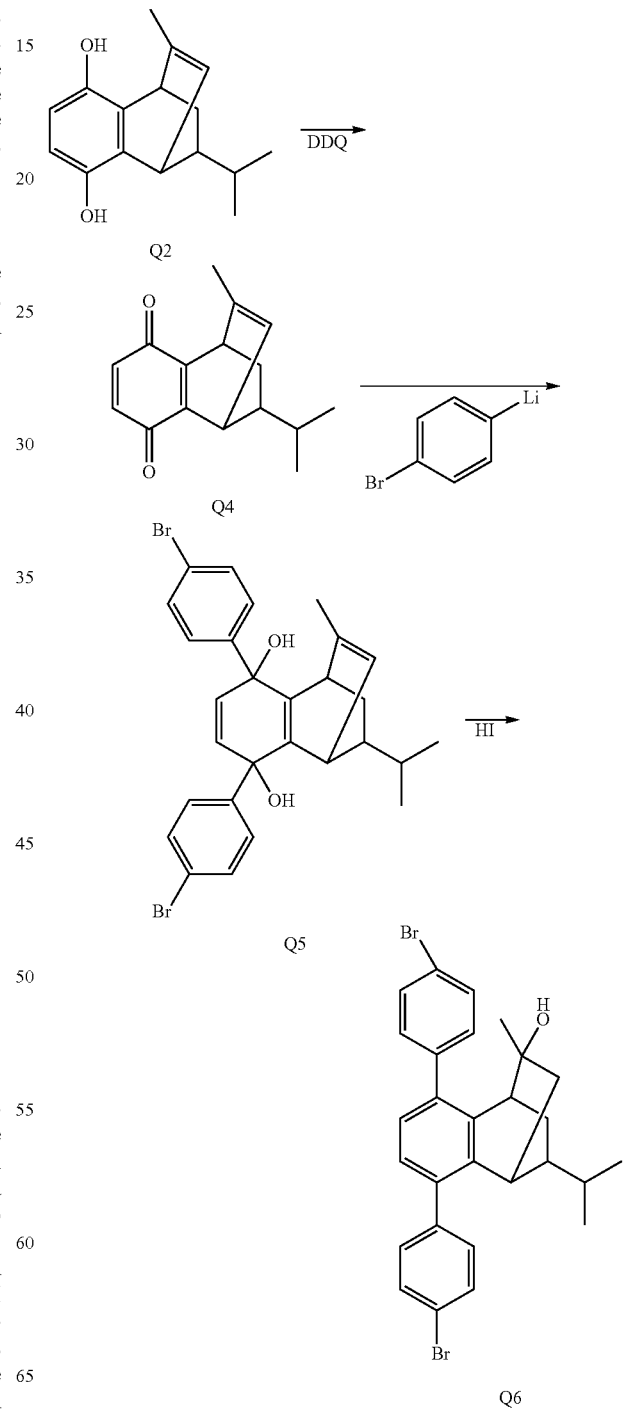

107

In a nitrogen stream, the compound Q2 (30.6 g) and 2,3-dichloro-5,6-dicyano-p-benzoquinone (DDQ) (33 g) were dissolved in toluene solution (700 mL), and this solution was stirred and reacted for 2 hours. Thereafter, the purified products precipitated were taken out by filtration, and the filtrate was purified with a silica gel column using concentrated hexane and ethyl acetate as a developing solvent to obtain dry compound Q4 (24.5 g). 1,4-Dibromobenzene (29.5 g) was dissolved in 100 mL of tetrahydrofuran (THF) solution. This solution was cooled to −78° C., and 70 mL of 1.6 M/L n-butyllithium was added dropwise thereto with stirring over 30 minutes. The resultant mixture was stirred for 3 hours. To this solution was dropwise added, over 1 hour, 100 mL of a THF solution containing the compound Q1 (10.24 g) dissolved therein. Thereafter, the mixture was kept being stirred at −78° C. for 2 hours. This reaction solution was returned to room temperature and allowed to stand overnight. Subsequently, 200 mL of water was added to the solution, and the resultant mixture was stirred. The organic layer was taken out, dried with MgSO$_4$, and then purified with a silica gel column using hexane and ethyl acetate as a developing solvent to obtain dry compound Q5 (24.5 g).

Subsequently, in an air stream, the compound Q5 (24.5 g) was dissolved in THF (500 mL), and 2 g of 55% hydrogen iodide was added to the resultant solution. This mixture was continuously stirred for 60 minutes. Subsequently, water (200 mL) was added to this solution to precipitate crude compound Q6. This crude compound Q6 was purified with a silica gel column using hexane and ethyl acetate as a developing solvent and further purified with recycling preparative HPLC Type LC-9204 (preparative column JAIGEL-1H-40), manufactured by Japan Analytical Industry Co., Ltd., to obtain compound Q6 (0.8 g).

(Results of NMR Analysis)

Compound Q4: 1H NMR (CDCl$_3$, 400 MHz) δ 0.834 (d, 3H), 1.1019 (d, 3H), 1.04-1.118 (m, 1H), 1.19-1.23 (m, 3H), 1.87 (s, 3H), 3.94-3.97 (m, 1H), 4.22 (d, 1H), 5.83 (d, 1H), 6.59 (s, 2H).

(Results of Mass Analysis)

The compound Q6 was analyzed by mass spectrometry in the following manner.

DEI method, DCI method (mass spectrometer JMS-700/MStation, manufactured by JEOL Ltd.)

Ionization method:

DEI (positive ion mode),

DCI (positive ion mode)/isobutane gas

Accelerating voltage: 70 eV

Emitter current change: from 0 A to 0.9 A

Range of mass numbers scanned:

m/z 100-1,300 2.0 sec/scan

As a result, m/z=M+538.

108

Synthesis Example 3

Synthesis of Compound Q10

[Chem. 42]

Eq. A5

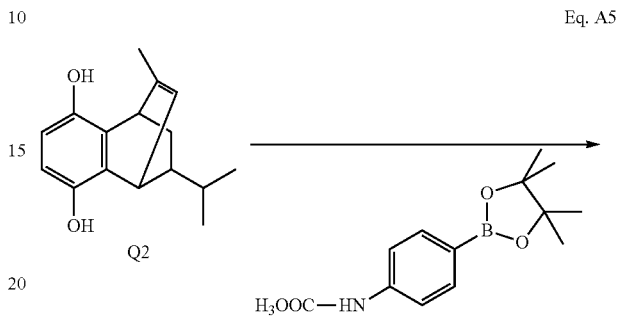

-continued

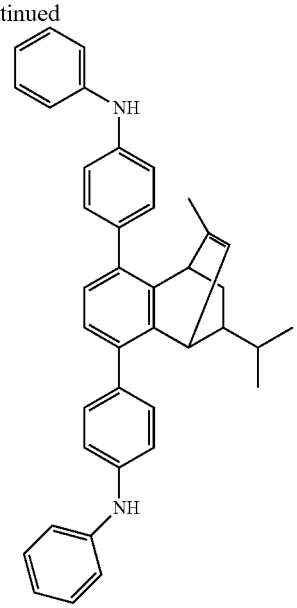

Q10

In a nitrogen stream, the compound Q2 (5.08 g), 4-(4,4,5,5-tetramethyl-1,3,2-dioxaborolan-2-yl)acetanilide (5.2 g), and sodium carbonate (4.3 g) were dissolved, with stirring, in a mixed solvent composed of toluene (260 mL), ethanol (130 mL), and water (240 mL). This solution was subjected to nitrogen bubbling for 40 minutes. Thereafter, 0.25 g of tetrakis(triphenylphosphine)palladium was added thereto, and this mixture was reacted at 100° C. for 6 hours. Subsequently, the reaction mixture was returned to room temperature and allowed to stand overnight to precipitate crystals. The crystals were taken out by filtration and washed with ethanol to obtain compound Q8 (4.3 g).

The compound Q8 (4.3 g) and potassium hydroxide (15 g) were dissolved in 75% aqueous ethanol solution (250 mL). This solution was heated at 100° C. for 10 hours and then returned to room temperature. A hundred milliliters of water was added thereto, and the crystals which had precipitated were taken out to obtain compound Q9 (2 g).

Dipalladium tris(dibenzylideneacetone) chloroform (0.015 g) and 1,1'-ferrocene bis(diphenylphosphine) (0.056 g) were dissolved in toluene (10 g) which had undergone 10-minute nitrogen bubbling, and the resultant solution was heated at 70° C. for 10 minutes. Thereafter, this palladium catalyst solution was added to a solution prepared by dissolving the compound Q9 (2 g), bromobenzene (1.6 g), and tert-butoxysodium (3.4 g) in toluene (200 mL) and subjecting this solution to 40-minute nitrogen bubbling, and the resultant mixture was stirred at 100° C. for 4 hours in a nitrogen stream. This solution was returned to room temperature. A hundred milliliters of water was added thereto, and the crystals which had precipitated were taken out by filtration and washed with ethanol to obtain compound Q10 (1.3 g).

(Results of Mass Analysis)

The compound Q10 was analyzed by mass spectrometry in the following manner.

DEI method, DCI method (mass spectrometer JMS-700/MStation, manufactured by JEOL Ltd.)
Ionization method:
DEI (positive ion mode),
DCI (positive ion mode)/isobutane gas
Accelerating voltage: 70 eV
Emitter current change: from 0 A to 0.9 A
Range of mass numbers scanned:
m/z 100-800 2.0 sec/scan
As a result, m/z=M+546.

Synthesis Example 4

Synthesis of Compound Q11

[Chem. 43]

Eq. A6

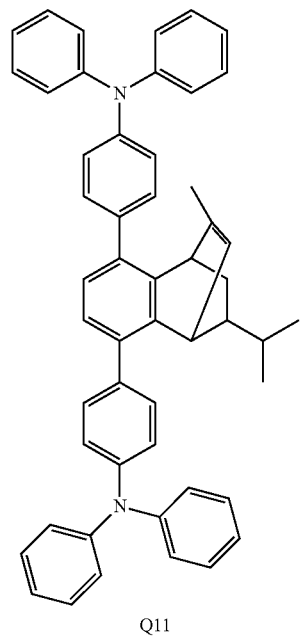

Dipalladium tris(dibenzylideneacetone) chloroform (0.015 g) and tris-tert-butylphosphine (0.015 g) were dissolved in toluene (10 g) which had undergone 10-minute nitrogen bubbling, and the resultant solution was heated at 70° C. for 10 minutes. Thereafter, this palladium catalyst solution was added to a solution prepared by dissolving the compound Q9 (2 g), bromobenzene (3.2 g), and tert-butoxysodium (3.4 g) in toluene (200 mL) and subjecting this solution to 40-minute nitrogen bubbling, and the resultant mixture was stirred at 100° C. for 4 hours in a nitrogen stream. This solution was returned to room temperature. A hundred milliliters of water was added thereto, and the crystals which had precipitated were taken out by filtration and washed with ethanol to obtain compound Q11 (1.5 g).

(Results of NMR Analysis)

Compound Q11: 1H NMR (CDCl$_3$, 400 MHz) δ 0.83 (d, 3H), 0.93 (d, 3H), 1.04-1.118 (m, 1H), 1.19-1.23 (m, 3H), 1.87 (s, 3H), 3.94-4.05 (m, 1H), 4.26 (d, 1H), 5.90 (d, 1H), 6.90-7.3 (m, 30H)

Example 1

The compound Q11 was heat-treated at 230° C. for 30 minutes. As a result, compound Q12 was obtained through elimination of 2-vinylpropane from the compound Q11; the compound Q12 was identified by NMR analysis.

When a solution prepared by dissolving the compound Q11 (2 mg) described above in 100 g of toluene was irradiated with ultraviolet light (366 nm), purplish-blue luminescence was observed. However, when a solution prepared by dissolving 2 mg of the compound Q12, which had been obtained through a 30-minute heat treatment at 230° C., in 100 g of toluene was irradiated with ultraviolet light (366 nm), truly blue luminescence was obtained.

<Evaluation of Solubility in Ethanol>

Ten milligrams of the compound Q11 was introduced into two 5-mL sample bottles containing 10 mg of ethanol, and the mixture was stirred for 20 minutes with an ultrasonic stirrer. As a result, the compound Q11 was completely dissolved. On the other hand, the compound Q12 was subjected to the same experiment and, as a result, 80% or more of the compound Q12 remained undissolved.

[Chem. 44]

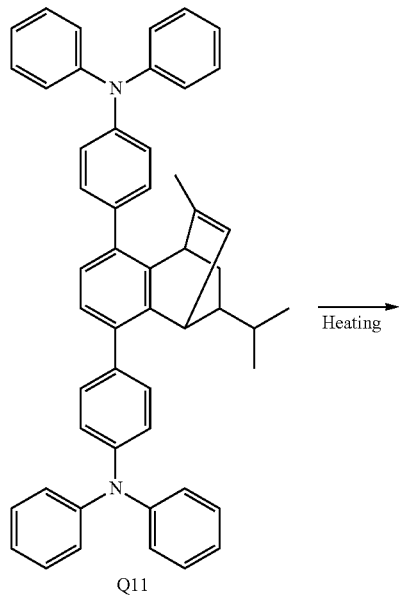

Q11

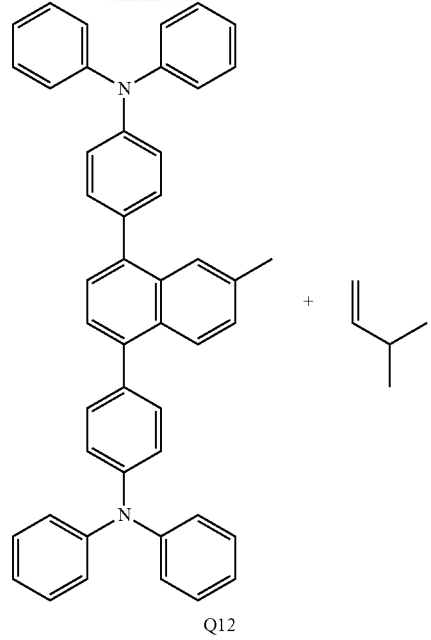

Q12

(Results of NMR Analysis)

Compound Q12: 1H NMR (CDCl$_3$, 400 MHz) δ 2.4 (s, 3H), 6.9-7.85 (m, 33H)

Example 2

The compound Q6 was heat-treated at 230° C. for 30 minutes. As a result, compound Q14 was obtained through elimination of 2-vinylpropane and water from the compound Q6.

<Evaluation of Solubility in Ethanol>

Ten milligrams of the compound Q6 was introduced into two 5-mL sample bottles containing 10 mg of ethanol, and the mixture was stirred for 20 minutes with an ultrasonic stirrer. As a result, the compound Q6 was completely dissolved. On the other hand, the compound Q14 was subjected to the same experiment and, as a result, 90% or more of the compound Q14 remained undissolved.

[Chem. 45]

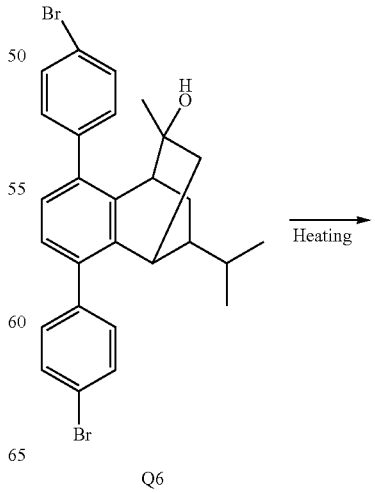

Q6

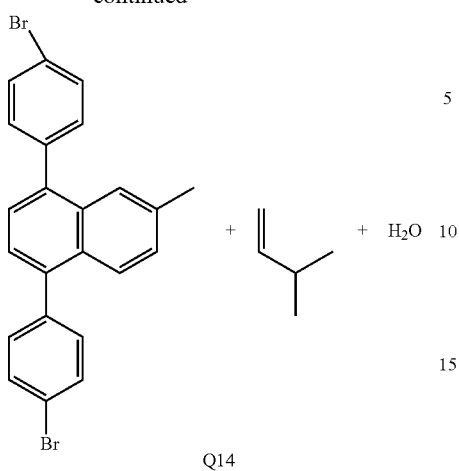

(Results of NMR Analysis)

Compound Q14: 1H NMR (CDCl$_3$, 400 MHz) δ 2.4 (s, 1H), 7.2-7.85 (m, 13H)

(Results of Mass Analysis)

The compound Q14 was analyzed by mass spectrometry in the following manner.

DEI method, DCI method (mass spectrometer JMS-700/MStation, manufactured by JEOL Ltd.)

Ionization method:
DEI (positive ion mode),
DCI (positive ion mode)/isobutane gas
Accelerating voltage: 70 eV
Emitter current change: from 0 A to 0.9 A
Range of mass numbers scanned:
m/z 100-800 2.0 sec/scan
As a result, m/z=M+450.

Synthesis Example 5

Synthesis of Polymer 1

[Chem. 46]

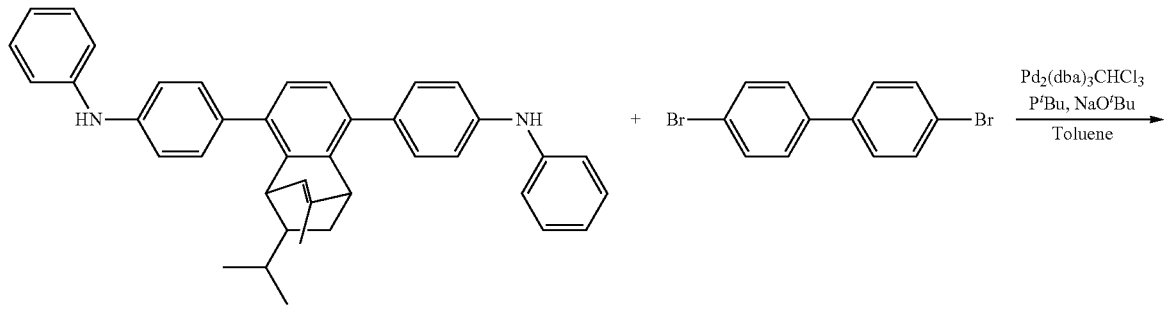

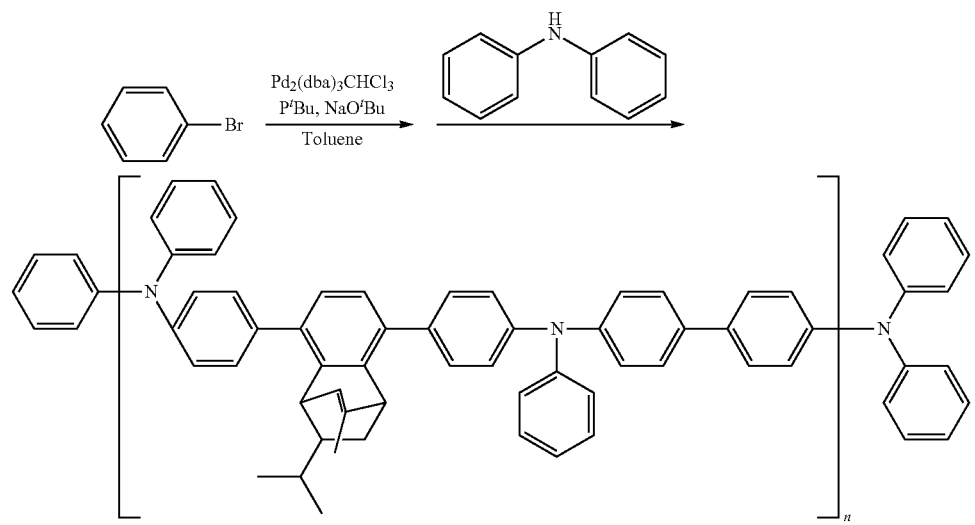

Polymer 1

The compound Q10 (0.71 g; 1.30 mmol) synthesized above, 4,4'-dibromobiphenyl (0.39 g; 1.26 mmol), tert-butoxysodium (0.47 g; 4.86 mmol), and toluene (7 mL) were introduced, and the atmosphere in the system was sufficiently replaced with nitrogen. The contents were heated to 50° C. (solution A).

Tri-t-butylphosphine (0.0210 g; 0.0104 mmol) was added to a solution of a tris(dibenzylideneacetone)dipalladium chloroform complex (0.013 g; 0.0013 mmol) in 2 mL of toluene, and this mixture was heated to 50° C. (solution B).

In a nitrogen stream, the solution B was added to the solution A, and the resultant mixture was reacted for 2 hours with heating and refluxing. The liquid reaction mixture was allowed to cool and then dropped into 200 mL of methanol to crystallize out crude polymer 1.

This crude polymer 1 was dissolved in toluene and reprecipitated from acetone, and the polymer precipitated was taken out by filtration. The crude polymer 1 obtained was dissolved in 45 mL of toluene. Bromobenzene (0.041 g; 0.3 mmol) and tert-butoxysodium (1.80 g; 2 mmol) were introduced, and the atmosphere in the system was sufficiently replaced with nitrogen. The contents were heated to 50° C. (solution C).

Tri-t-butylphosphine (0.003 g; 1.6 mmol) was added to a solution of a tris(dibenzylideneacetone)dipalladium chloroform complex (0.013 g; 1.2 mmol) in 5 mL of toluene, and this mixture was heated to 50° C. (solution D).

In a nitrogen stream, the solution D was added to the solution C, and the mixture was reacted for 2 hours with heating and refluxing. A solution of N,N-diphenylamine (0.22 g; 1.3 mmol) in toluene (34 mL) was added to the liquid reaction mixture, and the resultant mixture was reacted for 8 hours with heating and refluxing. This liquid reaction mixture was allowed to cool and dropped into methanol to obtain crude polymer 1.

The crude polymer 1 obtained was dissolved in toluene, and the solution was washed with dilute hydrochloric acid. The polymer was then reprecipitated from ammonia-containing ethanol. The polymer was taken out by filtration and purified by column chromatography to obtain polymer 1 (0.29 g) according to the invention.

Weight-average molecular weight (Mw)=106,696

Number-average molecular weight (Mn)=47,937

Dispersity ratio (Mw/Mn)=2.23

Thermal dissociation in the polymer 1 was examined with a differential scanning calorimeter (DSC6220, manufactured by SII Nano Technology Inc.). The thermal dissociation was ascertained to occur efficiently at a temperature of 230° C.

Synthesis Example 6

The same reaction and purification as in Synthesis Example 1 were conducted, except that the α-phellandrene (42.1 g) was replaced with 1,3-cyclohexadiene (24.7 g). Thus, compound Q15 (29.6 g) was obtained.

[Chem. 47]

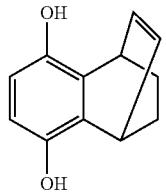

Q15

(Results of NMR Analysis)

Compound Q15: 1H NMR (CDCl$_3$, 400 MHz) δ 1.5-1.6 (m, 4H), 4.32 (m, 2H), 6.45 (s, 2H)

Synthesis Example 7

Compound Q16 contained as a purified by-product in the crude compound Q6 obtained in Synthesis Example 2 was isolated with recycling preparative HPLC Type LC-9204 (preparative column JAIGEL-1H-40, manufactured by Japan Analytical Industry Co., Ltd.) to obtain compound Q16 (0.5 g).

[Chem. 48]

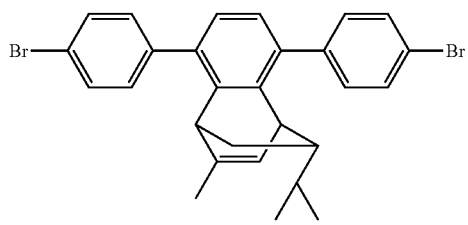

Q16

(Results of NMR Analysis)

Compound Q16: 1H NMR (CDCl$_3$, 400 MHz) δ 0.834 (d, 3H), 0.92 (d, 3H), 1.04-1.118 (m, 1H), 1.19-1.23 (m, 3H), 1.87 (s, 3H), 3.94-3.97 (m, 1H), 4.22 (d, 1H), 5.83 (d, 1H), 6.9-7.4 (m, 10H)

Synthesis Example 8

The same procedure as in (Synthesis Example 2) was conducted, except that the Q2 (30.6 g) was replaced with Q5 (22.4 g). Thus, compound Q17 (0.3 g), which is represented by the following structural formula, was obtained.

[Chem. 49]

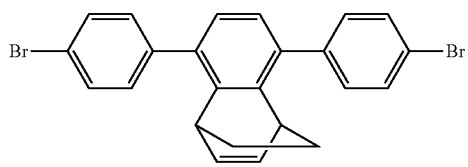

Q17

(Results of NMR Analysis)

Compound Q17: 1H NMR (CDCl$_3$, 400 MHz) δ 1.5-1.6 (m, 4H), 4.32 (m, 2H), 6.45 (m, 2H), 7.0-7.7 (m, 10H)

Synthesis Example 9

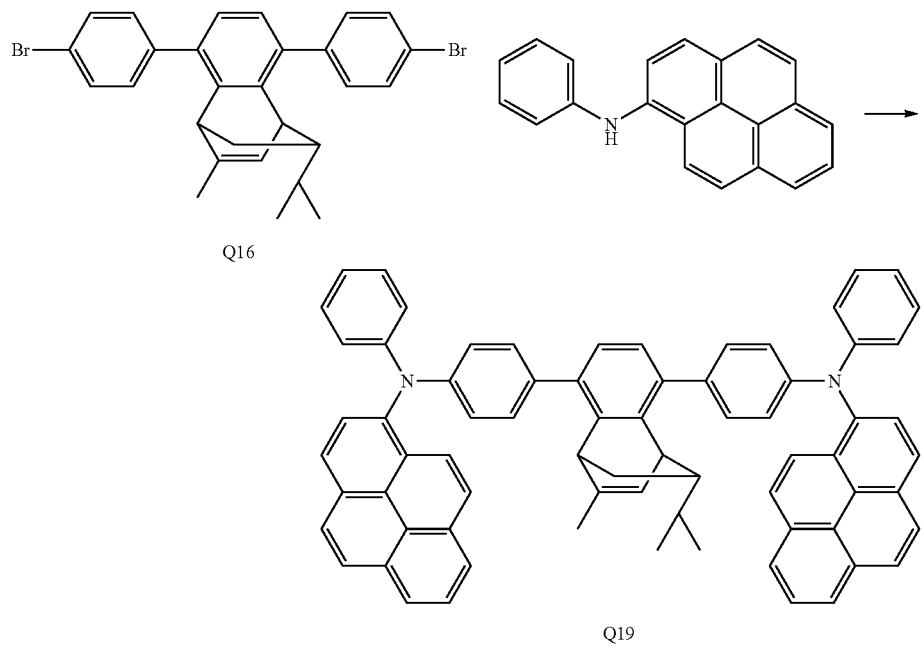

Dipalladium tris(dibenzylideneacetone) chloroform (0.28 g) and tris-tert-butylphosphine (0.29 g) were dissolved in toluene (30 g) which had undergone 10-minute nitrogen bubbling, and the resultant solution was heated at 70° C. for 10 minutes. Thereafter, this palladium catalyst solution was added to a solution prepared by dissolving compound Q16 (0.84 g) (the compound Q16 synthesized in Synthesis Example 7), N-phenyl-1-aminopyrene (1.08 g), and tert-butoxysodium (1.07 g) in toluene (100 mL) and subjecting this solution to 40-minute nitrogen bubbling, and the resultant mixture was stirred at 80° C. for 3 hours in a nitrogen stream. This solution was returned to room temperature. Ten milliliters of water was added thereto, and the crystals which had precipitated were taken out by filtration and washed with ethanol to obtain compound Q19 (0.7 g).

(Results of NMR Analysis)

Compound Q19: 1H NMR (CDCl$_3$, 400 MHz) δ 0.83 (d, 3H), 0.93 (d, 3H), 1.04-1.118 (m, 1H), 1.19-1.23 (m, 3H), 1.87 (s, 3H), 3.94-4.05 (m, 1H), 4.26 (d, 1H), 5.90 (d, 1H), 6.90-3.3 (m, 38H)

Synthesis Example 10

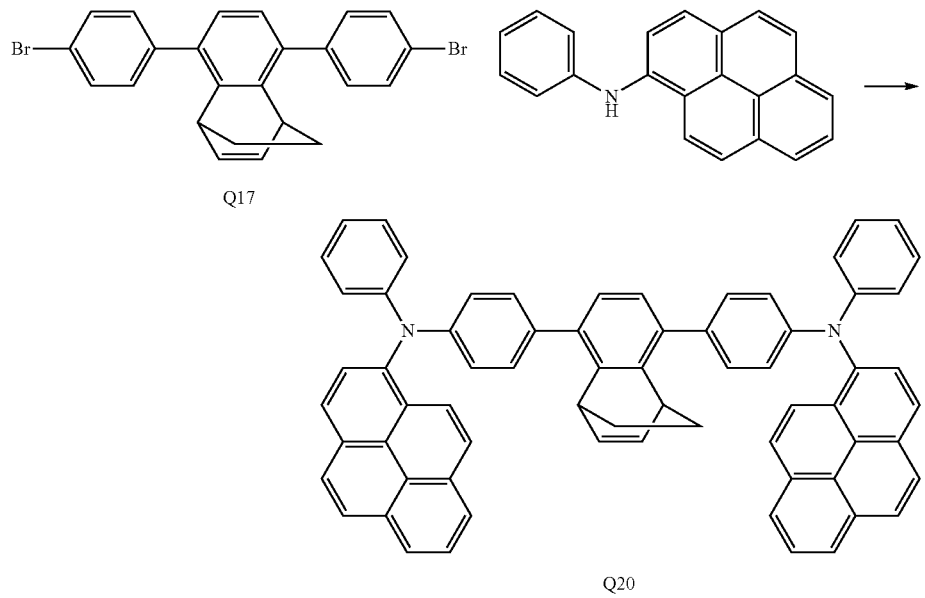

Dipalladium tris(dibenzylideneacetone) chloroform (0.025 g) and tris-tert-butylphosphine (0.027 g) were dissolved in toluene (10 g) which had undergone 10-minute nitrogen bubbling, and the resultant solution was heated at 70° C. for 10 minutes. Thereafter, this palladium catalyst solution was added to a solution prepared by dissolving compound Q17 (0.067 g) (the compound Q17 synthesized in Synthesis Example 8), N-phenyl-1-aminopyrene (0.098 g), and tert-butoxysodium (0.098 g) in toluene (10 mL) and subjecting this solution to 40-minute nitrogen bubbling, and the resultant mixture was stirred at 80° C. for 3 hours in a nitrogen stream. This solution was returned to room temperature. Ten milliliters of water was added thereto, and the crystals which had precipitated were taken out by filtration and washed with ethanol to obtain compound Q20 (0.06 g).
(Results of NMR Analysis)

Compound Q20: 1H NMR (CDCl$_3$, 400 MHz) δ 1.5-1.6 (m, 4H), 4.32 (m, 2H), 6.45 (m, 2H), 6.9-8.3 (m, 38H)

Synthesis Example 11

The compound Q19 was heat-treated at 230° C. for 30 minutes. As a result, compound Q21 was obtained through elimination of 2-vinylpropane from the compound Q19; the compound Q21 was identified by NMR analysis.

[Chem. 52]

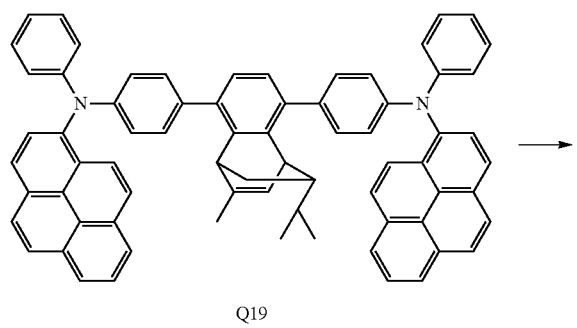

Q19

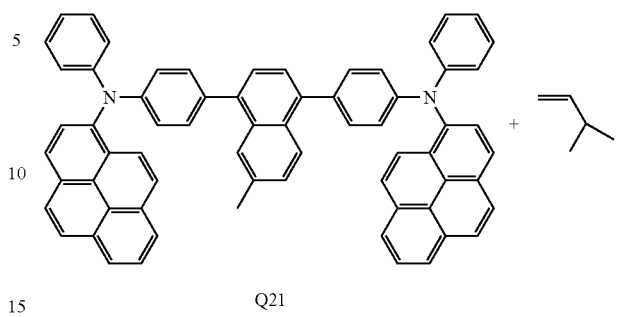

Q21

(Results of NMR Analysis)

Compound Q21: 1H NMR (CDCl$_3$, 400 MHz) δ 2.4 (s, 3H), 6.9-8.3 (m, 41H)<

<Evaluation of Solubility in Organic Solvent>

Five milligrams of the compound Q19 was introduced into two 5-mL sample bottles containing 100 mg of a toluene/hexane (10/1 by weight) mixed solution, and the mixture was stirred for 5 seconds with an ultrasonic stirrer. As a result, the compound Q19 was completely dissolved. On the other hand, the compound Q21 was subjected to the same experiment and, as a result, 80% or more of the compound Q21 remained undissolved.

Synthesis Example 12

The compound Q20 was heat-treated at 230° C. for 30 minutes. As a result, compound Q22 was obtained through elimination of ethylene from the compound Q20; the compound Q22 was identified by NMR analysis.

[Chem. 53]

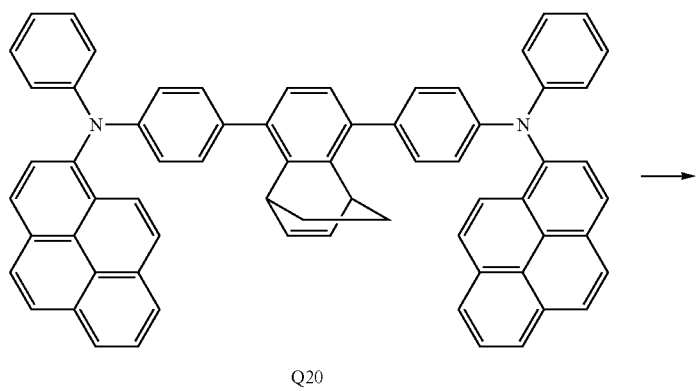

Q20

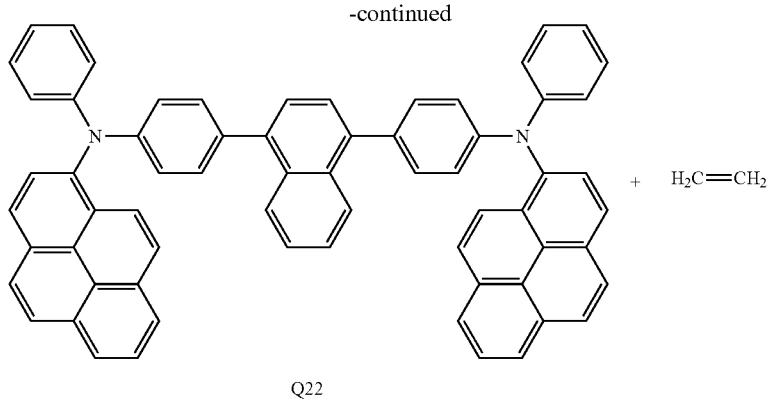

Q22

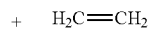 + H₂C=CH₂

(Results of NMR Analysis Compound Q22: 1H NMR (CDCl₃, 400 MHz) δ 6.9-8.3 (m, 42H)

<Evaluation of Solubility in Organic Solvent>

Five milligrams of the compound Q20 was introduced into two 5-mL sample bottles containing 100 mg of a toluene/hexane (1/1 by weight) mixed solution, and the mixture was stirred for 5 seconds with an ultrasonic stirrer. As a result, the compound Q20 was completely dissolved. On the other hand, the compound Q22 was subjected to the same experiment and, as a result, 80% or more of the compound Q22 remained undissolved.

The compounds Q20 and Q22 were evaluated for solubility in a toluene/hexane (10/1 by weight) mixed solution. As a result, 80% or more of each of Q20 and Q22 remained undissolved.

Synthesis Example 13

[Chem. 54]

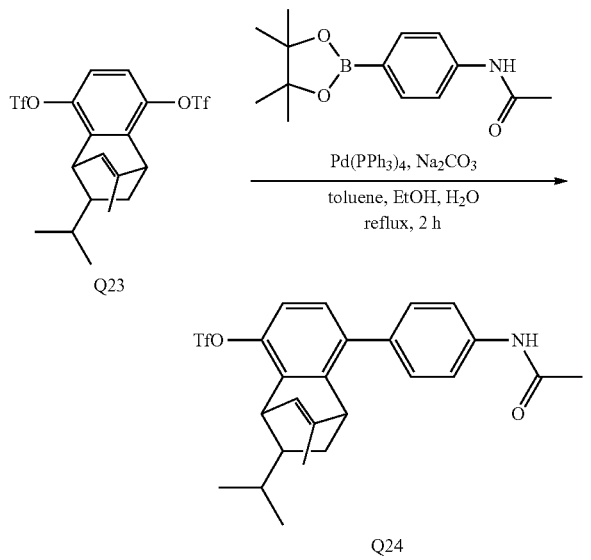

Q23 (6.91 g) and the boronic ester (3.54 g) were added to a mixed solvent composed of toluene (60 mL) and EtOH (30 mL), and the mixture was subjected to nitrogen bubbling for 40 minutes. To this reaction solution was added an aqueous sodium carbonate solution (prepared by dissolving 6.6 g of sodium hydrogen carbonate in 30 mL of water and then subjecting the solution to 30-minute nitrogen bubbling). Subsequently, 0.78 g of Pd(PPh3)₄ was added thereto, and the resultant reaction solution was refluxed for 2 hours. The organic layer was taken out and then washed with water twice. This organic layer was dried under reduced pressure, and the resultant solid was purified by column chromatography to obtain Q24 (4.6 g; yield, 69%).

Synthesis Example 14

[Chem. 55]

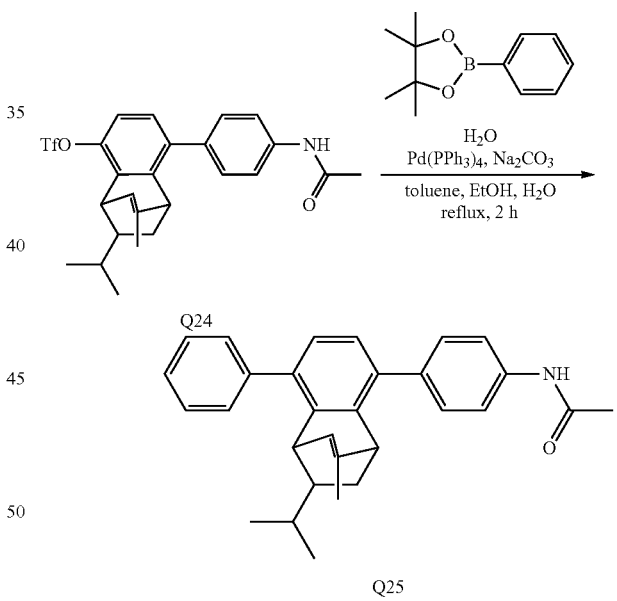

Q24 (6.9 g) and the phenylboronic ester (1.25 g) were added to a mixed solvent composed of toluene (60 mL) and EtOH (30 mL), and the mixture was subjected to nitrogen bubbling for 40 minutes. To this reaction solution was added an aqueous sodium carbonate solution (prepared by dissolving 6.6 g of sodium hydrogen carbonate in 30 mL of water and then subjecting the solution to 30-minute nitrogen bubbling). Subsequently, 0.54 g of Pd(PPh3)₄ was added thereto, and the resultant reaction solution was refluxed for 8 hours. The organic layer was taken out and then washed with water twice. This organic layer was dried under reduced pressure, and the resultant solid was purified by column chromatography to obtain Q25 (2.6 g; yield, 66%).

Synthesis Example 15

[Chem. 56]

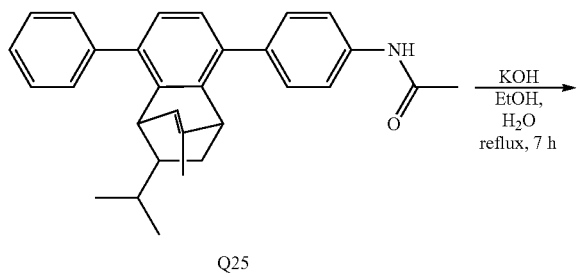

Q25 (2.6 g) and ethanol (80 mL) were introduced into a 200-mL eggplant type flask, and the mixture was stirred. To the resultant solution was added an aqueous potassium hydroxide solution (13.8 g of KOH/15 mL of water). Thereafter, this solution was immersed in an 85° C. oil bath and reacted for 7 hours. The solution was allowed to cool to room temperature and then cooled with ice to crystallize a product. The crystals were taken out by filtration, subsequently suspended in and washed with water, and dried to obtain Q26 (1.66 g; yield, 71%).

Synthesis Example 16

[Chem. 57]

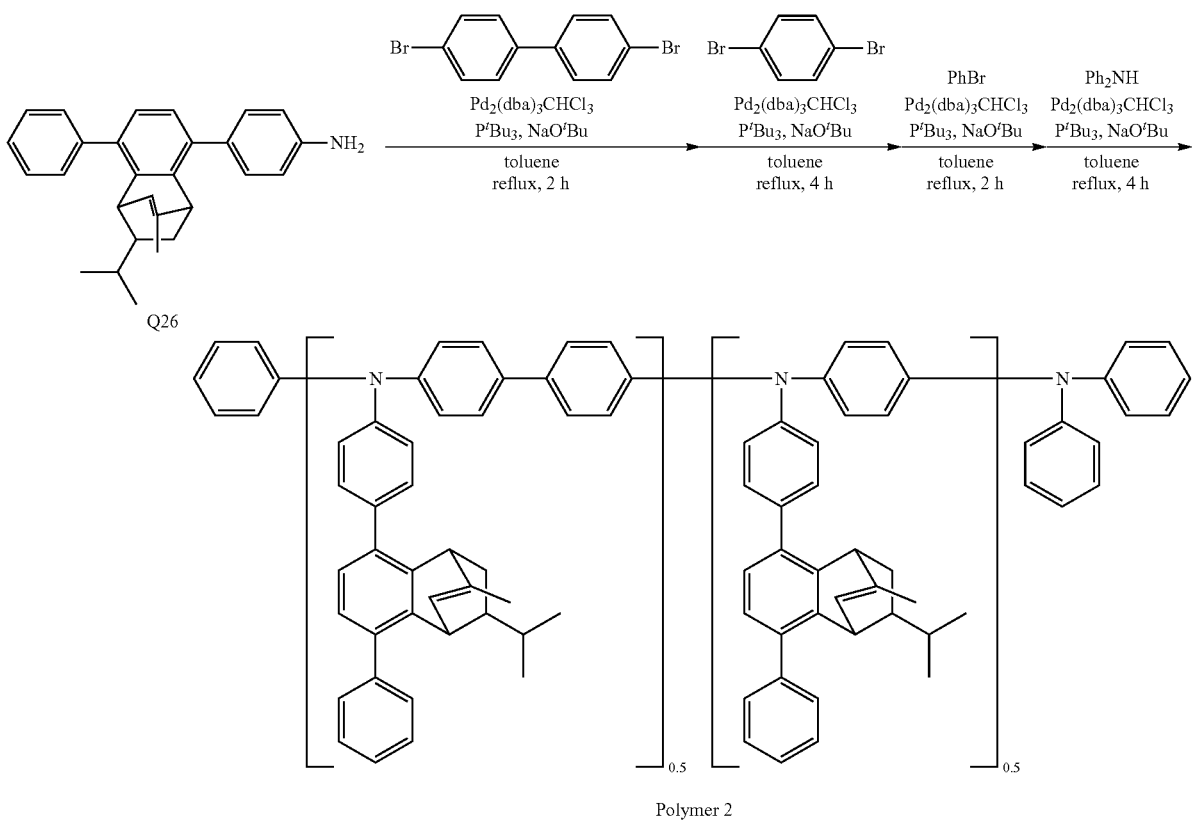

-continued

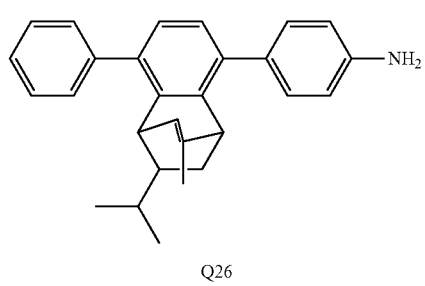

Q26 (2.23 g), 4,4'-dibromobiphenyl (0.92 g), tert-butoxysodium (1.81 g), and toluene (30 mL) were introduced, and the atmosphere in the system was sufficiently replaced with nitrogen. The contents were heated to 65° C. (solution A).

On the other hand, 95 mg of tri-t-butylphosphine was added to a toluene solution (5 mL) of a tris(dibenzylideneacetone)dipalladium chloroform complex (60 mg), and this mixture was heated to 65° C. (solution B).

In a nitrogen stream, the solution B was added to the solution A, and the resultant mixture was reacted with heating and refluxing. After 2 hours, dibromobenzene (0.68 g) was added, and this mixture was refluxed for 120 minutes. The solution B was added again to the resultant reaction solution and, after 30 minutes, dibromobenzene (15 mg) was further added thereto. The resultant mixture was reacted for 2 hours under the same conditions.

The liquid reaction mixture was allowed to cool and then dropped into ethanol to crystallize out crude polymer 2.

The crude polymer 2 obtained was dissolved in 100 mL of toluene, and 0.18 g of bromobenzene and 1.81 g of tert-butoxysodium were introduced. The atmosphere in the system was sufficiently replaced with nitrogen, and the contents were heated to 65° C. (solution C).

On the other hand, 45 mg of tri-t-butylphosphine was added to 6 mL of a toluene solution of 30 mg of a tris(dibenzylideneacetone)dipalladium chloroform complex, and this mixture was heated to 65° C. (solution D).

In a nitrogen stream, the solution D was added to the solution C, and the resultant mixture was reached for 2 hours with heating and refluxing. To this liquid reaction mixture was added 0.99 g of N,N-diphenylamine. The resultant mixture was reacted for 4 hours with heating and refluxing. The liquid reaction mixture was allowed to cool and dropped into ethanol to obtain an end-capped crude polymer 2.

This end-capped crude polymer 2 was dissolved in 250 mL of toluene, and the solution was washed with 200 mL of dilute hydrochloric acid. The polymer was then reprecipitated from 400 mL of ammonia-containing ethanol. The polymer obtained was reprecipitated from acetone, and the polymer precipitated was taken out by filtration. The polymer recovered by filtration was purified by column chromatography to obtain polymer 2 (1.04 g). The polymer 2 was examined for weight-average molecular weight and number-average molecular weight. As a result, the molecular weights thereof were found to be as follows.

Weight-average molecular weight (Mw)=31,000

Number-average molecular weight (Mn)=18,400

Dispersity ratio (Mw/Mn)=1.68

[Chem. 59]

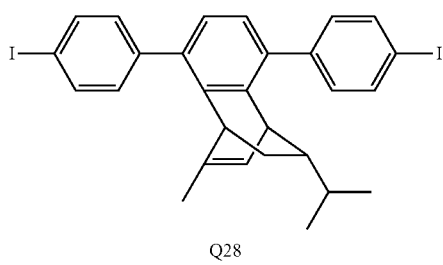

Q28

Synthesis Example 17

[Chem. 58]

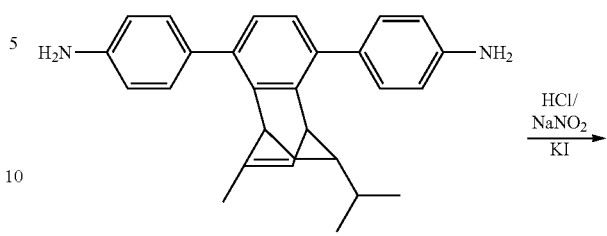

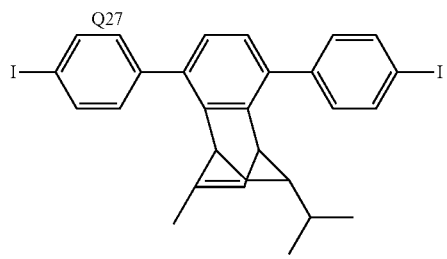

Q28

Hydrochloric acid (3.8 g) was dropped into Q27 (3.4 g) with stirring at room temperature, and 10 mL of water was added thereto after 30 minutes. At 0° C., a cooled solution of $NaNO_2$ (1.3 g) was dropped thereinto, and the resultant mixture was reacted for 1 hour under the same conditions. This liquid reaction mixture was added to a 60° C. solution of potassium iodide (5.7 g), and the precipitate which had separated out was collected and dissolved in methylene chloride. The resultant mixture was subjected to liquid separation. The methylene chloride solution was dried with magnesium sulfate and then concentrated. Furthermore, the concentrate was purified by silica gel column chromatography (n-hexane/ethyl acetate=20/1) to thereby obtain Q28 (3.6 g).

Synthesis Example 18

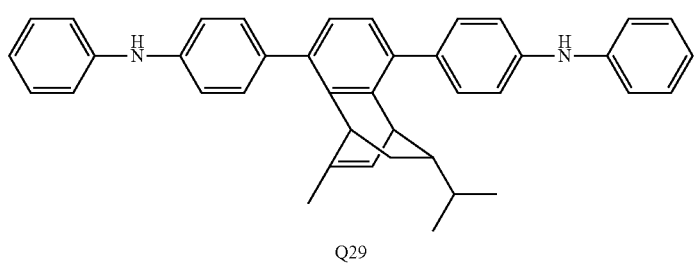

Q29

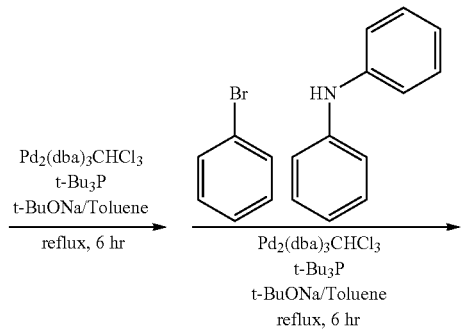

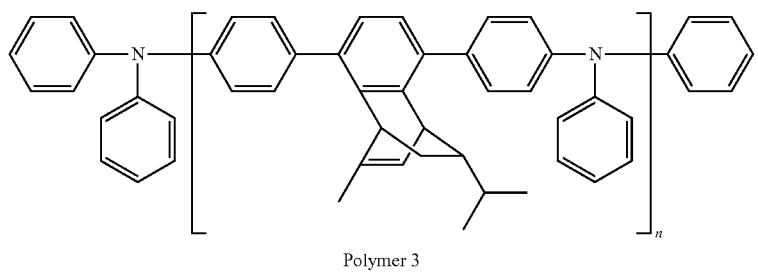

Polymer 3

Q28 (2.0 g; 3.2454 mmol), Q29 (1.77 g; 3.245 mmol), tert-butoxysodium (0.84 g; 8.76 mmol), and toluene (30 mL) were introduced, and the atmosphere in the system was sufficiently replaced with nitrogen. The contents were heated to 60° C. (solution A). Tri-t-butylphosphine (0.053 g; 0.26 mmol) was added to a solution of a tris(dibenzyldieneacetone)dipalladium chloroform complex (0.034 g; 0.033 mmol) in 2 mL of toluene, and this mixture was heated to 60° C. (solution B). In a nitrogen stream, the solution B was added to the solution A, and the resultant mixture was reacted for 50 minutes with heating and refluxing. The liquid reaction mixture was allowed to cool and then dropped into 300 mL of ethanol to crystallize out crude polymer 3.

The crude polymer 3 obtained was dissolved in 100 mL of toluene, and bromobenzene (0.1 g; 0.649 mmol) and tert-butoxysodium (0.84 g; 8.76 mmol) were introduced. The atmosphere in the system was sufficiently replaced with nitrogen, and the contents were heated to 60° C. (solution C). Tri-t-butylphosphine (0.053 g) was added to a solution of a tris(dibenzylideneacetone)dipalladium chloroform complex (0.034 g) in 2 mL of toluene, and this mixture was heated to 60° C. (solution D). In a nitrogen stream, the solution D was added to the solution C, and the resultant mixture was reacted for 2 hours with heating and refluxing. To this liquid reaction mixture was added a solution of N,N-diphenylamine (0.55 g; 3.245 mmol) in toluene (3 mL). The resultant mixture was reacted for 4 hours with heating and refluxing. The liquid reaction mixture was allowed to cool and dropped into an ethanol/water (250 mL/50 mL) solution to obtain crude polymer 3.

This crude polymer 3 was dissolved in toluene and reprecipitated from acetone, and the polymer precipitated was taken out by filtration. The polymer obtained was dissolved in toluene, and the solution was washed with dilute hydrochloric acid. The polymer was then reprecipitated from ammonia-containing ethanol. The polymer was taken out by filtration and purified by column chromatography to obtain polymer 3 (0.6 g).

Weight-average molecular weight (Mw)=37,000
Dispersity ratio (Mw/Mn)=1.7

Example 3

Production of Organic electroluminescence element

[Anode]

A transparent conductive film of indium-tin oxide (ITO) was deposited on a glass substrate in a thickness of 150 nm (deposited by sputtering; sheet resistance, 15Ω). This transparent conductive film was patterned into stripes with a width of 2 mm by means of an ordinary technique of photolithography. Thus, an anode was formed.

The substrate on which the anode had been formed was cleaned by subjecting the substrate to ultrasonic cleaning with acetone, rinsing with pure water, and ultrasonic cleaning with isopropyl alcohol in this order, subsequently dried by nitrogen blowing, and subjected to ultraviolet/ozone cleaning.

[Hole Injection Layer]

Subsequently, a hole injection layer was formed on the anode. A composition for hole injection layer formation was prepared as a material for the hole injection layer, the composition including the aromatic-amine-based high-molecular compound represented by the structural formula shown below (PB-1: weight-average molecular weight, 29,400; number-average molecular weight, 12,600), the electron-accepting compound (A-1), and ethyl benzoate as a solvent. The composition for hole injection layer formation had a solid concentration (PB-1 and A-1) of 2% by weight, with PB-1/A-1 being 10/4 (by weight). This composition was applied by spin coating (spinner rotation speed, 1,500 rpm; spinner rotation period, 30 seconds) to the substrate on which the anode had been formed. After the spin coating, the composition applied was dried at 260° C. for 180 minutes to form a hole injection layer as an even thin film having a thickness of 30 nm.

[Chem. 60]

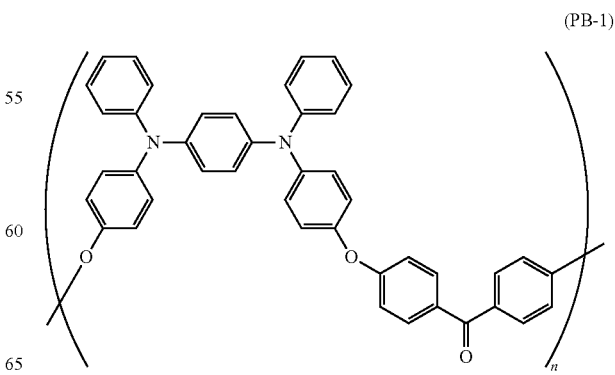

(PB-1)

[Chem. 61]

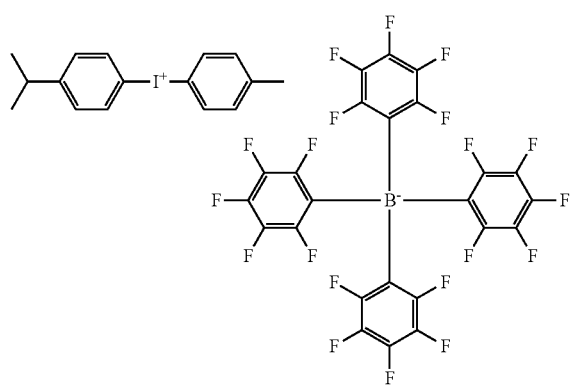

(A-1)

[Hole Transport Layer]

A composition for hole transport layer formation (composition for organic electroluminescence elements) including the polymer 1 and toluene as a solvent was prepared as a material for a hole transport layer. The composition for hole transport layer formation had a solid concentration of 0.4% by weight. Using this composition, a hole transport layer was formed on the hole injection layer by spin coating (spinner rotation speed, 1,500 rpm; spinner rotation period, 30 seconds). After the spin coating, the composition applied was dried by heating at 230° C. for 60 minutes to form a hole transport layer as an even thin film having a thickness of 20 nm.

[Luminescent Layer]

A composition for luminescent-layer formation including the compound (DDD-1) shown below, the compound (D-1) shown below, and toluene as a solvent was prepared as a material for a luminescent layer. The composition for luminescent-layer formation had a solid concentration (DDD-1 and D-1) of 0.75% by weight, with (DDD-1)/(D-1) being 10/1 (by weight). Using this composition, a luminescent layer was formed on the hole transport layer by spin coating (spinner rotation speed, 1,500 rpm; spinner rotation period, 30 seconds). After the spin coating, the composition applied was dried by heating at 100° C. for 60 minutes to form a luminescent layer as an even thin film having a thickness of 50 nm.

[Chem. 62]

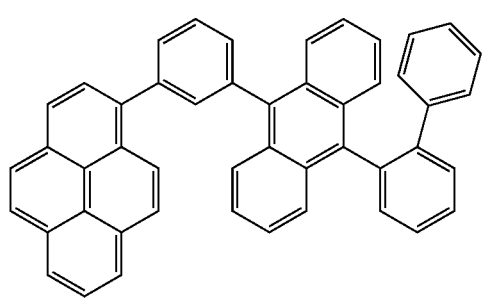

(DDD-1)

[Chem. 63]

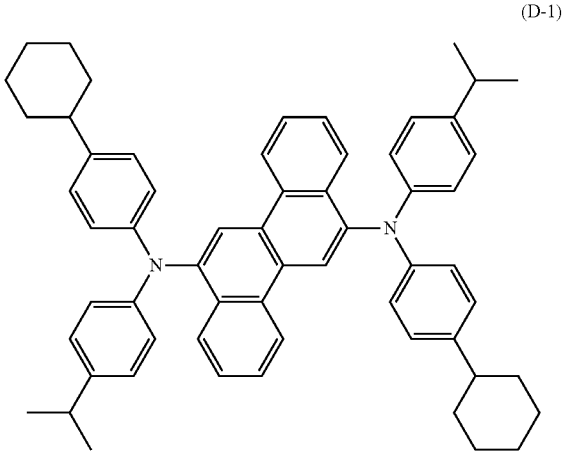

(D-1)

[Hole Blocking Layer and Electron Transport Layer]

Subsequently, a hole blocking layer was formed on the luminescent layer formed, and an electron transport layer was formed on the hole blocking layer. The HB-1 shown below was used as a material for hole blocking layer formation to form a hole blocking layer having a thickness of 10 nm by vacuum deposition. Subsequently, the ET-1 shown below was used as a material for electron transport layer formation to form an electron transport layer having a thickness of 30 nm by vacuum deposition.

[Chem. 64]

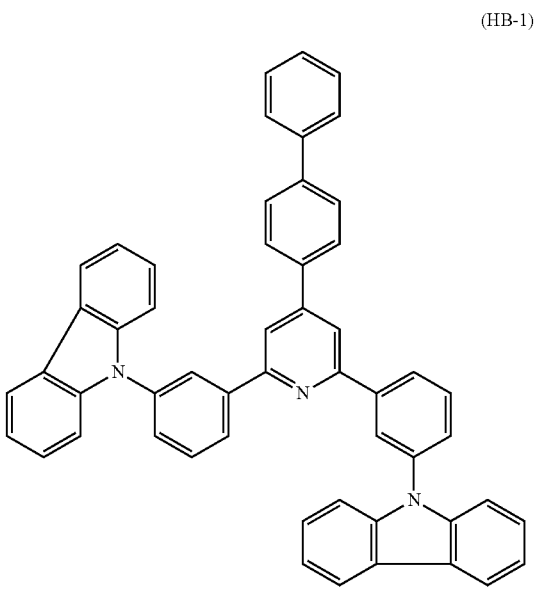

(HB-1)

[Chem. 65]

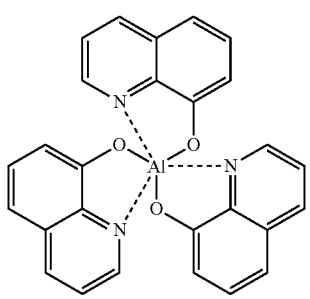

(ET-1)

[Chem. 66]

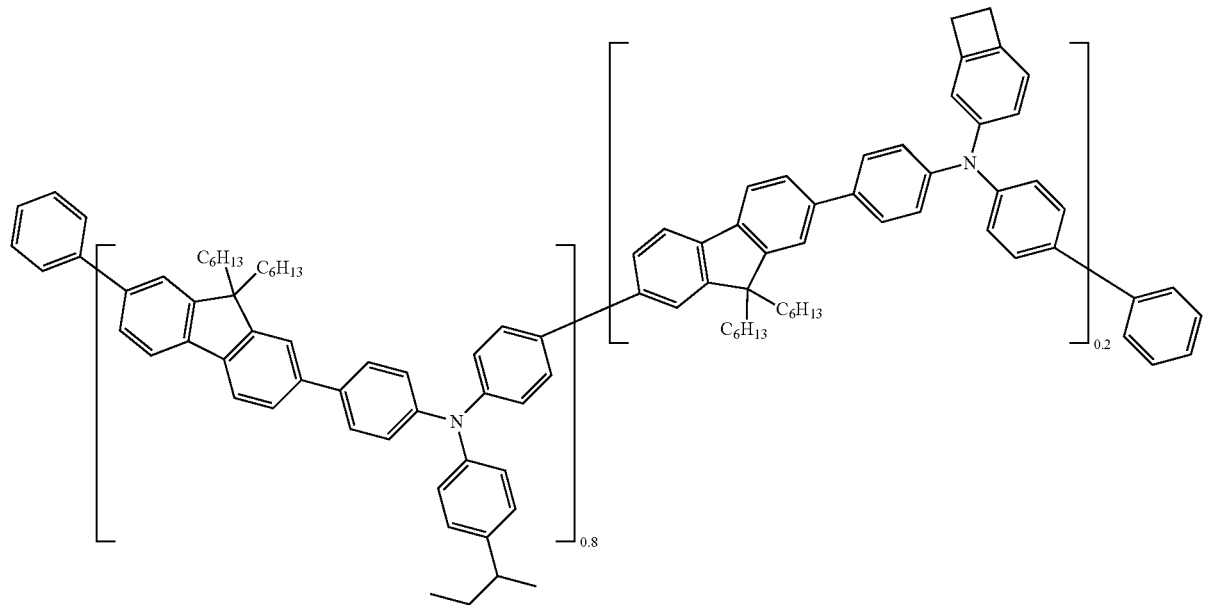

(HT-1)

[Electron Injection Layer and Cathode]

Subsequently, an electron injection layer was formed on the electron transport layer, and a cathode was formed on the electron injection layer.

Lithium fluoride (LIF) was used for electron injection layer formation, and an electron injection layer having a thickness of 0.5 nm was formed therefrom by vacuum deposition like the electron transport layer.

Aluminum was used as a cathode material, and a cathode having a thickness of 80 nm was superposed in the form of stripes with a width of 2 mm so that these stripes were perpendicular to the ITO stripes each serving as an anode.

A voltage of 7 V was applied to the organic electroluminescence element produced by the procedure described above, which had a luminescent region having a size of 2 mm×2 mm. The luminescent element in this state was evaluated as to whether the element luminesced or not and further evaluated for the color of the luminescence.

As a result, blue luminescence was obtained from the organic electroluminescence element, which had been produced using the compound DDD-1. Furthermore, the driving voltage at which the element luminesced at 1,000 cd/m$^2$ was 7.0 V.

Comparative Example 1

An organic electroluminescence element was produced in the same manner as in Example 3, except that the polymer 1 used in the composition for hole transport layer formation was replaced with the following polymer (HT-1). As a result, blue luminescence was observed. However, the driving voltage at which the element luminesced at 1,000 cd/m$^2$ was as high as 8.1 V.

Example 4

First, a substrate constituted of a glass substrate and, formed thereon, a transparent conductive film of indium-tin oxide (ITO) (deposited by sputtering; manufactured by Sanyo Vacuum Industries Co., Ltd.) which had been patterned into stripes with a width of 2 mm was cleaned by subjecting the substrate to ultrasonic cleaning with an aqueous surfactant solution, rinsing with ultrapure water, ultrasonic cleaning with ultrapure water, and rinsing with ultrapure water in this order. The substrate was then dried by nitrogen blowing and finally subjected to ultraviolet/ozone cleaning.

(Formation of Hole Injection Layer)

Two percents by weight the aromatic-amine-based high-molecular compound represented by the structural formula shown below (PB-3: weight-average molecular weight, 60,000) and 0.8% by weight the electron-accepting compound (A-1) were dissolved in ethyl benzoate as a solvent to prepare a coating fluid for hole injection layer formation which had a solid concentration of 2% by weight.

[Chem. 67]

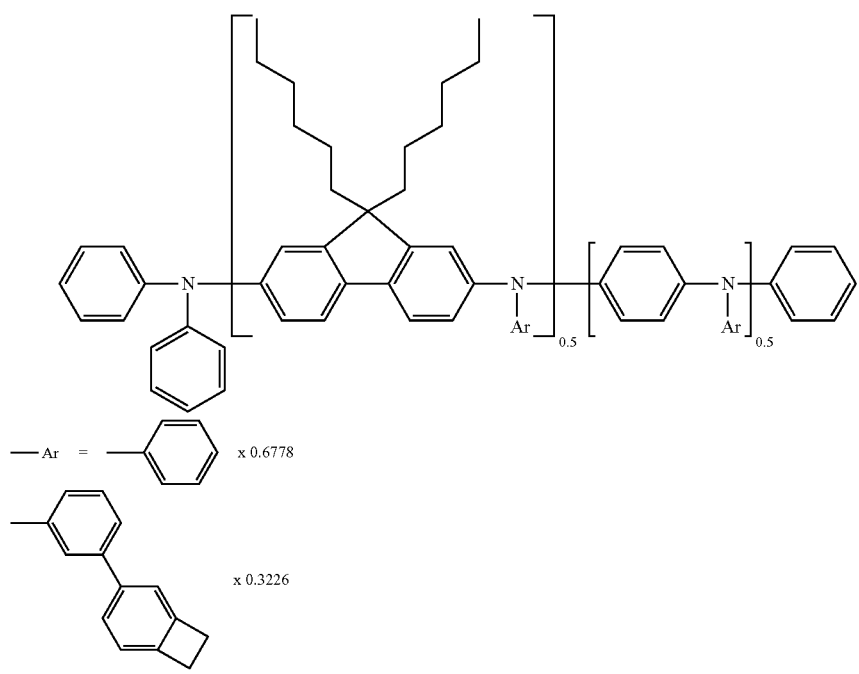

The coating solution for hole injection layer formation was used to form a hole injection layer by spin coating on the cleaned ITO substrate. The spin coating was conducted in the air having a temperature of 23° C. and a relative humidity of 50%, under the conditions of a rotation speed of 1,500 rpm and a rotation period of 30 seconds. After the application, the coating fluid applied was dried by heating the coated substrate on a hot plate at 80° C. for 1 minute. Thereafter, unnecessary parts on the electrode were wiped off, and the coating film was baked at 230° C. in the atmospheric environment within an oven for 1 hour. Thus, a hole injection layer having a thickness of 30 nm was formed.

(Formation of Hole Transport Layer)

Subsequently, 0.4% by weight the polymer represented by the following formula (V) (weight-average molecular weight, 95,000) was dissolved in toluene as a solvent to produce a coating fluid for hole transport layer formation. As the toluene, use was made of a commercial dehydrated grade. The coating fluid for hole transport layer formation was prepared in a gloved nitrogen box having an oxygen concentration of 1.0 ppm and a moisture concentration of 1.0 ppm.

[Chem. 68]

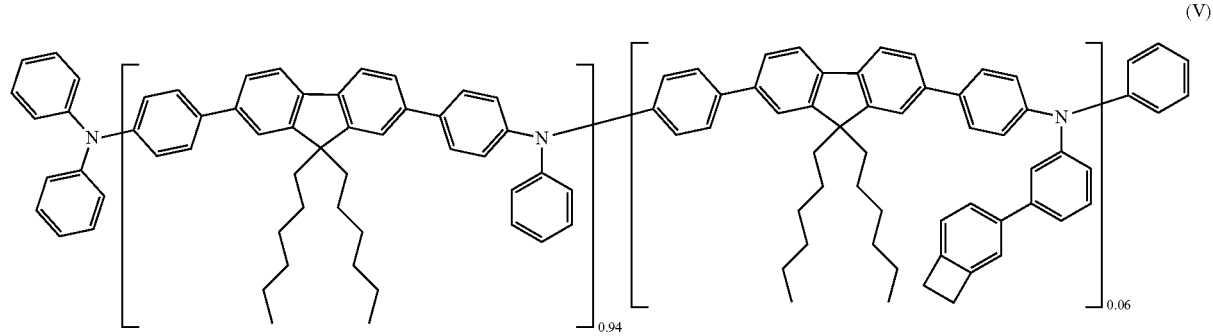

The substrate coated with the hole injection layer was placed in the gloved nitrogen box, and the coating fluid for hole transport layer formation was used to form a hole injection layer on the hole injection layer by spin coating, in which the rotation speed was 1,500 rpm and the rotation period was 30 seconds. After the application, unnecessary parts on the electrode were wiped off, and the coating was backed on a hot plate at 230° C. for 1 hour to form a hole transport layer (B1) having a thickness of 30 nm.

The preparation of the coating fluid for hole transport layer formation, the spin coating, and the baking each were conducted in a gloved nitrogen box having an oxygen concentration of 1.0 ppm and a moisture concentration of 1.0 ppm, without exposing the work to the air.

(Formation of Luminescent Layer)

Subsequently, a coating fluid for forming a luminescent layer through coating-fluid application was prepared.

(Preparation of Coating Fluid for Luminescent-Layer Formation)

A hundred parts by weight of the compound represented by the following formula VI and 10 parts by weight of the following compound Q19 were dissolved in toluene as a solvent to prepare a 0.8-wt % solution. This solution was filtered through a 0.2-µm PTFE filter to prepare a coating fluid (D1) for luminescent-layer formation. The preparation of the coating fluid (D1) for luminescent-layer formation was conducted in a gloved nitrogen box having an oxygen concentration of 1.0 ppm and a moisture concentration of 1.0 ppm.

[Chem. 69]

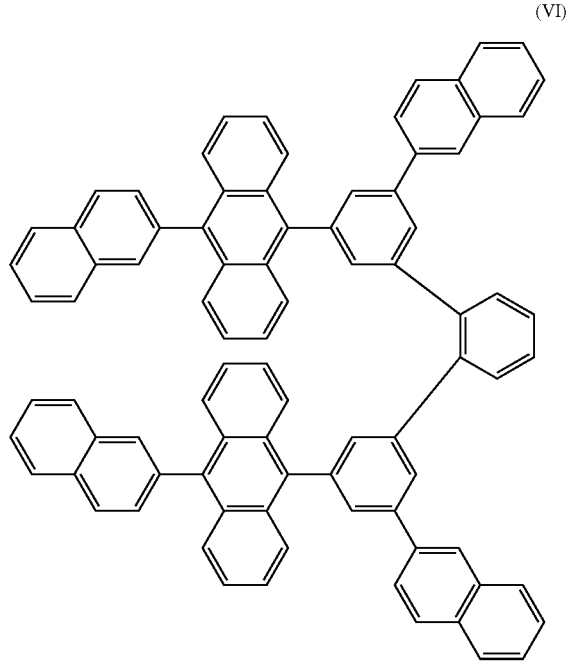

(VI)

[Chem. 70]

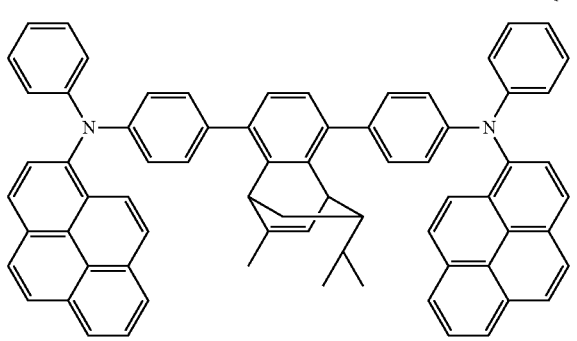

Q19

(Formation of Luminescent Layer Through Coating Fluid Application)

The coating fluid (D1) for luminescent-layer formation was used to form a luminescent layer on the hole transport layer by spin coating. The spin coating was conducted in a gloved nitrogen box having an oxygen concentration of 1.0 ppm and a moisture concentration of 1.0 ppm, under the conditions of a rotation speed of 1,500 rpm and a rotation period of 30 seconds. After the application, unnecessary parts on the electrode were wiped off, and the coating was heated on a hot plate at 230° C. for 1 hour to convert the compound represented by compound Q19 (the compound Q19 synthesized in Synthesis Example 9) into the compound represented by compound Q21 (the compound Q21 synthesized in Synthesis Example 11). Thus, a luminescent layer having a thickness of 65 nm was formed.

[Chem. 71]

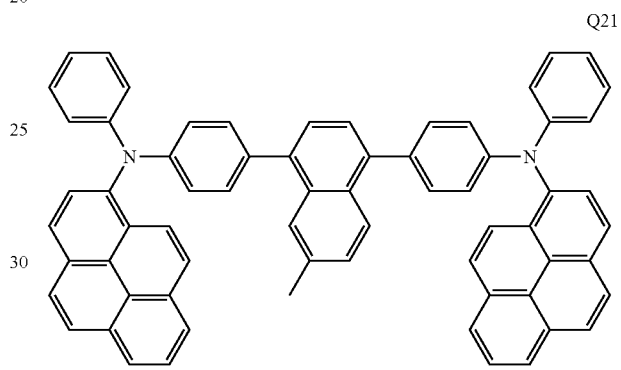

Q21

This substrate was temporarily taken out to the air and then disposed in the chamber of a vacuum deposition apparatus. The chamber was roughly evacuated with a rotary pump and then further evacuated with a cryopump. The degree of vacuum was $1.0\times10^{-4}$ Pa. A mask for deposition was disposed on a given region of the substrate, and necessary deposition materials placed in respective molybdenum boats were disposed beforehand in the chamber.

(Formation of Hole Blocking Layer)

The molybdenum boat containing the material represented by the formula HB-1 given above was heated by voltage application to vapor-deposit a layer on the luminescent layer. The degree of vacuum during the vapor deposition was $1.0\times10^{-4}$ Pa, and the rate of deposition was 1.0 Å/s. Thus, a hole blocking layer was formed in a thickness of 10 nm.

(Formation of Electron Transport Layer)

Subsequently, the molybdenum boat containing $Alq_3$, which is represented by the formula ET-1 given above, was heated by voltage application to vapor-deposit a layer on the hole blocking layer. The degree of vacuum during the vapor deposition was $1.0\times10^{-4}$ Pa, and the rate of deposition was 1.0 Å/s. Thus, an electron transport layer was formed in a thickness of 30 nm.

(Cathode Formation)

Subsequently, the substrate was temporarily taken out to the air, and a shadow mask in the form of stripes with a width of 2 mm was disposed as a mask for cathode deposition so that these stripes were perpendicular to the ITO stripes of the anode. This masked substrate was disposed in the deposition apparatus. The chamber was roughly evacuated with a rotary pump and then further evacuated with a cryopump. The degree of vacuum was $3.0\times10^{-4}$ Pa. A cathode was formed in the following manner. First, the molybdenum boat containing lithium fluoride (LiF) was heated by voltage application to vapor-deposit a film on the electron transport layer. The deposition conditions included a degree of vacuum during the deposition of $3.0\times10^{-4}$ Pa and a deposition rate of 0.05 Å/s, and the film was deposited in a thickness of 0.5 nm. Finally, the molybdenum boat containing aluminum was heated by voltage application to vapor-deposit a cathode. The deposition conditions included a degree of vacuum during the deposition of $5.0\times10^{-4}$ Pa and a deposition rate of 2.0 Å/s, and the film was deposited in a thickness of 70 nm.

(Sealing)

Subsequently, the substrate was temporarily taken out to the air and then transferred to a gloved box in which the atmosphere had been replaced with nitrogen. In the gloved box in which the atmosphere had been replaced with nitrogen, a moisture absorbent sheet was applied to a recessed part of a sealing glass plate, and a UV-curable resin coating material was applied with a dispenser to the periphery of the recessed part of the sealing glass plate. Furthermore, in the gloved box, the substrate which had undergone the vapor deposition was brought into close contact with the sealing glass plate so that the vapor-deposited region of the substrate was sealed with the sealing glass plate, and this stack was irradiated with UV light using a UV lamp to cure the UV-curable resin.

Thus, an organic electroluminescence element was obtained.

(Evaluation of the Element)

A voltage was applied to the element and, as a result, blue luminescence was obtained. When this element was made to luminesce at a luminance of 1,000 cd/m², the voltage was 9.2 V and the current efficiency of luminescence was 3.1 cd/A.

Example 5

(Production of Organic Electroluminescence Element)

Subsequently, an organic electroluminescence element was produced in the same manner as in Example 4, except that compound Q20, which is represented by the following formula (the compound Q20 synthesized in Synthesis Example 10), was used in place of the compound Q19 among the luminescent-layer materials used in Example 4.

After the coating fluid application for luminescent-layer formation, the compound Q20, which is represented by the following formula, was converted to compound Q22, which is represented by the following formula, when the coated substrate was heated on a hot plate at 230° C. for 1 hour.

[Chem. 72]

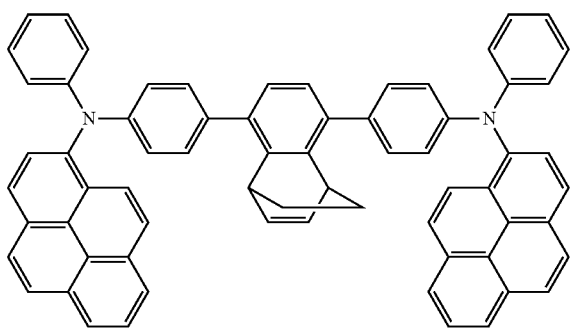

Q20

-continued

[Chem. 73]

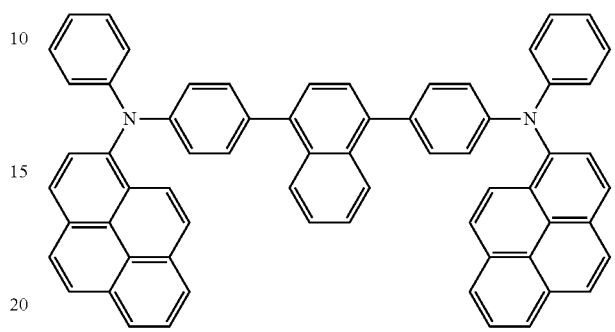

Q22

(Evaluation of the Element)

A voltage was applied to the element and, as a result, blue luminescence was obtained. When this element was made to luminesce at a luminance of 1,000 cd/m², the voltage was 9.8 V and the current efficiency of luminescence was 3.1 cd/A.

Example 6

An organic electroluminescence element was formed in the same manner as in Example 5, except that a hole injection layer 3, a hole transport layer 4, and a luminescent layer 5 were formed in the following manners.

A composition for hole injection layer formation was prepared as a material for forming a hole injection layer 3, the composition including the high-molecular compound PB-2 having the structure represented by the following formula (weight-average molecular weight (Mw), 93,000; dispersity ratio, 1.69), the compound A-1 having the structure represented by the following formula as an electron-accepting compound, and ethyl benzoate as a solvent. In the composition, the concentration of the high-molecular compound PB-2 was 2.0% by weight and that of the compound A-1 was 0.4% by weight. This composition was applied in the air by spin coating under the conditions of a spinner rotation speed of 1,500 rpm and a spinner rotation period of 30 seconds to form a film on the anode, and this coating film was heated at 230° C. for 3 hours to thereby crosslink the high-molecular compound PB-2 and dry the coating film.

Thus, an even thin film (hole injection layer 3) having a thickness of 45 nm was formed.

[Chem. 74]

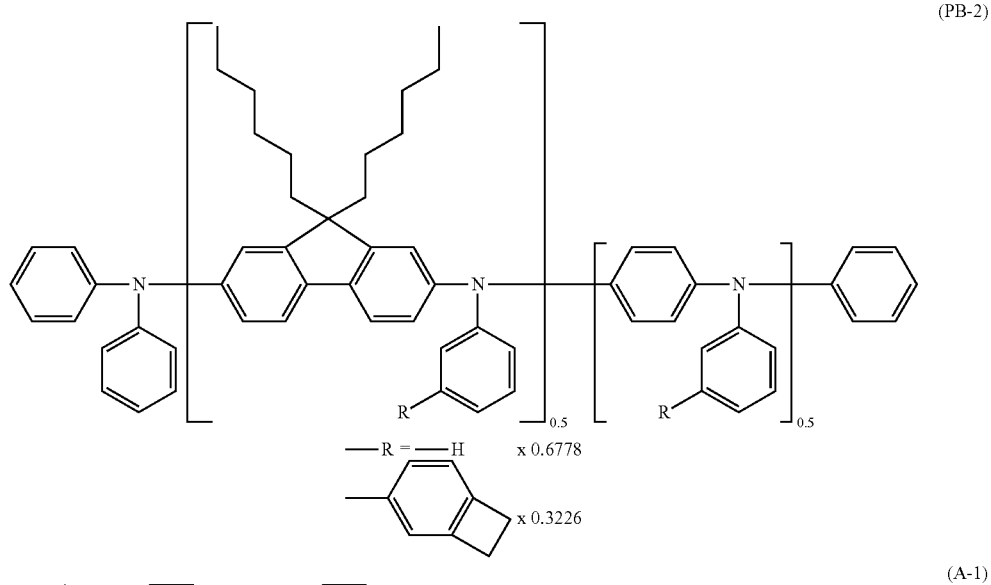

(PB-2)

(A-1)

A composition for hole transport layer formation was prepared as a material for forming a hole transport layer 4, the composition including the high-molecular compound NH-1 of the invention (the polymer 1 synthesized in Synthesis Example 5; weight-average molecular weight (Mw), 70,000; dispersity ratio, 1.9) and cyclohexylbenzene was a solvent. In the composition, the concentration of the high-molecular compound NH-1 was 1.4% by weight. This composition was applied in nitrogen by spin coating under the conditions of a spinner rotation speed of 1,500 rpm and a spinner rotation period of 30 seconds to form a film on the hole injection layer, and this coating film was heated at 230° C. for 1 hour in nitrogen to thereby form an even thin film (hole transport layer) having a thickness of 20 nm.

[Chem. 75]

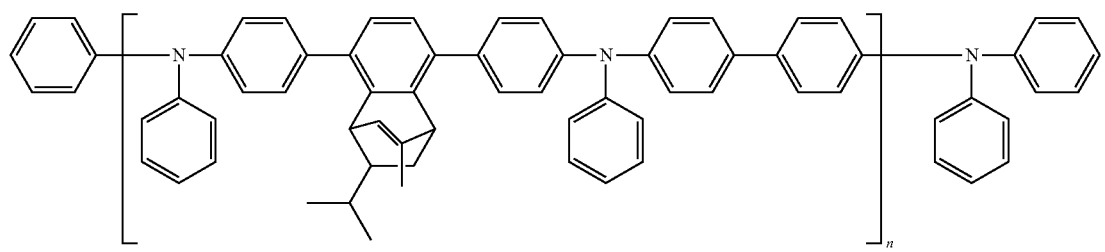

(NH-1)

A composition for luminescent-layer formation including the compound (DDD-1), the compound (D-1), and cyclohexylbenzene as a solvent was prepared as a material for forming a luminescent layer 5. The composition for luminescent-layer formation had a solid concentration (DDD-1 and D-1) of 3.1% by weight, with (DDD-1)/(D-1) being 10/1 (by weight). Using this composition, a luminescent layer was formed on the hole transport layer by spin coating (spinner rotation speed, 1,500 rpm; spinner rotation period, 30 seconds). After the spin coating, the composition applied was dried by heating at 130° C. for 60 minutes under reduced pressure to form a luminescent layer as an even thin film having a thickness of 50 nm.

The luminescent properties of the element obtained are as follows.

Voltage: 9.5 [V] at 2,500 cd/m$^2$
Luminance/current: 4.8 [cd/A] at 2,500 cd/m$^2$ The properties of this element are shown in Table 12. It can be seen that the organic electroluminescence element of the invention is an element having a low driving voltage and a high current efficiency.

Example 7

An organic electroluminescence element was formed in the same manner as in Example 6, except that a hole injection layer 3 was formed in the following manner.

A composition for hole injection layer formation was prepared as a material for forming a hole injection layer 3, the composition including the high-molecular compound NH-2 of the invention (the polymer 2 synthesized in Synthesis Example 15; weight-average molecular weight (Mw), 31,000; dispersity ratio, 1.68), the compound A-1 having the structure represented by the following formula as an electron-accepting compound, and ethyl benzoate as a solvent. In the composition, the concentration of the high-molecular compound NH-2 was 2.0% by weight and that of the compound A-1 was 0.4% by weight. This composition was applied in the air by spin coating under the conditions of a spinner rotation speed of 1,500 rpm and a spinner rotation period of 30 seconds to form a film on the anode, and this coating film was heated at 230° C. for 3 hours to thereby form an even thin film (hole injection layer 3) having a thickness of 45 nm.

[Chem. 76]

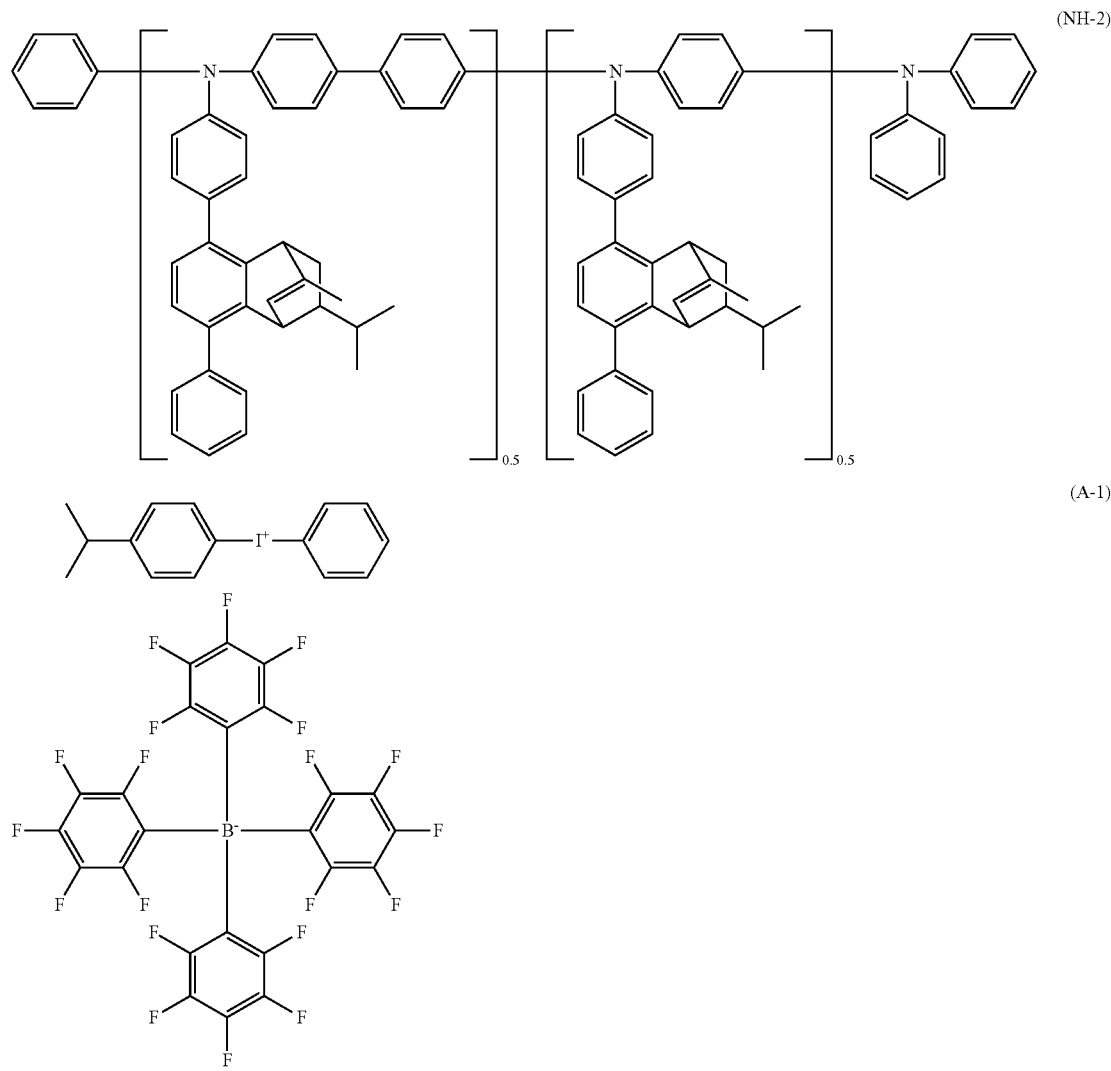

The luminescent properties of the element obtained are as follows.

Voltage: 7.4 [V] at 2,500 cd/m²
Luminance/current: 4.6 [cd/A] at 2,500 cd/m²

The properties of this element are shown in Table 12. It can be seen that the organic electroluminescence element of the invention is an element having a low driving voltage and a high current efficiency.

Comparative Example 2

An organic electroluminescence element was formed in the same manner as in Example 6, except that a hole transport layer 3 was formed in the following manner.

A composition for hole transport layer formation was prepared as a material for forming a hole transport layer 4, the composition including the high-molecular compound HT-2 having the structure shown below (weight-average molecular weight (Mw), 95,000; dispersity ratio, 2.2) and cyclohexylbenzene was a solvent. In the composition, the concentration of the high-molecular compound HT-2 was 1.4% by weight. This composition was applied in nitrogen by spin coating under the conditions of a spinner rotation speed of 1,500 rpm and a spinner rotation period of 30 seconds to form a film on the hole injection layer, and this coating film was heated at 230° C. for 1 hour in nitrogen to thereby form an even thin film (hole transport layer) having a thickness of 20 nm.

The properties of this element are shown in Table 12.

TABLE 12

|  | Hole injection layer | Hole transport layer | Voltage [V] | Luminance/current [cd/A] |
|---|---|---|---|---|
| Example 6 | — | present invention | 9.5 | 4.8 |
| Example 7 | present invention | present invention | 7.4 | 4.6 |
| Comparative Example 2 | — | — | 10.6 | 4.5 |

Example 8

Current-Voltage Characteristics of Single-Layer Element

Figure 2:
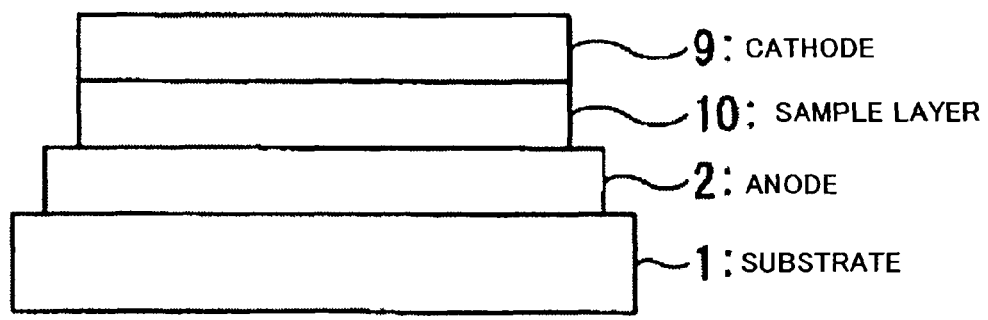
FIG. 2 is a sectional view diagrammatically illustrating the layer configuration of the test elements produced in an Example according to the invention and a Comparative Example.

A single-layer element of the structure shown in FIG. 2 was produced.

A substrate constituted of a glass substrate 1 and, formed thereon, a transparent conductive film of indium-tin oxide (ITO) deposited in a thickness of 120 nm (deposited by sputtering; manufactured by Sanyo Vacuum Industries Co., Ltd.) was subjected to processing by an ordinary technique of photolithography and etching with hydrochloric acid to pattern the transparent conductive film into stripes having a

[Chem. 77]

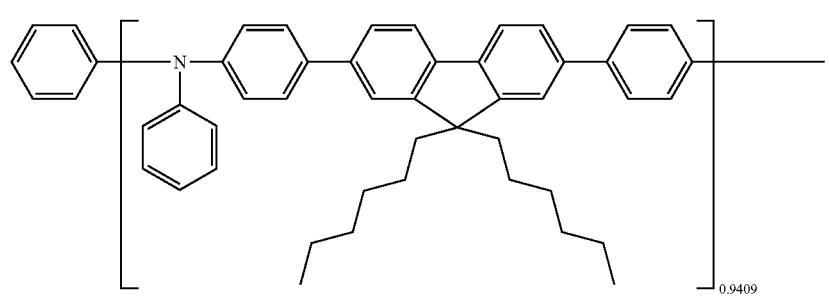

(HT-2)

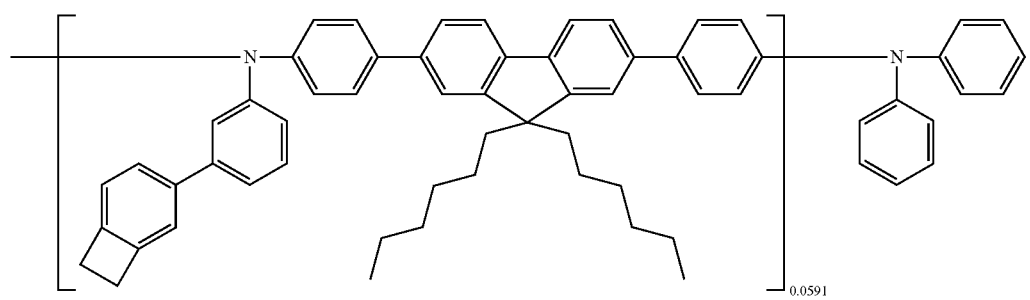

The luminescent properties of the element obtained are as follows.

Voltage: 10.6 [V] at 2,500 cd/m²
Luminance/current: 4.5 [cd/A] at 2,500 cd/m² width of 2 mm. Thus, an anode 2 was formed. The ITO substrate which had undergone the patterning was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried with compressed air, and finally subjected to ultraviolet/ozone cleaning.

In ethyl benzoate as a solvent were dissolved 4.5% by weight the high-molecular compound (NH-2) of the invention and 0.9% by weight 4-isopropyl-4'-methyldiphenyliodonium tetrakis(pentafluorophenyl) borate, which is represented by structural formula (A-1). The resultant solution was filtered through a membrane filter made of PTFE (polytetrafluoroethylene) having a pore diameter of 0.2 μm to produce a coating composition. This coating composition was applied to the substrate by spin coating. The spin coating was conducted in the air having a temperature of 23° C. and a relative humidity of 60%, under the conditions of a spinner rotation speed of 1,500 rpm and a spinner period of 30 seconds. After the spin coating, the coating film was heated at 230° C. for 1 hour in an oven in the ordinary-pressure air atmosphere. Thus, a hole injection layer 3 was formed.

Subsequently, a shadow mask in the form of stripes with a width of 2 mm, as a mask for cathode deposition, was brought into close contact with the element so that these stripes were perpendicular to the ITO stripes of the anode 2. The apparatus was roughly evacuated with an oil-sealed rotary pump and then evacuated with a cryopump until the degree of vacuum within the apparatus became at least $3 \times 10^{-4}$ Pa.

Aluminum was heated in a molybdenum boat to form an aluminum layer having a thickness of 80 nm as a cathode 9 while regulating the rate of deposition to 0.5-5 Å/sec and the degree of vacuum to $2 \times 10^{-4}$ to $3 \times 10^{-4}$ Pa. During the cathode deposition, the substrate temperature was kept at room temperature.

Thus, a single-layer element having an element area with a size of 2 mm×2 mm was obtained.

The single-layer element obtained was connected to Source Meter Type 2400, manufactured by Keithley Inc. Gradually increasing values of voltage were applied to the element, and the resultant current values were read out.

Figure 3:
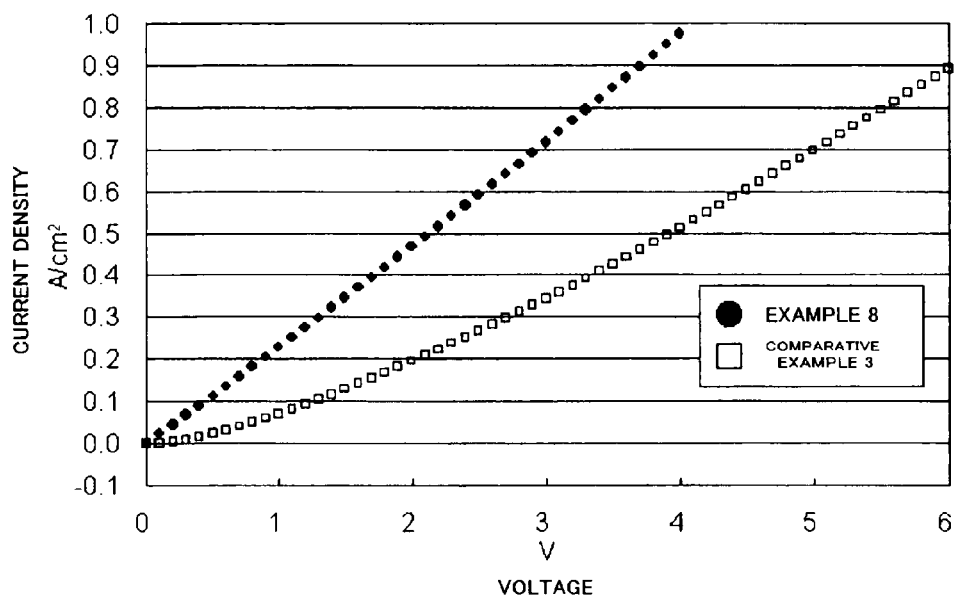
FIG. 3 is a presentation showing the current-voltage characteristics determined in Example 8 according to the invention and Comparative Example 3. The ordinate represents current density [A/cm$^2$], and the abscissa represents voltage [V].

The current-voltage characteristics of this element are shown in FIG. 3.

As shown in FIG. 3, in the element employing the high-molecular compound of the invention, electric current flowed at lower voltages than in the element of a Comparative Example. It is apparent therefrom that the high-molecular compound of the invention is superior in charge-transporting ability to the polymer used in the Comparative Example.

Comparative Example 3

A single-layer element of the structure shown in FIG. 2 was produced in the same manner as in Example 8, except that the high-molecular compound (NH-2) of the invention was replaced with the high-molecular compound (PB-2) shown above.

The single-layer element obtained was connected to Source Meter Type 2400, manufactured by Keithley Inc. Gradually increasing values of voltage were applied to the element, and the resultant current values were read out. The current-voltage characteristics of this element are shown in FIG. 3.

Production of Solar Cell Element

Example 9

Production of Solar Cell Employing High-Molecular Compound of the Invention

Figure 4:
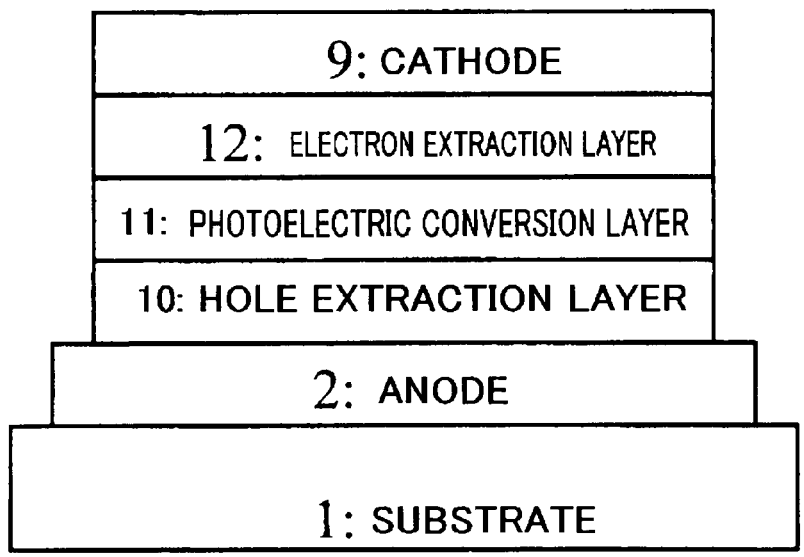
FIG. 4 is a diagrammatic sectional view illustrating an embodiment of the organic solar cell element of the invention.

An element of the structure shown in FIG. 4 was produced.

Toluene was used as a solvent, and 0.9% by weight NH-1, which is represented by the following formula (the polymer 1 synthesized in Synthesis Example 5), and 0.09% by weight A-1 were dissolved therein to prepare a composition for hole extraction layer formation. The composition for hole extraction layer formation was applied by spin coating (1,500 rpm) to a glass substrate on which a patterned ITO electrode had been formed as an electrode. Thereafter, the substrate was heat-treated for 1 hour with a 230° C. clean oven to form a hole extraction layer.

[Chem. 78]

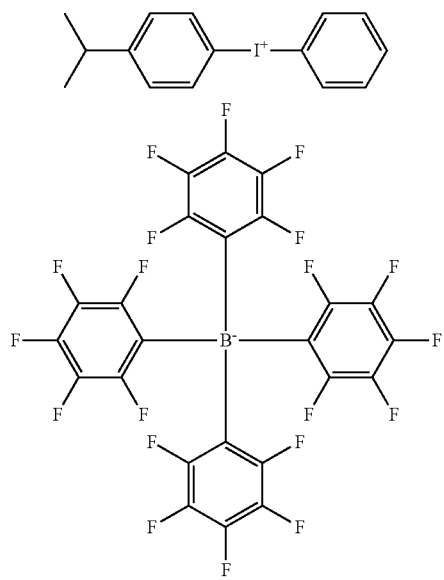

(A-1)

-continued

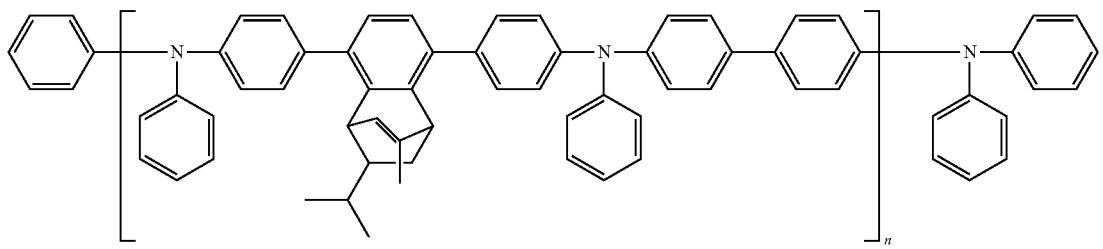

(NH-1)

The compound represented by the following formula (A), i.e., tetrabenzoporphyrin (manufactured by Mitsubishi Chemical Corp.), was placed in a metallic boat disposed in a vacuum deposition apparatus, and an about 75-nm layer of a p-type semiconductor was formed on the hole extraction layer through deposition and a heat treatment (180° C., 20 minutes) conducted in a nitrogen atmosphere.

[Chem. 79]

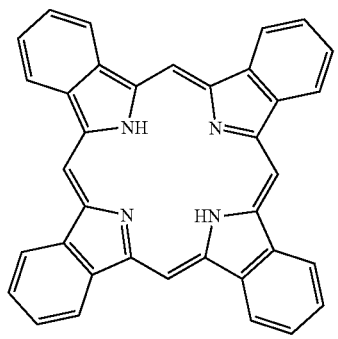

(A)

Subsequently, a toluene solution containing, dissolved therein, 1.2% by weight phenyl C61-butyl butyrate [60] fullerene represented by the following formula (B) (manufactured by Frontier Carbon Corp.) was applied by spin coating (3,000 rpm) in a nitrogen atmosphere and heat-treated at 65° C. for 5 minutes to thereby form a layer of the fullerene derivative on the p-type semiconductor layer.

[Chem. 80]

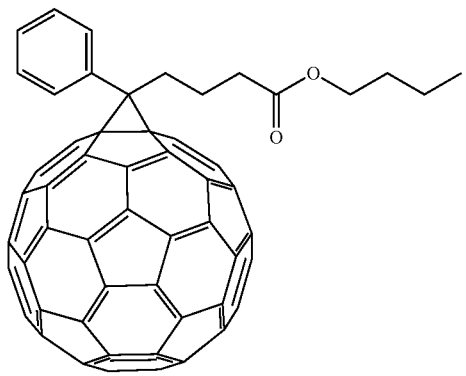

(B)

The compound represented by the following formula (C), i.e., 2,9-dimethyl-4,7-diphenyl-1,10-phenanthroline (BCP; manufactured by Dojindo Laboratories), was placed in a metallic boat disposed in the vacuum deposition apparatus, and an about 6-nm electron extraction layer was formed on the fullerene derivative layer by vacuum deposition.

[Chem. 81]

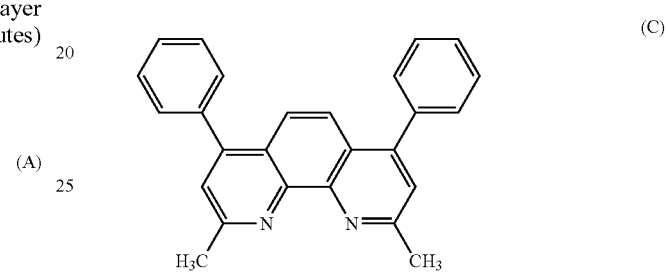

(C)

Furthermore, an aluminum electrode having a thickness of 80 nm was formed on the electron extraction layer by vacuum deposition to produce a solar cell.

The solar cell produced was irradiated, from the ITO electrode side, with light at an intensity of 100 mW/cm² using a solar simulator (AM 1.5 G), and the current-voltage characteristics of the structure ranging from the ITO electrode to the aluminum electrode were determined using Source Meter (Type 2400, manufactured by Keithley Inc.) to calculate the photoelectric conversion efficiency. As a result, the conversion was found to be 1.33%.

Comparative Example 4

Production of Solar Cell Including No Hole Extraction Layer

A solar cell was produced in the same manner as in Example 9, except that an about 75-nm layer of a p-type semiconductor was formed on a glass substrate on which a patterned ITO electrode had been formed, without using a hole extraction layer. The photoelectric conversion efficiency of the solar cell produced was calculated in the same manner as in Example 9. As a result, the efficiency was 0.83%.

TABLE 13

| | Hole extraction layer | Voc [V] | PCE [%] |
|---|---|---|---|
| Example 9 | NH-1 | 0.69 | 1.33 |
| Comparative Example 4 | none | 0.36 | 0.82 |

As shown in Table 13, it can be seen that the solar cell element having a layer formed using the polymer of the invention has a high photoelectric conversion efficiency (PCE) and a high open-circuit voltage (Voc).

While the invention has been described in detail and with reference to specific embodiments thereof, it will be apparent to one skilled in the art that various changes and modifications can be made therein without departing from the spirit and scope thereof.

This application is based on a Japanese patent application filed on Aug. 7, 2008 (Application No. 2008-204342), the contents thereof being incorporated herein by reference.

Industrial Applicability

Organic electroluminescence elements having an organic layer including the polymer or luminescent-layer material of the invention, which has a thermally dissociable and soluble group, are thought to be applicable to flat panel displays (e.g., displays for OA computers and wall-mounted TV receivers), vehicle-mounted display elements, cell phone display elements, light sources taking advantage of the feature of a surface light emitter (e.g., the light source of a copier and the backlight of a liquid-crystal display or instrument), display panels, and marker lights, and have a high technical value.

Furthermore, the polymer of the invention is useful not only as a material for organic electroluminescence elements but also in applications such as, for example, colored resists for color filters, transparent resists for color filters, e.g., ribs, overcoats, and photospacers, organic materials for electronic devices, such as organic insulating films, organic TFT materials, and organic solar cells, materials for electrophotographic photoreceptors, and the whole organic devices including these.

DESCRIPTION OF THE REFERENCE NUMERALS

1 Substrate
2 Anode
3 Hole injection layer
4 Hole transport layer
5 Luminescent layer
6 Hole blocking layer
7 Electron transport layer
8 Electron injection layer
9 Cathode
10 Hole extraction layer
11 Photoelectric conversion layer
12 Electron extraction layer

The invention claimed is:

1. A polymer, comprising:
    a repeating unit comprising an aromatic ring and a hydrocarbon ring fused to the aromatic ring; and
    a thermally dissociable and soluble group which is bonded to the hydrocarbon ring,
    wherein:
    the thermally dissociable and soluble group is a group which is thermally dissociated through a reverse Diels-Alder reaction at 100° C. or more and 300° C. or less, such that the thermally dissociable and soluble group is cleaved from the hydrocarbon ring and the aromatic ring remains in the repeating unit after the thermal dissociation; and
    the hydrocarbon ring is a ring comprising a double bond which is not contained in the aromatic ring.

2. The polymer according to claim 1, wherein the aromatic ring is an aromatic hydrocarbon ring.

3. The polymer according to claim 1, wherein the thermally dissociable and soluble group is a group which is thermally dissociated at 120° C. or more and 240° C. or less.

4. The polymer according to claim 1, wherein the hydrocarbon ring is a ring comprising an etheno group or an ethano group.

5. The polymer according to claim 1, wherein said polymer comprises a repeating unit comprising a structure represented by the following chemical formula (U3):

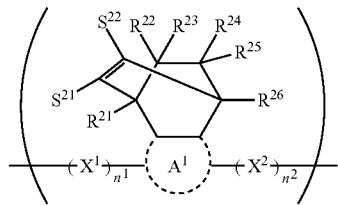

wherein
ring $A^1$ represents an aromatic ring, the aromatic ring may have one or more substituents, and the substituents may be bonded to each other directly or through a divalent linking group to form a ring,
$S^{21}$, $S_{22}$, and $R^{21}$ to $R_{26}$ each independently represent a hydrogen atom, a hydroxyl group, an alkyl group which may have a substituent, an aromatic hydrocarbon ring group which may have a substituent, an aromatic heterocyclic group which may have a substituent, an aralkyl group which may have a substituent, an alkoxy group which may have a substituent, an aryloxy group which may have a substituent, an acyl group which may have a substituent, an alkenyl group which may have a substituent, an alkynyl group which may have a substituent, an acyloxy group which may have a substituent, an arylamino group which may have a substituent, a heteroarylamino group which may have a substituent, or an acylamino group which may have a substituent, and
$X^1$ and $X^2$ each independently represent a divalent aromatic hydrocarbon ring group which has 6-50 carbon atoms and may have a substituent, or a divalent aromatic heterocyclic group which has 3-50 carbon atoms and may have a substituent; and
$n^1$ to $n^2$ each independently represent an integer of 0-5.

6. The polymer according to claim 5 wherein, the ring $A^1$ is selected from the group consisting of a benzene ring, a naphthalene ring, an anthracene ring, and a tetracene ring.

7. The polymer according to claim 1, wherein said polymer comprises a repeating unit represented by the following formula (X):

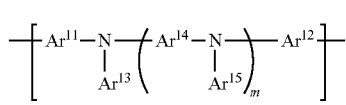

wherein
m represents an integer of 0-3,
$Ar^{11}$ and $Ar^{12}$ each independently represent a direct bond, an aromatic hydrocarbon ring group which may have a substituent, or an aromatic heterocyclic group which may have a substituent, and
$Ar^{13}$ to $Ar^{15}$ each independently represent an aromatic hydrocarbon ring group which may have a substituent or an aromatic heterocyclic group which may have a substituent,
$Ar^{11}$ and $Ar^{12}$ being not direct bonds simultaneously.

8. The polymer of claim 1, wherein the aromatic ring is an aromatic heterocycle.

9. A composition comprising the polymer according to any one of claims 1, 2 and 3-7 and a solvent.

10. An organic electroluminescence element comprising
an anode,
a cathode, and
an organic layer disposed between the anode and the cathode,
wherein, the organic electroluminescence element comprises a layer formed from the composition according to claim 9 by a wet film-forming method.

11. A solar cell element comprising an anode, a cathode, and an organic layer disposed between the anode and the cathode, wherein, the organic layer, the solar cell element comprises a layer formed from the composition according to claim 9 by a wet film-forming method.

12. An organic EL display device, comprising the organic electroluminescence element according to claim 10.

13. An organic EL lighting, comprising the organic electroluminescence element according to claim 10.

14. A polymer, comprising at least one repeating unit selected from the repeating-unit group of

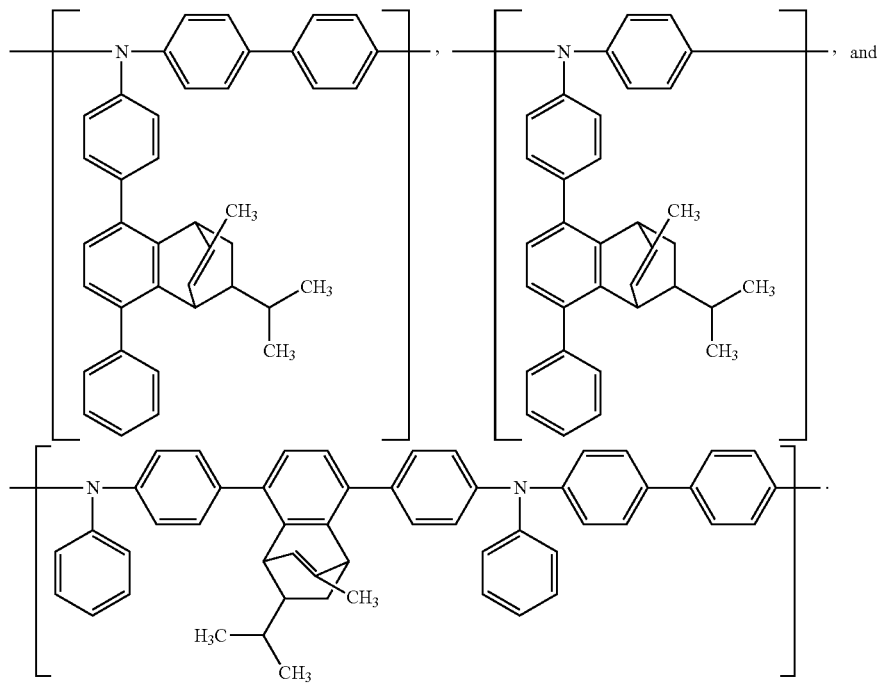

* * * * *